(12) United States Patent
Fujita

(10) Patent No.: US 9,099,409 B2
(45) Date of Patent: Aug. 4, 2015

(54) ORGANIC ELECTROLUMINESCENT DISPLAY DEVICE, ELECTRONIC APPARATUS INCLUDING THE SAME, AND METHOD FOR PRODUCING ORGANIC ELECTROLUMINESCENT DISPLAY DEVICE

(71) Applicant: Sharp Kabushiki Kaisha, Osaka (JP)

(72) Inventor: Yoshimasa Fujita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/358,717

(22) PCT Filed: Nov. 15, 2012

(86) PCT No.: PCT/JP2012/079642
§ 371 (c)(1),
(2) Date: May 15, 2014

(87) PCT Pub. No.: WO2013/073611
PCT Pub. Date: May 23, 2013

(65) Prior Publication Data
US 2014/0312339 A1    Oct. 23, 2014

(30) Foreign Application Priority Data

Nov. 18, 2011    (JP) ................................ 2011-252735

(51) Int. Cl.
*H01L 29/08*    (2006.01)
*H01L 29/04*    (2006.01)
(Continued)

(52) U.S. Cl.
CPC .......... *H01L 27/322* (2013.01); *H01L 27/3211* (2013.01); *H01L 27/3244* (2013.01); *H01L 51/5275* (2013.01)

(58) Field of Classification Search
USPC .............. 257/40, 59, 79, 88–89, 98, E51.022
See application file for complete search history.

(56) References Cited

U.S. PATENT DOCUMENTS

2003/0127968 A1*    7/2003    Kuma et al. ................... 313/503
2006/0102913 A1     5/2006    Park
(Continued)

FOREIGN PATENT DOCUMENTS

| JP | 2005-123088 A | 5/2005 |
| JP | 2006-147561 A | 6/2006 |

(Continued)

OTHER PUBLICATIONS

Hiroshi et al., English Machine Translated of JP Publication No. 2002-359071, Dec. 12, 2002; (Machine Translated Jan. 11, 2015).*

*Primary Examiner* — Mohsen Ahmadi
(74) *Attorney, Agent, or Firm* — Morrison & Foerster LLP

(57) ABSTRACT

An organic EL display device includes an organic EL section including an organic layer held between a first electrode and a second electrode, one of the two electrodes serving as a reflective electrode, and the other serving as a translucent electrode; a blue pixel portion including a blue color filter configured to mainly transmit a light component in a blue wavelength region of light emitted from the organic EL section; a green pixel portion including a green color filter configured to mainly transmit a light component in a green wavelength region of the light emitted from the organic EL section; and a red pixel portion including a wavelength conversion layer configured to absorb at least one of the light component in the blue wavelength region and the light component in the green wavelength region of the light emitted from the organic EL section and emit light in a red wavelength region.

14 Claims, 18 Drawing Sheets

(51) Int. Cl.
*H01L 27/15* (2006.01)
*H01L 29/18* (2006.01)
*H01L 27/32* (2006.01)
*H01L 51/52* (2006.01)

(56) References Cited

U.S. PATENT DOCUMENTS

2007/0048886 A1* 3/2007 Winters et al. .................. 438/29
2008/0036367 A1   2/2008 Eida et al.
2008/0164807 A1   7/2008 Hofmann et al.
2012/0032151 A1   2/2012 Hama et al.
2013/0016296 A1* 1/2013 Fujita et al. ..................... 349/42
2013/0021549 A1   1/2013 Fujita

FOREIGN PATENT DOCUMENTS

| JP | 2007-109518 A | 4/2007 |
| JP | 2008-511108 A | 4/2008 |
| WO | WO-2006/022123 A1 | 3/2006 |
| WO | WO-2010/084587 A1 | 7/2010 |
| WO | WO-2011/125363 A1 | 10/2011 |
| WO | WO-2011/129135 A1 | 10/2011 |

* cited by examiner

ORGANIC ELECTROLUMINESCENT DISPLAY DEVICE, ELECTRONIC APPARATUS INCLUDING THE SAME, AND METHOD FOR PRODUCING ORGANIC ELECTROLUMINESCENT DISPLAY DEVICE

CROSS REFERENCE TO RELATED APPLICATIONS

This is the U.S. National Phase patent application of PCT/JP2012/079642, filed Nov. 15, 2012, which claims priority to Japanese Patent Application No. 2011-252735 filed Nov. 18, 2011, each of which is hereby incorporated by reference in the present disclosure in its entirety.

TECHNICAL FIELD

The present invention relates to an organic electroluminescent display device, an electronic apparatus including the same, and a method for producing an organic electroluminescent display device.

BACKGROUND ART

Organic electroluminescent (hereinafter, also referred to as an "organic EL" or "organic LED") displays have been attracting attention because they are self-luminous and a high-quality image is obtained. Unlike liquid crystal displays, the power consumption of organic EL displays is not increased by the fact that a trend toward higher definition causes lower aperture ratios. Thus, organic EL displays have been attracting attention in the field of smartphones and tablet terminals that are increasingly required to have further higher definition.

To produce organic EL displays capable of achieving color display, it is necessary to produce pixels that emit light beams of blue, green, and red, which are the three primary colors of light. In the case of organic EL displays, typically, organic light-emitting layers are separately formed into red, green, and blue pixels by a vapor deposition method with a shadow mask.

The conventional method for forming a pixel suffers from disadvantages, including mask processing accuracy, mask alignment accuracy, an increase in mask size, mask deformation, and color mixture due to thermal deformation.

Thus, as a method capable of achieving color display without separately forming organic light-emitting layers, a method in which white organic electroluminescence is combined with a color filter is known.

In this method, color display can be achieved just by the patterning of the color filter, thus easily achieving higher definition. However, white light is split into red-, green-, and blue-emitting components with a color filter, thus disadvantageously increasing the power consumption.

As an organic EL display that is easily produced and capable of achieving higher definition, an organic EL display in which blue-green organic electroluminescence is combined with a wavelength conversion layer configured to convert the light of the organic electroluminescence into red light is known (for example, see PTL 1).

CITATION LIST

Patent Literature

PTL 1: International Publication No. 2010/084587

SUMMARY OF INVENTION

Technical Problem

However, in the organic EL display in which blue-green organic electroluminescence is combined with the wavelength conversion layer configured to convert the light of the organic electroluminescence into red light, the light of the organic electroluminescence is split into a blue pixel and a green pixel with a color filter. Thus, in each of the blue pixel and the green pixel, there is a trade-off between color purity and luminance. In the organic EL display, therefore, it is difficult to achieve a wide color reproduction range and low power consumption.

The present invention has been accomplished in consideration of the foregoing circumstances. The present invention aims to provide an organic electroluminescent display device which is capable of achieving full-color display and higher definition at low cost and which has a wide color reproduction range and excellent viewing angle characteristics, an electronic apparatus including the organic electroluminescent display device, and a method for producing an organic electroluminescent display device.

Solution to Problem

An organic electroluminescent display device of the present invention includes an organic electroluminescent section including an organic layer held between a first electrode and a second electrode, the organic layer including at least an organic light-emitting layer, and one of the first electrode and the second electrode serving as a translucent electrode; a blue pixel portion including a blue color filter configured to mainly transmit a light component in a blue wavelength region of light emitted from the organic electroluminescent section; a green pixel portion including a green color filter configured to mainly transmit a light component in a green wavelength region of the light emitted from the organic electroluminescent section; and a red pixel portion including a wavelength conversion layer configured to absorb at least one of the light component in the blue wavelength region and the light component in the green wavelength region of the light emitted from the organic electroluminescent section and emit light in a red wavelength region.

The organic electroluminescent display device of the present invention may further include a first substrate, in which the blue pixel portion, the green pixel portion, and the red pixel portion may be provided between the first substrate and the organic electroluminescent section.

The organic electroluminescent display device of the present invention may further include a first substrate and a second substrate.

In the organic electroluminescent display device of the present invention, one of the first electrode and the second electrode may serve as a reflective electrode, and the other may serve as a translucent electrode.

The organic electroluminescent display device of the present invention may further include a first substrate and a second substrate, in which the blue pixel portion, the green pixel portion, and the red pixel portion may be provided between the first substrate and the organic electroluminescent section and between the second substrate and the organic electroluminescent section.

In the organic electroluminescent display device of the present invention, the organic light-emitting layer may be a blue-green phosphorescent layer having an emission spectrum at least including the emission of light in the blue wavelength and the emission of light in the green wavelength.

In the organic electroluminescent display device of the present invention, the wavelength conversion layer may be formed of a continuous film extending across a display region.

In the organic electroluminescent display device of the present invention, the red pixel portion further may include a red color filter configured to mainly transmit light in the red wavelength region.

In the organic electroluminescent display device of the present invention, a partition configured to reflect or scatter at least light emitted from the organic electroluminescent section may be provided at a portion of the organic electroluminescent section corresponding to a position between pixels.

In the organic electroluminescent display device of the present invention, a partition configured to reflect or scatter at least one of light emitted from the wavelength conversion layer and light emitted from the organic electroluminescent section may be provided at least at the periphery of the red pixel portion.

In the organic electroluminescent display device of the present invention, a low-refractive-index layer may be disposed at least between a substrate disposed on a light-output side and the wavelength conversion layer, the low-refractive-index layer having a lower refractive index than the substrate disposed on the light-output side.

In the organic electroluminescent display device of the present invention, at least one of the blue pixel portion and the green pixel portion may include a light-distribution conversion layer.

In the organic electroluminescent display device of the present invention, a partition configured to reflect or scatter at least one of light emitted from the organic electroluminescent section and scattered light obtained by scattering the light emitted from the organic electroluminescent section may be provided between pixels including the light-distribution conversion layer disposed in at least one of the blue pixel portion and the green pixel portion.

In the organic electroluminescent display device of the present invention, a low-refractive-index layer may be disposed between a substrate disposed on a light-output side and the organic electroluminescent section, the low-refractive-index layer having a lower refractive index than the substrate disposed on the light-output side.

The organic electroluminescent display device of the present invention may further include an active element configured to drive the organic electroluminescent section.

An electronic apparatus of the present invention includes the organic electroluminescent display device of the present invention.

A method for producing an organic electroluminescent display device of the present invention includes the step of forming a blue color filter in a blue pixel portion on a first substrate and a green color filter in a green pixel portion on the first substrate; the step of forming a wavelength conversion layer containing a wavelength conversion material on the blue color filter and the green color filter and in a red pixel portion on the first substrate; the step of exposing the wavelength conversion layer formed on the blue color filter and the green color filter to light to be absorbed by the wavelength conversion material; the step of forming an organic electroluminescent section including, in sequence, a first electrode, an organic layer including at least a blue-green phosphorescent layer, and a second electrode on the wavelength conversion layer; the step of circumferentially applying a peripheral sealing agent to the periphery of the first substrate; the step of performing the primary alignment of the first substrate and the second substrate and bonding the first substrate and the second substrate together into a laminated article in an environment in which water and oxygen concentrations are controlled; the step of placing the laminated article in an environment in which water and oxygen concentrations are controlled at atmospheric pressure; and the step of irradiating the laminated article with ultraviolet radiation to cure the peripheral sealing agent in the environment in which water and oxygen concentrations are controlled at atmospheric pressure.

A method for producing an organic electroluminescent display device of the present invention includes the step of forming an organic electroluminescent section including, in sequence, a first electrode, an organic layer including at least a blue-green phosphorescent layer, and a second electrode on a first substrate; the step of forming a blue color filter in a blue pixel portion on a second substrate and a green color filter in a green pixel portion on the second substrate; the step of forming a wavelength conversion layer containing a wavelength conversion material on the blue color filter and the green color filter and in a red pixel portion on the second substrate; the step of exposing the wavelength conversion layer formed on the blue color filter and the green color filter to light to be absorbed by the wavelength conversion material; the step of placing the first substrate on which the organic electroluminescent section has been formed and the second substrate on which the wavelength conversion layer had been formed in an environment in which water and oxygen concentrations are controlled; the step of circumferentially applying a peripheral sealing agent to the periphery of the wavelength conversion layer on the second substrate; the step of performing the primary alignment of the first substrate and the second substrate and bonding the first substrate and the second substrate together into a laminated article in an environment in which water and oxygen concentrations are controlled; the step of placing the laminated article in an environment in which water and oxygen concentrations are controlled at atmospheric pressure; and the step of irradiating the laminated article with ultraviolet radiation to cure the peripheral sealing agent in the environment in which water and oxygen concentrations are controlled at atmospheric pressure.

A method for producing an organic electroluminescent display device of the present invention includes the step of forming a blue color filter in a blue pixel portion on a first substrate and a green color filter in a green pixel portion on the first substrate; the step of forming a wavelength conversion layer containing a wavelength conversion material on the blue color filter and the green color filter and in a red pixel portion on the first substrate by a transfer method; the step of forming an organic electroluminescent section including, in sequence, a first electrode, an organic layer including at least a blue-green phosphorescent layer, and a second electrode on the wavelength conversion layer; the step of circumferentially applying a peripheral sealing agent to the periphery of the first substrate; the step of performing the primary alignment of the first substrate and the second substrate and bonding the first substrate and the second substrate together into a laminated article in an environment in which water and oxygen concentrations are controlled; the step of placing the laminated article in an environment in which water and oxygen concentrations are controlled at atmospheric pressure; and the step of irradiating the laminated article with ultraviolet radiation to cure the peripheral sealing agent in the environment in which water and oxygen concentrations are controlled at atmospheric pressure.

A method for producing an organic electroluminescent display device of the present invention includes the step of forming an organic electroluminescent section including, in sequence, a first electrode, an organic layer including at least a blue-green phosphorescent layer, and a second electrode on a first substrate; the step of forming a blue color filter in a blue pixel portion on a second substrate and a green color filter in a green pixel portion on the second substrate; the step of forming a wavelength conversion layer containing a wavelength conversion material on the blue color filter and the green color filter and in a red pixel portion on the second substrate by a transfer method; the step of placing the first substrate on which the organic electroluminescent section has been formed and the second substrate on which the wavelength conversion layer had been formed in an environment in which water and oxygen concentrations are controlled; the step of circumferentially applying a peripheral sealing agent to the periphery of the wavelength conversion layer on the second substrate; the step of performing the primary alignment of the first substrate and the second substrate and bonding the first substrate and the second substrate together into a laminated article in an environment in which water and oxygen concentrations are controlled; the step of placing the laminated article in an environment in which water and oxygen concentrations are controlled at atmospheric pressure; and the step of irradiating the laminated article with ultraviolet radiation to cure the peripheral sealing agent in the environment in which water and oxygen concentrations are controlled at atmospheric pressure.

The method for producing an organic electroluminescent display device of the present invention may further include the step of applying a filler to a portion surrounded by the peripheral sealing agent; and the steps of transporting the first substrate and the second substrate, or the second substrate to a vacuum chamber and reducing the pressure in the vacuum chamber.

Advantageous Effects of Invention

According to the present invention, it is possible to provide an organic EL display device which is capable of achieving full-color display and higher definition at low cost and which has a wide color reproduction range and excellent viewing angle characteristics, and an electronic apparatus including the organic EL display device.

DESCRIPTION OF EMBODIMENTS

Figure 1:
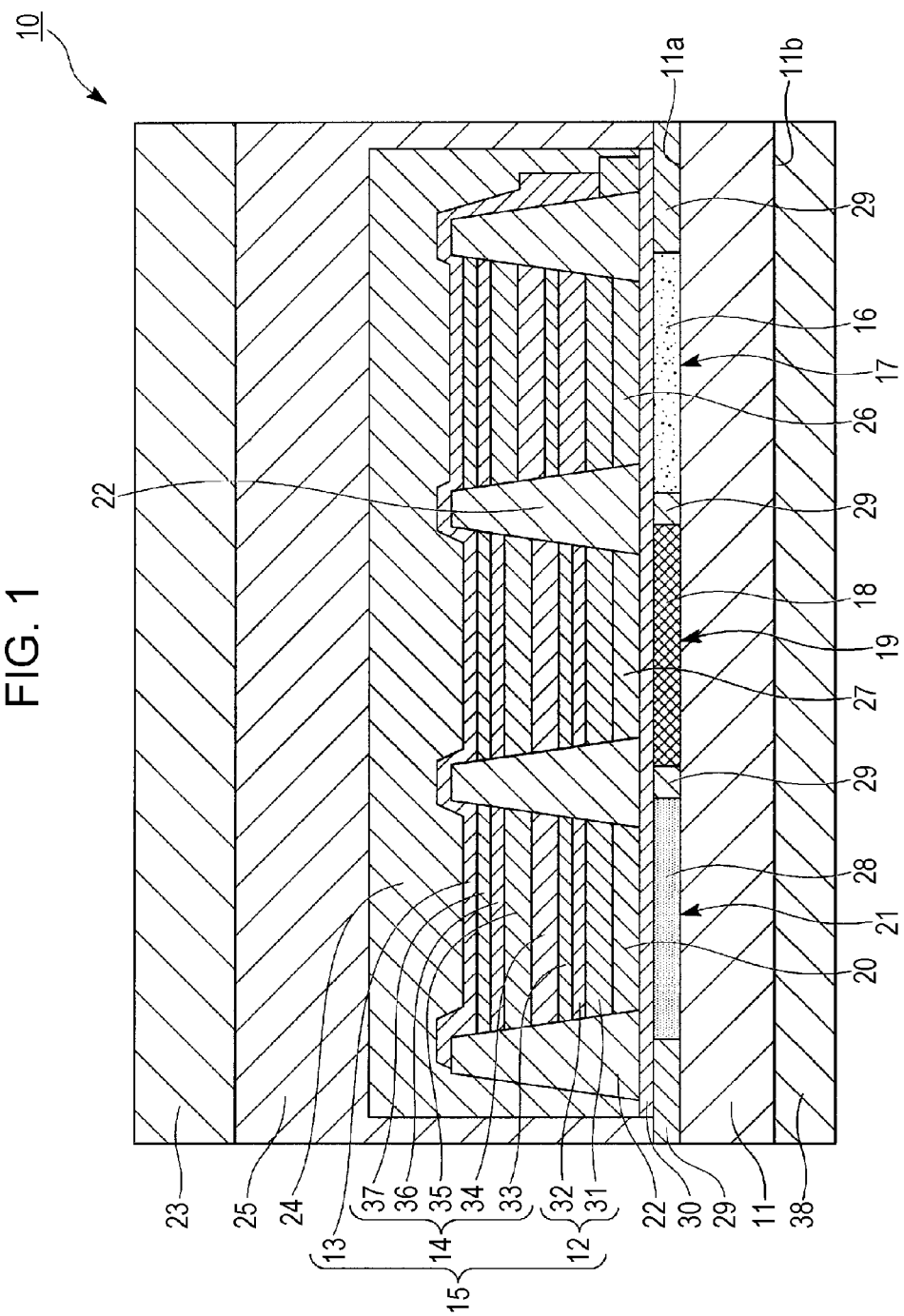
FIG. 1 is a schematic cross-sectional view of an organic EL display device according to a first embodiment.

Embodiments of an organic electroluminescent display device according to the present invention, an electronic apparatus including the same, and a method for producing an organic electroluminescent display device will be described below with reference to the drawings.

The following embodiments are specifically described in order to provide better understanding of the spirit of the present invention and thus do not limit the present invention unless otherwise specified.

In the drawings used in the description below, the principal part is sometimes illustrated in an enlarged scale to provide clear understanding of the features of the present invention. Thus, the ratios of dimensions of components are not always the same as those of actual components.

(1) First Embodiment

FIG. 1 is a schematic cross-sectional view of an organic electroluminescent display device (hereinafter, referred to as an "organic EL display device") according to a first embodiment.

An organic EL display device 10 includes a first substrate 11; an organic electroluminescent section (hereinafter, referred to as an "organic EL section") 15 disposed on a first surface 11a of the first substrate 11, the organic EL section 15 including an organic layer 14 held between a first electrode 12 and a second electrode 13; a blue pixel portion 17 including a blue color filter 16; a green pixel portion 19 including a green color filter 18; a red pixel portion 21 including a wavelength conversion layer 20 containing a wavelength conversion material; an edge cover (partition) 22 on the first surface 11a of the first substrate 11, the edge cover 22 being configured to surround side faces of portions of the organic EL section 15 to define pixels; and a second substrate (sealing substrate) 23 disposed opposite the organic EL section 15 via the edge cover 22.

A sealing film 24 is disposed to seal the organic EL section 15 disposed on the first surface 11a of the first substrate 11.

An adhesive layer 25 is disposed so as to cover the sealing film 24 on the first surface 11a of the first substrate 11. The first substrate 11 is bonded to the second substrate 23 with the adhesive layer 25.

The blue pixel portion 17 includes a wavelength conversion layer 26 containing a wavelength conversion material. The green pixel portion 19 includes a wavelength conversion layer 27 containing a wavelength conversion material.

The red pixel portion 21 includes a red color filter 28.

Light absorption layers (low reflection layers) 29 are disposed between the blue color filter 16 and the green color filter 18, between the green color filter 18 and the red color filter 28, and between the red color filter 28 and the blue color filter 16.

A low-refractive-index layer 30 having a lower refractive index than the first substrate 11 is disposed between the blue color filter 16 and the wavelength conversion layer 26, between the green color filter 18 and the wavelength conversion layer 27, and between the red color filter 28 and the wavelength conversion layer 20.

The first electrode 12 is provided on the side of the first surface 11a of the first substrate 11 and includes a reflective electrode 31 and a transparent electrode 32 on the reflective electrode 31.

The organic layer 14 includes a hole injection layer 33, a hole transport layer 34, an organic light-emitting layer 35, an electron transport layer 36, and electron injection layer 37 stacked in that order from the first electrode 12 side toward the second electrode 13 side.

A polarizer 38 is stacked on a second surface 11b of the first substrate 11.

In the organic EL display device 10, light which is in a blue-green wavelength region and emitted from the organic EL section 15 is used as an excitation light source. In the blue pixel portion 17, the light which is in the blue-green wavelength region and emitted from the organic EL section 15 is directly used. The light in the blue-green wavelength region is passed through the blue color filter 16 configured to mainly transmit light in the blue wavelength region, thereby achieving blue-light emission. In the green pixel portion 19, the light which is in the blue-green wavelength region and emitted from the organic EL section 15 is passed through the green color filter 18 configured to mainly transmit light in the green wavelength region, thereby achieving green-light emission. In the red pixel portion 21, red-light emission is achieved by passing the light through the wavelength conversion layer 20 configured to absorb at least one of light in a blue wavelength region and light in a green wavelength region to emit light in a red wavelength region, the blue light and the green light being emitted from the organic EL section 15.

As described above, full-color display of the organic EL display device 10 is achieved by achieving the light emission of the three primary colors in the pixel portions.

Each of the wavelength conversion material in the wavelength conversion layer 26 of the blue pixel portion 17 and the wavelength conversion material in the wavelength conversion layer 27 of the green pixel portion 19 has a lower absorptance of light (excitation light) and a lower fluorescence intensity than the wavelength conversion material in the wavelength conversion layer 20 of the red pixel portion 21, the light being in the blue-green wavelength region and emitted from the organic EL section 15. Thus, the blue pixel portion 17 transmits light serving as excitation light in the blue-green wavelength region, and substantially no light in a red wavelength region is emitted. The green pixel portion 19 transmits light serving as excitation light in the blue-green wavelength region, and substantially no light in a red wavelength region is emitted. The red pixel portion 21 absorbs light serving as excitation light in the blue-green wavelength region and emits light in the red wavelength region. Thereby, it is possible to achieve full-color display of the organic EL display device 10.

The wavelength conversion layer 26 in the blue pixel portion 17 preferably has a transmittance of 90% or more at the peak wavelength of the excitation light which is in the blue-green wavelength region and which is emitted from the organic EL section 15, and the peak intensity of light in the red wavelength region is preferably 1/10 or less of the peak intensity on the short wavelength side of the excitation light in the blue-green wavelength region. The wavelength conversion layer 27 in the green pixel portion 19 has a transmittance of 90% or more at the peak wavelength of the excitation light which is in the blue-green wavelength region and which is emitted from the organic EL section 15, and the peak intensity of light in the red wavelength region is preferably 1/10 or less of the peak intensity on the short wavelength side of the excitation light in the blue-green wavelength region. In this case, the excitation light which is in the blue-green wavelength region and which is emitted from the organic EL section 15 may be efficiently split and converted into red light emission, green light emission, and blue light emission, thus reducing the power consumption.

As a method for adjusting the transmittance and fluorescence intensity of the wavelength conversion layers 20, 26, and 27, a method is commonly employed which uses a phenomenon in which a substance in an excited state is chemically activated and is unstable, compared with in its ground state. According to this method, the wavelength conversion material may be brought into a chemically activated, unstable state, which is an excited state, by the irradiation with light to be absorbed by the wavelength conversion material, thereby reducing the absorptance and fluorescence intensity of the wavelength conversion material.

As the organic light-emitting layer 35 included in the organic EL section 15, a blue-green phosphorescent layer containing a phosphorescent material having an emission spectrum at least including the emission of light in the blue wavelength and the emission of light in the green wavelength is used, thereby achieving a reduction in the power consumption of the organic EL display device 10. In particular, like the organic EL display device 10, in the case of a method in which the excitation light from the organic EL section 15 is used and the excitation light is passed through the wavelength conversion layers 20, 26, and 27 to achieve full-color display, the luminous efficiency of the excitation light source (organic EL section 15) is directly linked to the power consumption of the apparatus as a whole. To reduce the power consumption of the apparatus, thus, the use of a phosphorescent material as the wavelength conversion layers 20, 26, and 27 is highly effective, the phosphorescent material having a luminous efficiency four times the fluorescent material.

While components constituting the organic EL display device 10 and formation methods therefor will be specifically described below, embodiments are not limited to these components and the formation methods.

The first substrate 11 and the second substrate 23 are not particularly limited. A substrate and a sealing substrate used in a conventional organic EL display device may be used. Examples of the first substrate 11 and the second substrate 23 include insulating substrates, such as inorganic material substrates composed of, for example, glass and silica, plastic substrates composed of, for example, polyethylene terephthalate, polycarbonate, and polyimide, and ceramic substrates composed of, for example, alumina; metal substrates composed of, for example, aluminum (Al) and iron (Fe); substrates in which surfaces of these substrates are coated with insulating materials, for example, silicon oxide ($SiO_2$) and organic insulating materials; and substrates in which surfaces of metal substrates composed of, for example, aluminum, are subjected to insulation treatment by a method, for example, anodic oxidation. Among these substrates, plastic substrates and metal substrates are preferably used because curved portions and bent portions can be formed without stress.

Furthermore, plastic substrates coated with inorganic materials and metal substrates coated with inorganic insulating materials are preferred. The use of such a substrate coated with an inorganic material eliminates the biggest problem of the degradation of organic EL materials due to water penetration (it is known that organic EL materials are degraded by, in particular, just a small amount of water) when a plastic substrate is used as a substrate for the organic EL display device 10. Furthermore, when a metal substrate is used as a substrate for the organic EL display device 10, it is possible to eliminate the biggest problem of leakage (short circuit) due to irregularities of the metal substrate (it is known that current leakage (short circuit) occurs frequently in the pixel portions because the organic layer 14 has a very small thickness of about 100 nm to about 200 nm).

In the case where TFTs (driving elements) used for active matrix addressing are formed, substrates that do not melt or deform at a temperature equal to or lower than 500° C. are preferably used as the first substrate 11 and the second substrate 23. Commonly used metal substrates have thermal expansion coefficients different from glass. It is thus difficult to form TFTs on a metal substrate with a conventional production apparatus. By the use of a metal substrate composed of an iron-nickel-based alloy having a linear expansion coefficient of $1 \times 10^{-5}$/° C. or less, the linear expansion coefficient is matched with that of glass; hence, it is possible to form TFTs on the metal substrate with a conventional production apparatus at low cost.

In the case of a plastic substrate, the plastic substrate has a very low heat-resistance temperature. Thus, TFTs are formed on the plastic substrate by forming the TFTs on a glass substrate and then transferring the TFTs on the glass substrate to the plastic substrate.

As the first substrate 11 and the second substrate 23, the foregoing substrates may be used without any limitation. In the case where light emitted from the organic EL section 15 and the wavelength conversion layer 20 emerges from the first substrate 11 side, a transparent or translucent substrate is used as the first substrate 11. In the case where light emitted from the organic EL section 15 and the wavelength conversion layer 20 emerges from the second substrate 23 side, a transparent or translucent substrate is used as the second substrate 23.

As a method for driving the organic EL section 15, conventional passive matrix addressing and active matrix addressing may be used. Conventional materials and processes used therefor may also be used.

Here, as a method for driving the organic EL section 15, active matrix addressing is preferred because peak brightness display can be easily performed, the display quality is excellent, the luminous time can be prolonged, compared with passive matrix driving, a driving voltage to achieve desired luminance can be reduced, the power consumption can be reduced.

With respect to the TFTs formed on the first substrate 11 and the second substrate 23, before the formation of the organic EL section 15, the TFTs are formed on the first substrate 11 and the second substrate 23 in advance and function as TFTs for switching and driving.

Examples of the TFTs according to this embodiment include known TFTs. Furthermore, metal-insulator-metal (MIM) diodes may be used in place of TFTs.

TFTs that may be used for the organic EL display device 10 may be formed using known materials, structures, and formation methods. Examples of a material for an active layer of a TFT include inorganic semiconductor materials, such as non-crystalline silicon (amorphous silicon), polycrystalline silicon (polysilicon), microcrystalline silicon, and cadmium selenide; oxide semiconductor materials, such as zinc oxide and indium oxide-gallium oxide-zinc oxide; and organic semiconductor materials, such as polythiophene derivatives, thiophene oligomers, poly(p-phenylene vinylene) derivatives, naphthacene, and pentacene. Examples of the structure of a TFT include staggered, inverted staggered, top gate, and coplanar types.

A method for forming an active layer included in a TFT include (1) a method in which amorphous silicon formed by a plasma-enhanced chemical vapor deposition (PECVD) method is doped with an impurity by ion doping; (2) a method in which amorphous silicon is formed by a low-pressure chemical vapor deposition (LPCVD) method with silane ($SiH_4$) gas, the amorphous silicon is crystallized by solid phase epitaxy into polysilicon, and then ion doping is performed by ion implantation; (3) a method in which amorphous silicon is formed by an LPCVD method with $Si_2H_6$ gas or a PECVD method with $SiH_4$ gas, the amorphous silicon is crystallized by annealing with a laser, such as an excimer laser, into polysilicon, and then ion doping is performed (low-temperature process); (4) a method in which a polysilicon layer is formed by an LPCVD method or a PECVD method and thermally oxidized at 1000° C. or higher to form a gate insulating film, a gate electrode composed of $n^+$ polysilicon is formed, and then ion doping is performed (high-temperature process); (5) a method in which an organic semiconductor material is formed by an ink jet method or the like; and (6) a method in which a single-crystal film composed of an organic semiconductor material is formed.

A gate insulating film of a TFT in this embodiment may be composed of a known material. Examples thereof include $SiO_2$ formed by a PECVD method, an LPCVD method, and so forth; and $SiO_2$ formed by thermally oxidizing a polysilicon film.

A signal electrode line, a scanning electrode line, a common electrode line, a first driving electrode, a second driving electrode, and so forth of a TFT in this embodiment may be composed of a known material. Examples of a material for the signal electrode line, the scanning electrode line, the common electrode line, the first driving electrode, the second driving electrode, and so forth include tantalum (Ta), aluminum (Al), and copper (Cu). The TFTs in the organic EL display device 10 may be formed as described above. This embodiment is not limited to the materials, the structures, and the formation methods.

An interlayer insulating film that may be used for the active-matrix organic EL display device 10 may be composed of a known material. Examples of a material for the interlayer insulating film include inorganic materials, such as silicon oxide ($SiO_2$), silicon nitride (SiN or $Si_2N_4$), and tantalum oxide (TaO or $Ta_2O_5$); and organic materials, such as acrylic resins and resist materials.

Examples of a method for forming an interlayer insulating film include dry processes, such as a chemical vapor deposition (CVD) method and a vacuum evaporation method; and wet processes, such as spin coating. Furthermore, an interlayer insulating film may be patterned by a photolithography method, as needed.

In the case where light emitted from the organic layer 14 emerges from the second substrate 23 side (the second electrode 13 side), a light-tight insulating film impervious to light is preferably formed in order to prevent a change in the properties of the TFTs formed on the second substrate 23 due to the incidence of extraneous light on the TFTs. Furthermore, the interlayer insulating film and the light-tight insulating film may be used in combination.

Examples of a material for the light-tight insulating film include a material in which a pigment or dye, for example, phthalocyanine or quinacridone, is dispersed in a polymer resin, such as polyimide; color resists; black matrix materials; inorganic insulating materials, such as $Ni_xZn_yFe_2O_4$. This embodiment, however, is not limited to the materials or the formation methods.

In the case where the organic EL display device 10 is operated in an active matrix mode and TFTs and so forth are formed on the first substrate 11 or the second substrate 23, irregularities are formed on the surface. The irregularities may cause defects of the organic EL section 15 (for example, the defect of the first electrode 12, the defect of the organic layer 14, a break of the second electrode 13, the short circuit between the first electrode 12 and the second electrode 13, and a reduction in breakdown voltage). To prevent these defects, a planarizing film may be disposed on the interlayer insulating film.

The planarizing film may be composed of a known material. Examples of a material for the planarizing film include inorganic materials, such as silicon oxide, silicon nitride, and tantalum oxide; and organic materials, such as polyimide, acrylic resins, and resist materials. Examples of a method for forming a planarizing film include dry processes, such as a CVD method and a vacuum deposition method; and wet processes, such as a spin coating method. This embodiment, however, is not limited to the materials and the formation methods. The planarizing film may have a single-layer structure or a multilayer structure.

As the organic EL section 15, a known organic EL section is used. An example thereof is, but not limited to, a structure in which the organic layer 14 including at least the organic light-emitting layer 35 containing a phosphorescent material having an emission spectrum at least including the emission of light in the blue wavelength and the emission of light in the green wavelength is held between the first electrode 12 and the second electrode 13.

The first electrode (pixel electrode) 12 and the second electrode (counter electrode) 13 function as a pair of anode and cathode of the organic EL section 15. When the first electrode 12 serves as an anode, the second electrode 13 serves as a cathode. When the first electrode 12 serves as a cathode, the second electrode 13 serves as an anode.

The first electrode 12 and the second electrode 13 may be composed of a known electrode material.

From the viewpoint of more efficiently injecting holes into the organic layer 14, examples of an electrode material used to form the anode include metals, such as gold (Au), platinum (Pt), and nickel (Ni), which have a work function of 4.5 eV or more; and transparent electrode materials, such as oxides, e.g., an oxide (ITO) of indium (In) and tin (Sn), an oxide ($SnO_2$) of tin (Sn), and an oxide (IZO) of indium (In) and zinc (Zn).

From the viewpoint of more efficiently injecting electrons into the organic layer 14, examples of an electrode material used to form the cathode include metals, such as lithium (Li), calcium (Ca), cerium (Ce), barium (Ba), and aluminum (Al), which have a work function of 4.5 eV or less, and alloys containing these metals, e.g., Mg—Ag alloys and Li—Al alloys.

The cathode may also be composed of a combination of a thin film (with a thickness of about 0.1 nm to about 5 nm) composed of a material having a low work function and a transparent electrode material, for example, an oxide (ITO) of indium (In) and tin (Sn), an oxide ($SnO_2$) of tin (Sn), or an oxide (IZO) of indium (In) and zinc (Zn). Furthermore, the doping of an electron transport layer included in the organic layer 14 with a donor or the like may allow the transparent electrode material to serve directly as the cathode.

The first electrode 12 and the second electrode 13 may be formed with the foregoing materials by a known method, such as an EB deposition method, a sputtering method, an ion plating method, a resistance heating evaporation method, or an ion beam sputtering method. This embodiment is not limited to these formation methods. The electrodes may be patterned by a photolithography method or a laser lift-off method, as needed. Alternatively, directly patterned electrodes may be formed using a shadow mask in combination.

Each of the first electrode 12 and the second electrode 13 preferably has a thickness of 50 nm or more. A thickness of less than 50 nm results in a high wiring resistance, thus possibly causing an increase in driving voltage.

In this embodiment, the use of a microcavity effect improves the color purity, the luminous efficiency, and the front luminance. In this embodiment, light (excitation light) emitted from the organic EL section 15 is light in the blue-green wavelength region. In the blue pixel portion 17, the light is passed through the blue color filter 16 to reduce green light, thereby providing blue light.

In the green pixel portion 19, the light is passed through the green color filter 18 to reduce blue light, thereby providing green light. A pixel in the organic EL section 15 corresponding to the blue pixel portion 17 is designed to enhance blue light by an interference effect between the reflective electrode and the translucent electrode or by the use of a microcavity structure (optical microcavity structure) provided by a dielectric multilayer film, so that the light emitted from the organic EL section 15 is changed from blue green to blue. Furthermore, A pixel in the organic EL section 15 corresponding to the green pixel portion 19 is designed to enhance green light by an interference effect between the reflective electrode and the translucent electrode or by the use of a microcavity structure (optical microcavity structure) provided by a dielectric multilayer film, so that the light emitted from the organic EL section 15 is changed from blue green to green. It is thus possible to improve the color purity, the luminous efficiency, and the front luminance of the organic EL display device 10.

Here, the blue pixel portion 17 and the green pixel portion 19 are different in the thickness of the transparent electrodes 32 of the first electrodes 12 configured to reflect light. The optical lengths between the second electrodes 13 (translucent electrodes) and the reflective electrodes 31 of the first electrodes 12 are designed to enhance blue and green for each portion. Thereby, light emitted from portions of the organic EL section 15 corresponding to the blue pixel portion 17 and the green pixel portion 19 is converted from blue-green light into blue-enhanced light and green-enhanced light, respectively. It is thus possible to improve the color purity, the luminous efficiency, and the front luminance of the organic EL display device 10.

Furthermore, the microcavity effect is provided by a method for adjusting the thickness of the transparent electrode 32 of the first electrode 12, thus easily performing patterning by a conventional photolithography method and eliminating the need for the patterning of the organic layer 14. It is therefore possible to form the organic layer 14 at low cost.

Here, in order to provide the microcavity effect, a translucent electrode needs to be used as the first electrode 12 when light emitted from the organic EL section 15 emerges from the first electrode 12 side.

Meanwhile, a translucent electrode needs to be used as the second electrode 13 when light emitted from the organic EL section 15 emerges from the second electrode 13 side.

As a material for the translucent electrode, a translucent electrode composed of a metal or a combination of a translucent electrode composed of a metal and a transparent electrode material is used. Silver is preferably used as the translucent electrode material in view of reflectance and transmittance.

The translucent electrode preferably has a thickness of 5 nm to 30 nm. A thickness of the translucent electrode of less than 5 nm fails to sufficiently reflect light, thereby failing to sufficiently providing the interference effect. A thickness of the translucent electrode of more than 30 nm results in a marked reduction in the transmittance of light, thereby possibly reducing the luminance and efficiency.

An electrode having high light reflectance is preferably used as the first electrode 12 or the second electrode 13. Examples of an electrode material having high light reflectance include reflective metal electrodes composed of, aluminum, silver, gold, aluminum-lithium alloys, aluminum-neodymium alloys, and aluminum-silicon alloys; and electrodes obtained by combining the reflective metal electrodes and transparent electrodes.

For double-sided emission, in the case where both the first electrode 12 and the second electrode 13 use the microcavity effect, the foregoing translucent electrode needs to be used. The first electrode 12 on the first substrate 11 has a laminated structure with a translucent electrode and a transparent electrode. Furthermore, the portions of the organic EL section 15 corresponding to the blue pixel portion 17 and the green pixel portion 19 are different in the thickness of the transparent electrodes. It is thus possible to improve the color purity, the luminous efficiency, and the front luminance of the organic EL display device 10.

Each of the hole injection layer 33, the hole transport layer 34, the organic light-emitting layer 35, the electron transport layer 36, and the electron injection layer 37 constituting the organic layer 14 may have a single-layer structure or a multilayer structure.

Furthermore, each of the hole injection layer 33, the hole transport layer 34, the organic light-emitting layer 35, the electron transport layer 36, and the electron injection layer 37 may be formed of an organic thin film or an inorganic thin film.

The organic layer 14 is not limited to the foregoing structure. The organic layer 14 may have a single-layer structure of an organic light-emitting layer or a multilayer structure including an organic light-emitting layer and a charge transport layer. Specific examples of the structure of the organic layer 14 are as follows:

(1) a structure in which only an organic light-emitting layer is disposed between the first electrode 12 and the second electrode 13;

(2) a structure in which a hole transport layer and an organic light-emitting layer are stacked in that order from the first electrode 12 side toward the second electrode 13 side;

(3) a structure in which an organic light-emitting layer and an electron transport layer are stacked in that order from the first electrode 12 side toward the second electrode 13 side;

(4) a structure in which a hole transport layer, an organic light-emitting layer, and an electron transport layer are stacked in that order from the first electrode 12 side toward the second electrode 13 side;

(5) a structure in which a hole injection layer, a hole transport layer, an organic light-emitting layer, and an electron transport layer are stacked in that order from the first electrode 12 side toward the second electrode 13 side;

(6) a structure in which a hole injection layer, a hole transport layer, an organic light-emitting layer, an electron transport layer, and an electron injection layer are stacked in that order from the first electrode 12 side toward the second electrode 13 side;

(7) a structure in which a hole injection layer, a hole transport layer, an organic light-emitting layer, a hole blocking layer, and an electron transport layer are stacked in that order from the first electrode 12 side toward the second electrode 13 side;

(8) a structure in which a hole injection layer, a hole transport layer, an organic light-emitting layer, a hole blocking layer, an electron transport layer, and an electron injection layer are stacked in that order from the first electrode 12 side toward the second electrode 13 side; and (9) a structure in which a hole injection layer, a hole transport layer, an electron blocking layer, an organic light-emitting layer, a hole blocking layer, an electron transport layer, and an electron injection layer are stacked in that order from the first electrode 12 side toward the second electrode 13 side.

Each of the organic light-emitting layer, the hole injection layer, the hole transport layer, the hole blocking layer, the electron blocking layer, the electron transport layer, and the electron injection layer may have a single-layer structure or a multilayer structure. Furthermore, each of the organic light-emitting layer, the hole injection layer, the hole transport layer, the hole blocking layer, the electron blocking layer, the electron transport layer, and the electron injection layer may be formed of an organic thin film or an inorganic thin film.

The charge injection/transport layer is classified into charge injection layers (the hole injection layer 33 and the electron injection layer 37) and charge transport layers (the hole transport layer 34 and the electron transport layer 36) for the purposes of more efficiently injecting charges (holes and electrons) from the electrode and transporting (injecting) into the light-emitting layer. The charge injection/transport layer may be composed of only a charge injection/transport material exemplified below. The charge injection/transport layer may optionally contain additives (e.g., a donor and an acceptor). The charge injection/transport layer may have a structure in which the material is dispersed in a polymer material (binder resin) or an inorganic material.

As the charge injection/transport material, a known charge injection/transport material for organic EL devices and organic photoconductors may be used. The charge injection/transport material is classified into a hole injection/transport material and an electron injection/transport material. While specific compounds thereof are exemplified below, this embodiment is not limited to these materials.

As a material for the hole injection layer 33 and the hole transport layer 34, known materials are used. Examples thereof include oxides, such as vanadium oxide ($V_2O_5$) and molybdenum oxide ($MoO_2$); inorganic p-type semiconductor materials; porphyrin compounds; aromatic tertiary amine compounds, such as N,N'-bis(3-methylphenyl)-N,N'-bis(phenyl)-benzidine (TPD) and N,N'-di(naphthalen-1-yl)-N,N'-diphenyl-benzidine (α-NPD); low-molecular-weight nitrogen-containing materials, such as hydrazone compounds, quinacridone compounds, and styrylamine compounds; and polymer materials, such as polyaniline (PANI), polyaniline-camphorsulfonic acid (PANI-CSA), 3,4-polyethylenedioxythiophene/polystyrene sulfonate (PEDOT/PSS), poly(triphenylamine) derivatives (Poly-TPD), polyvinylcarbazole (PVCz), poly(p-phenylene vinylene) (PPV), and poly(p-naphthalene vinylene) (PNV).

From the viewpoint of more efficiently performing the injection and transport of holes from the anode, a hole injection/transport material used for the hole injection layer 33 preferably has a lower energy level of the highest occupied molecular orbital (HOMO) than a hole injection/transport material used for the hole transport layer 34.

The hole injection/transport material used for the hole transport layer 34 preferably has a higher hole mobility than the hole injection/transport material used for the hole injection layer 33.

Each of the hole injection layer 33 and the hole transport layer 34 may optionally contain an additive (for example, a donor or an acceptor).

To improve the hole injection and transport performance, each of the hole injection layer 33 and the hole transport layer 34 preferably contains an acceptor. A known acceptor material for organic EL devices may be used as the acceptor. While specific compounds thereof are exemplified below, this embodiment is not limited to these materials.

The acceptor may be composed of an inorganic material or an organic material.

Examples of the inorganic material include gold (Au), platinum (Pt), tungsten (W), iridium (Ir), phosphorus oxychloride ($POCl_3$), a hexafluoroarsenate ion ($AsF_6^-$), chlorine (Cl), bromine (Br), iodine (I), vanadium oxide ($V_2O_5$), and molybdenum oxide ($MoO_2$).

Examples of the organic material include cyano group-containing compounds, such as 7,7,8,8,-tetracyanoquinodimethane (TCNQ), tetrafluorotetracyanoquinodimethane ($TCNQF_4$), tetracyanoethylene (TCNE), hexacyanobutadiene (HCNB), and dicyclodicyanobenzoquinone (DDQ), nitro group-containing compounds, such as trinitrofluorenone (TNF) and dinitrofluorenone (DNF), fluoranil, chloranil, and bromanil.

Among these, the cyano group-containing compounds, such as TCNQ, $TCNQF_4$, TCNE, HCNB, and DDQ, are more preferred because they are highly effective in increasing the carrier density.

The organic light-emitting layer 35 may be composed of only an organic light-emitting material described below or a combination of a light-emitting dopant and a host material. The organic light-emitting layer 35 may optionally contain a hole transport material, an electron transport material, and an additive (for example, a donor or an acceptor). The organic light-emitting layer 35 may have a structure in which the material is dispersed in a polymer material (binder resin) or an inorganic material. In view of luminous efficiency and lifetime, a material of the organic light-emitting layer 35 is preferably a material containing a light-emitting dopant dispersed in a host material.

Known light-emitting materials for organic EL devices may be used as the organic light-emitting material.

The organic light-emitting material is classified into a low-molecular-weight light-emitting material and a high-molecular-weight light-emitting material. While specific compounds thereof are exemplified below, this embodiment is not limited these materials.

The organic light-emitting material may be classified into, for example, fluorescent materials and phosphorescent materials. The phosphorescent materials having high luminous efficiency are preferably used from the viewpoint of reducing the power consumption.

Examples of the low-molecular-weight light-emitting material (containing a host material) used for the organic light-emitting layer 35 include aromatic dimethylidene compounds, such as 4,4'-bis(2,2'-diphenylvinyl)-biphenyl (DPVBi); oxadiazole compounds, such as 5-methyl-2-[2-[4-(5-methyl-2-benzoxazolyl)phenyl]vinyl]benzoxazole; triazole derivatives, such as 3-(4-biphenyl)-4-phenyl-5-t-butylphenyl-1,2,4-triazole (TAZ); styrylbenzene compounds, such as 1,4-bis(2-methylstyryl)benzene; fluorescent organic materials, such as thiopyrazine dioxide derivatives, benzoquinone derivatives, naphthoquinone derivatives, anthraquinone derivatives, diphenoquinone derivatives, and fluorenone derivatives; fluorescent organic metal complexes, such as an azomethine-zinc complex and a (8-hydroxyquinolinato)aluminum complex ($Alq_3$); a bis(benzoquinolinolato) beryllium complex (BeBq); 4,4'-bis-(2,2-di-p-tolyl-vinyl)-biphenyl (DTVBi); tris(1,3-diphenyl-1,3-propanediono) (monophenanthroline)Eu(III) ($Eu(DBM)_3(Phen)$); diphenylethylene derivatives; triphenylamine derivatives, such as tris[4-(9-phenylfluoren-9-yl)phenyl]amine (TFTPA); diaminocarbazole derivatives; bistyryl derivatives; aromatic diamine derivatives; quinacridone-based compounds; perylene-based compounds; coumarin-based compounds; distyrylarylene derivatives (DPVBi); oligothiophene derivatives (BMA-3T); silane derivatives, such as 4,4'-di(triphenylsilyl)-biphenyl (BSB), diphenyl-di(o-tolyl)silane (UGH1), 1,4-bistriphenylsilylbenzene (UGH2), 1,3-bis(triphenylsilyl) benzene (UGH3), and triphenyl-(4-(9-phenyl-9H-fluoren-9-yl)phenyl)silane (TPSi-F); carbazole derivatives, such as 9,9-di(4-dicarbazole-benzyl)fluorene (CPF), 3,6-bis(triphenylsilyl)carbazole (mCP), 4,4'-bis(carbazol-9-yl) biphenyl (CBP), 4,4'-bis(carbazol-9-yl)-2,2'-dimethylbiphenyl (CDBP), N,N-dicarbazolyl-3,5-benzene (m-CP), 3-(diphenylphosphoryl)-9-phenyl-9H-carbazole (PPO1), 3,6-di(9-carbazolyl)-9-(2-ethylhexyl)carbazole (TCz1), 9,9'-(5-(triphenylsilyl)-1,3-phenylene)bis(9H-carbazole) (SimCP), bis(3,5-di(9H-carbazol-9-yl)phenyl)diphenylsilane (SimCP2), 3-(diphenylphosphoryl)-9-(4-diphenylphosphoryl)phenyl)-9H-carbazole (PPO2), 2,2-bis(4-carbazolylphenyl)-1,1-biphenyl (4CzPBP), 3,6-bis(diphenylphosphoryl)-9-phenyl-9H-carbazole (PPO2), 9-(4-tert-butylphenyl)-3,6-bis(triphenylsilyl)-9H-carbazole (CzSi), 3,6-bis[(3,5-diphenyl)phenyl]-9-phenyl-carbazole (CzTP), 9-(4-tert-butylphenyl)-3,6-ditrityl-9H-carbazole (CzC), 9-(4-tert-butylphenyl)-3,6-bis(9-(4-methoxyphenyl)-9H-fluoren-9-yl)-9H-carbazole (DFC), 2,2'-bis(4-carbazol-9-yl)phenyl)-biphenyl (BCBP), and 9,9'-((2,6-diphenyl-benzo[1,2-b:4,5-b']difuran-3,7-diyl)bis(4,1-phenylene))bis (9H-carbazole) (CZBDF); aniline derivatives, such as 4-(diphenylphosphoryl)-N,N-diphenylaniline (HM-A1); fluorene derivatives, such as 1,3-bis(9-phenyl-9H-fluoren-9-yl)benzene (mDPFB), 1,4-bis(9-phenyl-9H-fluoren-9-yl) benzene (pDPFB), 2,7-bis(carbazol-9-yl)-9,9-dimethylfluorene (DMFL-CBP), 2-[9,9-di(4-methylphenyl)-fluoren-2-yl]-9,9-di(4-methylphenyl)fluorene (BDAF), 2-(9,9-spirobifluoren-2-yl)-9,9-spirobifluorene (BSBF), 9,9-bis[4-(pyrenyl)phenyl]-9H-fluorene (BPPF), 2,2'-dipyrenyl-9,9-spirobifluorene (Spiro-Pye), 2,7-dipyrenyl-9,9-spirobifluorene (2,2'-Spiro-Pye), 2,7-bis[9,9-di(4-methylphenyl)-fluoren-2-yl]-9,9-di(4-methylphenyl) fluorene (TDAF), 2,7-bis(9,9-spirobifluoren-2-yl)-9,9-spirobifluorene (TSBF), and 9,9-spirobifluoren-2-yl-diphenyl-phosphine oxide (SPPO1); pyrene derivatives, such as 1,3-di(pyren-1-yl)benzene (m-Bpye); benzoate derivatives, such as propane-2,2'-diylbis(4,1-phenylene)dibenzoate (MMA1); phosphine oxide derivatives, such as 4,4'-bis(diphenylphosphine oxide)biphenyl (PO1), and 2,8-bis(diphenylphosphoryl)dibenzo[b,d]thiophene (PPT); terphenyl derivatives, such as 4,4''-di(triphenylsilyl)-p-terphenyl (BST); and triazine derivatives, such as 2,4-bis(phenoxy)-6-(3-methyldiphenylamino)-1,3,5-triazine (BPMT).

Examples of the high-molecular-weight light-emitting material used for the organic light-emitting layer 35 include poly(phenylene vinylene) derivatives, such as poly(2-decyloxy-1,4-phenylene) (DO-PPP), poly[2,5-bis-[2-(N,N,N-triethylammonium)ethoxy]-1,4-phenyl-alt-1,4-phenylene]dibromide (PPP-NEt$^{3+}$), poly[2-(2'-ethylhexyloxy)-5-methoxy-1,4-phenylene vinylene] (MEH-PPV), poly[5-methoxy-(2-propanoxysulfonide)-1,4-phenylene vinylene] (MPS-PPV), and poly[2,5-bis-(hexyloxy)-1,4-phenylene-(1-cyanovinylene)] (CN-PPV); polyspiro derivatives, such as poly(9,9-dioctylfluorene) (PDAF); and carbazole derivatives, such as poly(N-vinylcarbazole) (PVK).

The organic light-emitting material is preferably a low-molecular-weight light-emitting material. The phosphorescent materials having high luminous efficiency are preferably used from the viewpoint of reducing the power consumption.

A known dopant for organic EL devices may be used as the light-emitting dopant used for the organic light-emitting layer 35. Regarding such a dopant, examples of a phosphorescent material that emits light in the blue-green wavelength region include organic metal complexes, such as iridium(III) bis[(4,6-difluorophenyl)-pyridinato]picolinate (FIrpic) (peak wavelength (intensity ratio): 470 nm (1), 494 nm (0.8)), iridium(III) bis[(4,6-difluorophenyl)-pyridinato]-3-(trifluoromethyl)-5-(pyridin-2-yl)-1,2,4-triazolate (FIrtaz) (peak wavelength (intensity ratio): 460 nm (1), 489 nm (0.84)), iridium(III) bis[(4,6-difluorophenyl)-pyridinato]-5-(pyridin-2-yl)-1H-tetrazolate (FIrN4) (peak wavelength (intensity ratio): 459 nm (1), 489 nm (0.79)), and iridium(III) bis(4',6'-difluorophenylpyridinato)tetrakis(1-pyrazolyl)borate (FIr6) (peak wavelength (intensity ratio): 461 nm (1), 490 nm (0.83)).

Examples of a host material upon using the dopant include the low-molecular-weight light-emitting material, the high-molecular-weight light-emitting material, and carbazole derivatives, such as 4,4'-bis(carbazole)biphenyl and 3-(2,7-bis(diphenylphosphoryl)-9-phenyl-9H-fluoren-9-yl)-9-phenyl-9H-carbazole (PCF).

To efficiently provide blue light emission and green light emission in the respective different pixels using the microcavity effect, among known dopants used for organic EL devices, a dopant material having two light-emitting components is preferably used as the light-emitting dopant used for the organic light-emitting layer 35. Here, the dopant material having two light-emitting components indicates a material in which when the emission spectrum of the dopant is separated for each light-emitting component, two or more components are obtained, and exhibits an emission spectrum having two peaks and a shoulder.

In the two light-emitting components of the dopant material, a first component (a component on the shorter wavelength side) preferably has a peak wavelength of 450 to 480 nm, and a second component (a component on the longer wavelength side) preferably has a peak wavelength of 480 to 530 nm.

A difference in peak wavelength between the first component and the second component is preferably 20 to 80 nm.

The peak intensity ratio of the first component to the second component is preferably 7:3 to 5:5.

Thereby, blue light emission and green light emission with high efficiency and high color purity necessary for the blue pixel and the green pixel can be output from the organic EL section 15 using the microcavity effect.

Examples of a material for the electron transport layer 36 and the electron injection layer 37 include low-molecular-weight materials, such as inorganic n-type semiconductor materials, oxadiazole derivatives, triazole derivatives, thiopyrazine dioxide derivatives, benzoquinone derivatives, naphthoquinone derivatives, anthraquinone derivatives, diphenoquinone derivatives, fluorenone derivatives, and benzodifuran derivatives; and high-molecular-weight materials, such as poly(oxadiazole) (Poly-OXZ) and polystyrene derivatives (PSS). In particular, examples of a material for the electron injection layer 37 include fluorides, such as lithium fluoride (LiF) and barium fluoride (BaF$_2$), and oxides, such as lithium oxide (Li$_2$O).

From the viewpoint of more efficiently performing the injection and transport of electrons from the cathode, a material used for the electron injection layer 37 preferably has a higher energy level of the lowest unoccupied molecular orbital (LUMO) than a material for the electron transport layer 36. The material used for the electron transport layer 36 preferably has a higher electron mobility than the material for the electron transport layer 36.

To improve the electron injection and transport performance, each of the material for the electron transport layer 36 and the material for the electron injection layer 37 preferably contains a donor. A known donor material for organic EL devices may be used for the donor. While specific compounds thereof are exemplified below, this embodiment is not limited to these materials.

The donor may be an inorganic material or an organic material.

Examples of the inorganic material include alkali metals, such as lithium, sodium, and potassium; alkaline-earth metals, such as magnesium and calcium; rare earth elements; aluminum (Al); silver (Ag); copper (Cu); and indium (In).

Examples of the organic material include compounds each having an aromatic tertiary amine skeleton; optionally substituted fused polycyclic compounds, such as phenanthrene, pyrene, perylene, anthracene, tetracene, and pentacene; tetrathiafulvalenes (TTFs); dibenzofuran, phenothiazine, and carbazole.

Examples of the compounds each having an aromatic tertiary amine skeleton include anilines; phenylenediamine; benzidines, such as N,N,N',N'-tetraphenylbenzidine, N,N'-bis-(3-methylphenyl)-N,N'-bis-(phenyl)-benzidine, and N,N'-di(naphthalen-1-yl)-N,N'-diphenyl-benzidine; triphenylamines, such as triphenylamine, 4,4'4''-tris(N,N-diphenyl-amino)-triphenylamine, 4,4'4''-tris(N-3-methylphenyl-N-phenyl-amino)-triphenylamine, and 4,4'4''-tris(N-(1-naphthyl)-N-phenyl-amino)-triphenylamine; and triphenyldiamines, such as N,N'-di-(4-methyl-phenyl)-N,N'-diphenyl-1,4-phenylenediamine.

The fact that the fused polycyclic compound "has a substituent" indicates that one or more hydrogen atoms in the fused polycyclic compound are replaced with groups (substituents) other than hydrogen atoms. The number of the substituents is not particularly limited. All hydrogen atoms may be replaced with substituents. Furthermore, the position of the substituent is not particularly limited.

Examples of the substituent include an alkyl group having 1 to 10 carbon atoms, an alkoxy group having 1 to 10 carbon atoms, an alkynyl group having 2 to 10 carbon atoms, an alkenyloxy group having 2 to 10 carbon atoms, an aryl groups having 6 to 15 carbon atoms, an aryloxy groups having 6 to 15 carbon atoms, a hydroxy group, and a halogen atom.

The alkyl group may be linear, branched, or cyclic.

Examples of the linear or branched alkyl group include a methyl group, an ethyl group, a n-propyl group, an isopropyl group, a n-butyl group, an isobutyl group, a sec-butyl group, a tert-butyl group, a n-pentyl group, an isopentyl group, a neopentyl group, a tert-pentyl group, a 1-methylbutyl group, a n-hexyl group, a 2-methylpentyl group, a 3-methylpentyl group, a 2,2-dimethylbutyl group, a 2,3-dimethylbutyl group, a n-heptyl group, a 2-methylhexyl group, a 3-methylhexyl group, a 2,2-dimethylpentyl group, a 2,3-dimethylpentyl group, a 2,4-dimethylpentyl group, a 3,3-dimethylpentyl group, a 3-ethylpentyl group, a 2,2,3-trimethylbutyl group, a n-octyl group, an isooctyl group, a nonyl group, and a decyl group.

The cyclic alkyl group may be monocyclic or polycyclic. Examples thereof include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, and tricyclodecyl group.

An example of the alkoxy group is a monovalent group in which an alkyl group is bound to an oxygen atom.

An example of the alkenyl group is a group in which a single bond (C—C) between carbon atoms in an alkyl group having 2 to 10 carbon atoms is replaced with a double bond (C═C).

An example of the alkenyloxy group is a monovalent group in which an alkenyl group is bound to an oxygen atom.

The aryl group may be monocyclic or polycyclic. The number of membered rings is not particularly limited. Preferred examples thereof include a phenyl group, a 1-naphthyl group, and a 2-naphthyl group.

An example of the aryloxy group is a monovalent group in which an aryl group is bound to an oxygen atom.

Examples of the halogen atom include a fluorine atom, a chlorine atom, a bromine atom, and an iodine atom.

Among these, the compounds each having an aromatic tertiary amine skeleton, the optionally substituted fused polycyclic compounds, and the alkali metals are preferably used as the donor because they can more effectively increase the carrier density.

Each of the hole injection layer 33, the hole transport layer 34, the organic light-emitting layer 35, the electron transport layer 36, and the electron injection layer 37 may be formed by a known wet process, for example, a coating method, for example, a spin coating method, a dipping method, a doctor blade method, an ejection coating method, or a spray coating method, or a printing method, for example, an ink-jet method, a letterpress printing method, an intaglio printing method, a screen printing method, or a microgravure coating method, using a coating solution to form the organic layer, the coating solution being prepared by dissolving or dispersing the foregoing material in a solvent. Alternatively, the layers may be formed by a known dry process, for example, a resistance heating evaporation method, an electron beam (EB) deposition method, a molecular beam epitaxy (MBE) method, a sputtering method, or an organic vapor phase deposition (OVPD) method, or by a laser transfer method using the foregoing material.

In the case where the layers constituting the organic layer 14 is formed by the wet process, the coating solution to form the organic layer may contain an additive to adjust the physical properties of the coating solution, for example, a leveling agent or a viscosity modifier. In this embodiment, there is no need to pattern the organic layer 14. Thus, a low-cost patterning method may be employed.

Each of the layers constituting the organic layer 14 usually has a thickness of about 1 nm to about 1000 nm and preferably 10 nm to 200 nm.

When each of the layers constituting the organic layer 14 has a thickness of less than 10 nm, physical properties originally required (injection properties, transport properties, and confinement properties of charges) are not provided. Furthermore, pixel defects can be caused by foreign matter, such as dust. When each of the layers constituting the organic layer 14 has a thickness of more than 200 nm, a resistance component in the organic layer 14 causes an increase in driving voltage, thereby leading to an increase in power consumption.

The edge cover 22 is provided in order not to cause leakage to occur between the first electrode 12 and the second electrode 13 at least at an edge portion of the first electrode 12 on the first substrate 11 side.

The edge cover 22 may be formed by a known method, for example, an EB deposition method, a sputtering method, an ion plating method, or a resistance heating evaporation method with an insulating material.

Furthermore, the edge cover 22 may be patterned by a known dry or wet photolithography method. A method for forming the edge cover 22 is not limited to these formation methods.

The edge cover 22 is composed of, but not particularly limited to, a known material. As a material for the edge cover 22, a material that transmits light is used. Examples thereof include SiO, SiON, SiN, SiOC, SiC, HfSiON, ZrO, HfO, and LaO.

The edge cover 22 preferably has a thickness of 100 nm to 2000 nm.

A thickness of the edge cover 22 of less than 100 nm results in insufficient insulation performance, so that leakage occurs between the first electrode 12 and the second electrode 13, thereby causing an increase in power consumption and causing the failure of emission. At a thickness of the edge cover 22 of more than 2000 nm, it takes a lot of time for the film formation process, thereby causing a reduction in productivity and causing a break of the second electrode 13 by the edge cover 22.

In this embodiment, the organic EL section 15 is not patterned, thus causing a loss of light that propagates in the lateral direction through the organic EL section 15. To prevent the occurrence of the leakage between the first electrode 12 and the second electrode 13 and effectively use the loss of light in the lateral direction, the edge cover 22 may be composed of a light-reflecting material or light-scattering material.

The edge cover 22 capable of reflecting light may have a structure in which a metal, for example, aluminum or silver, is covered with a transparent insulating material, for example, silica ($SiO_2$).

As a material for the edge cover 22 capable of scattering light, a material containing light-scattering particles dispersed in a resin is preferably used. To effectively scatter blue light by the edge cover 22 capable of scattering light, the light-scattering particles need to have a particle size in the Mie scattering region. Thus, the light-scattering particles preferably have a particle size of about 100 nm to about 500 nm.

In the case where particles composed of an inorganic material (fine inorganic particles) are used as the light-scattering particles, examples thereof include silica beads (refractive index: 1.44), alumina beads (refractive index: 1.63), titanium beads (refractive index, anatase: 2.50, rutile: 2.70), zirconium oxide beads (refractive index: 2.05), zinc oxide beads (refractive index: 2.00), and barium titanate ($BaTiO_3$) (refractive index: 2.4).

In the case where particles composed of an organic material (fine organic particles) are used as the light-scattering particles, examples thereof include polymethyl methacrylate beads (refractive index: 1.49), acrylic beads (refractive index: 1.50), acrylic-styrene copolymer beads (refractive index: 1.54), melamine beads (refractive index: 1.57), high-refractive index melamine beads (refractive index: 1.65), polycarbonate beads (refractive index: 1.57), styrene beads (refractive index: 1.60), cross-linked polystyrene beads (refractive index: 1.61), polyvinyl chloride beads (refractive index: 1.60), benzoguanamine-melamine formaldehyde beads (refractive index: 1.68), and silicone beads (refractive index: 1.50).

Examples of a resin material used as a mixture with the light-scattering particles include an acrylic resin (refractive index: 1.49), a melamine resin (refractive index: 1.57), nylon (refractive index: 1.53), polystyrene (refractive index: 1.60), melamine beads (refractive index: 1.57), polycarbonate (refractive index: 1.57), polyvinyl chloride (refractive index: 1.60), polyvinylidene chloride (refractive index: 1.61), polyvinyl acetate (refractive index: 1.46), polyethylene (refractive index: 1.53), polymethyl methacrylate (refractive index: 1.49), polyMBS (refractive index: 1.54), medium-density polyethylene (refractive index: 1.53), high-density polyethylene (refractive index: 1.54), tetrafluoroethylene (refractive index: 1.35), poly(trifluorochloroethylene) (refractive index: 1.42), and polytetrafluoroethylene (refractive index: 1.35).

The organic EL display device 10 is electrically connected to external driving circuits (a scanning line electrode circuit, a data signal electrode circuit, and a power supply circuit).

Here, as the first substrate 11 included in the organic EL display device 10, a glass substrate, preferably a metal substrate or a plastic substrate, and more preferably an insulating material-coated metal or plastic substrate is used.

The organic EL display device 10 may be directly connected to the external driving circuits and may be driven. Alternatively, a switching circuit, such as a TFT, is disposed in a pixel, and external driving circuits (a scanning line electrode circuit (a source driver), a data signal electrode circuit (a gate driver), and a power supply circuit) may be electrically connected to lines to which the TFT and so forth are connected.

In the case where the organic EL display device 10 is operated in an active matrix mode, regarding an active substrate disposed in the organic EL section 15 included in the organic EL display device 10, a plurality of scanning signal lines and data signal lines and TFT circuits are arranged on a glass substrate, preferably on a metal substrate or a plastic substrate, and more preferably on an insulating material-coated metal or plastic substrate, the TFT circuits being arranged at intersections of the scanning signal lines and the data signal lines.

The organic EL display device 10 is driven by a voltage-driven digital gray-scale method. Each pixel includes two TFTs: a switching TFT and a driving TFT. The driving TFT is electrically connected to the first electrode 12 in the organic EL section 15 through a contact hole formed in the planarizing layer.

In each pixel, a capacitor is arranged so as to be connected to the gate electrode of the driving TFT, the capacitor being configured to allow a gate potential of the driving TFT to be a constant potential. The planarizing layer is formed on the TFTs.

This embodiment, however, is not limited thereto. The voltage-driven digital gray-scale method may be employed. Alternatively, a current-driven analog gray-scale method may be employed. The number of TFTs is not particularly limited. The organic EL section 15 may be driven using the foregoing two TFTs. Alternatively, a portion of the organic EL section 15 may be driven using two or more TFTs including a compensation circuit in a pixel for the purpose of preventing variations in TFT characteristics (mobility and threshold voltage).

The wavelength conversion layer 20 in the red pixel portion 21 is formed of a red wavelength conversion layer configured to absorb excitation light from the organic EL section 15 (at least one of light in the blue wavelength region and light in the green wavelength region) and emit light in the red wavelength region.

The organic EL display device 10 may further include a yellow pixel portion having a wavelength conversion layer (yellow wavelength conversion layer) configured to absorb the excitation light from the organic EL section 15 and emit light in a yellow wavelength region, as needed.

Here, the color purity of light in the yellow wavelength region from the yellow pixel portion is set so as to be located outside a line formed by the connection of the position of the color purity of light in the red wavelength region emitted from the red pixel portion 21 and the position of the color purity of light in the green wavelength region emitted from the green pixel portion 19 on a chromaticity diagram. Thus, the organic EL display device 10 has an extended color reproduction range, compared with a display device including just the red pixel portion 21 and the green pixel portion 19.

The wavelength conversion layers 20, 26, and 27 may be composed of only phosphor materials illustrated below and may optionally contain an additive and so forth. These materials may be dispersed in a polymer material (binder resin) or an inorganic material.

Known phosphor materials may be used as phosphor materials contained in the wavelength conversion layers 20, 26, and 27. These phosphor materials are classified into organic phosphor materials and inorganic phosphor materials. While specific compounds thereof are illustrated below, this embodiment is not limited to these materials.

In particular, in the case where the organic EL display device 10 is a high-definition display device, the width of a pixel pattern is required to be smaller than the thickness of the wavelength conversion layer 20.

However, a reduction in the thickness of the wavelength conversion layer 20 reduces the amount of excitation light absorbed to cause the excitation light from the organic EL section 15 to be mixed with red light from the wavelength conversion layer 20, thereby reducing the color purity. It is thus necessary to increase the concentration of the wavelength conversion material in the wavelength conversion layer 20. At a higher concentration of the wavelength conversion material, the luminous efficiency is reduced by what is called concentration quenching. Thus, the wavelength conversion layer 20 preferably contains two types of phosphor materials (a first wavelength conversion material and a second wavelength conversion material) mainly responsible for light absorption and light emission, respectively, as the wavelength conversion material. This achieves both sufficient absorption of the excitation light and high luminous efficiency by the thin film.

When the first wavelength conversion material in the wavelength conversion layer 20 absorbs the excitation light from the organic EL section 15 into an excited state, energy transfer from the first wavelength conversion material to the second wavelength conversion material having a lower energy level than the first wavelength conversion material occurs easily, compared with energy transfer between the first wavelength conversion materials. Thus, the excitation energy of the first wavelength conversion material is not dissipated by transfer between the first wavelength conversion materials (concentration quenching). Most of the excitation energy is transferred to the second wavelength conversion material, thereby possibly contributing to the light emission from the second wavelength conversion material. The concentration of the first wavelength conversion material in the wavelength conversion layer 20 is set to a high concentration at which concentration quenching occurs substantially. This results in an increase in the absorption ratio of the first wavelength conversion material. Thus, the first wavelength conversion material sufficiently absorbs the excitation light from the organic EL section 15, and then the energy is transferred from the first wavelength conversion material to the second wavelength conversion material. Furthermore, the concentration of the second wavelength conversion material in the wavelength conversion layer 20 is set to a low concentration at which substantially no concentration quenching occurs. The second wavelength conversion material is subjected to wavelength conversion by the efficient use of the excitation energy transferred from the first wavelength conversion material, so that it is possible to emit light in a desired wavelength region.

In this way, the wavelength conversion layer 20 achieves both the small thickness and the high luminous efficiency. In other words, a function to absorb the excitation light from the organic EL section 15 and a function to emit light in a desired wavelength region are separated. The first wavelength conversion material and the second wavelength conversion material are allowed to be responsible for the respective functions. Thereby, a high absorption ratio and high luminous efficiency are preferably maintained in the wavelength conversion layer 20 without increasing the thickness of the wavelength conversion layer 20.

Regarding the sufficient absorption of the excitation light, the absorption ratio at the excitation wavelength is preferably 80% or more and more preferably 90% or more.

Furthermore, the wavelength conversion layer 20 contains the phosphor material (first wavelength conversion material) that absorbs the excitation light from the organic EL section 15 and the phosphor material (second wavelength conversion material) that emits light of a desired color (for example, red). Thus, the first wavelength conversion material absorbs light incident on the wavelength conversion layer 20 and transfers the energy to the second wavelength conversion material. Then the second wavelength conversion material receives the energy from the first wavelength conversion material, so that the wavelength conversion layer 20 emits light having a spectrum different from the original incident light.

That is, the first wavelength conversion material is a wavelength conversion material capable of absorbing the excitation light incident on the wavelength conversion layer 20 from the organic EL section and transferring the absorbed energy to the second wavelength conversion material. Thus, the absorption spectrum of the second wavelength conversion material preferably overlaps the spectrum of the excitation light from the organic EL section 15. More preferably, the absorption maximum of the first wavelength conversion material is matched with the maximum of the spectrum of the excitation light from the organic EL section 15. Furthermore, the emission spectrum of the second wavelength conversion material preferably overlaps the absorption spectrum of the second wavelength conversion material. More preferably, the maximum of the emission spectrum of the first wavelength conversion material is matched with the absorption maximum of the second wavelength conversion material. Regarding the fact that the maxima of the spectra are matched with each other, a difference between peak wavelengths is preferably 20% or less and more preferably 10% or less.

In the wavelength conversion layer 20, the absorption of the excitation light from the organic EL section 15 and the emission are achieved by the respective different wavelength conversion materials. It is thus possible to increase a difference between the absorption peak wavelength of incident light by the first wavelength conversion material and the emission peak wavelength after the wavelength conversion by the second wavelength conversion material. The function to absorb the excitation light from the organic EL section 15 and the function to emit light in a desired wavelength region are separated from each other. This provides a wide choice of options for materials used as the first wavelength conversion material and the second wavelength conversion material.

Regarding the organic phosphor materials, examples of a fluorescent dye that converts ultraviolet excitation light into light in the blue wavelength region include styrylbenzene dyes, such as 1,4-bis(2-methylstyryl)benzene and trans-4,4'-diphenylstilbenzene; and coumarin dyes, such as 7-hydroxy-4-methylcoumarin.

Examples of an organic fluorescent dye that convers excitation light in the blue to green wavelength region into light in the red wavelength region include cyanine dyes, such as 4-dicyanomethylene-2-methyl-6-(p-dimethylaminostyryl)-4H-pyran; pyridine dyes, such as 1-ethyl-2-[4-(p-dimethylaminophenyl)-1,3-butadienyl]-pyridinium perchlorate (Pyridine 1); and rhodamine dyes, such as rhodamine B, rhodamine 6G, rhodamine 3B, rhodamine 101, rhodamine 110, Basic Violet 11, and sulforhodamine 101.

Examples of the inorganic phosphor materials include $Y_2O_2S:Eu^{3+}$, $YAlO_3:Eu^{3+}$, $Ca_2Y_2(SiO_4)_6:Eu^{3+}$, $LiY_9(SiO_4)_6O_2:Eu^{3+}$, $YVO_4:Eu^{3+}$, $CaS:Eu^{3+}$, $Gd_2O_3:Eu^{3+}$, $Gd_2O_2S:Eu^{3+}$, $Y(P,V)O_4:Eu^{3+}$, $Mg_4GeO_{5.5}:Mn^{4+}$, $Mg_4GeO_6:Mn^{4+}$, $K_5Eu_{2.5}(WO_4)_{6.25}$, $Na_5Eu_{2.5}(WO_4)_{6.25}$, $K_5Eu_{2.5}(MoO_4)_{6.25}$, and $Na_5Eu_{2.5}(MoO_4)_{6.25}$.

The inorganic phosphor materials may be subjected to surface modification treatment, as needed. Examples of a method of the surface modification treatment include chemical treatment using a silane coupling agent or the like; physical treatment by the addition of fine particles that are submicron in size; and a combination thereof.

The inorganic materials are preferably used as the wavelength conversion material in consideration of stability, in other words, degradation due to excitation light and emission of light.

In the case where the inorganic phosphor material is used as the wavelength conversion material, the concentration thereof is not particularly limited. A higher concentration is preferred in view of the absorption ratio of excitation light and the luminous efficiency. Thus, the wavelength conversion material may be composed of 100% of the inorganic phosphor material.

In the case where the organic phosphor material is used as the wavelength conversion material, preferably, the concentration quenching of the wavelength conversion material does not occur. The reason for this is that the occurrence of the concentration quenching of the wavelength conversion material reduces the luminous efficiency.

The concentration of the wavelength conversion material in the wavelength conversion layer 20 is preferably 10% by mass or less, more preferably 0.01% by mass to 10% by mass, and still more preferably 0.1% by mass to 5% by mass with respect to the total amount of materials constituting the wavelength conversion layer 20, provided that substantially no concentration quenching occurs. The use of the wavelength conversion material within the concentration range enables appropriate prevention of concentration quenching and the achievement of sufficient luminous efficiency.

In the case where the first wavelength conversion material and the second wavelength conversion material are used in combination in the wavelength conversion layer 20, the content of the first wavelength conversion material is preferably in the range of 30% by mass to 99.99% by mass with respect to the total amount of materials constituting the wavelength conversion layer 20. The use of the first wavelength conversion material within the concentration range allows the first wavelength conversion material to sufficiently absorb light incident on the wavelength conversion layer 20 from the organic EL section 15, allows the absorbed light energy to transfer from the first wavelength conversion material to the second wavelength conversion material, and prevents a reduction in color purity due to leakage of excitation light.

In the wavelength conversion layer 20, the wavelength conversion material that emits light in a desired wavelength region is the second wavelength conversion material. Thus, the concentration of the second wavelength conversion material in the wavelength conversion layer 20 is preferably in the range in which the concentration quenching of the second wavelength conversion material does not occur. The reason for this is that when the occurrence of the concentration quenching of the second wavelength conversion reduces the luminous efficiency of the wavelength conversion layer 20.

The upper limit of the concentration of the second wavelength conversion material in the wavelength conversion layer 20 can vary, depending on the types of the first wavelength conversion material and the second wavelength conversion material, provided that substantially no concentration quenching occurs.

The lower limit of the concentration of the second wavelength conversion material in the wavelength conversion layer 20 can vary, depending on the types of the first wavelength conversion material and the second wavelength conversion material or depending on the intended application, provided that sufficient emission intensity is achieved.

The concentration of the second wavelength conversion material in the wavelength conversion layer 20 is preferably 10% by mass or less, more preferably 0.01% by mass to 10% by mass, and still more preferably 0.1% by mass to 5% by mass with respect to the total amount of materials constituting the wavelength conversion layer 20. The use of the second wavelength conversion material within the concentration range enables appropriate prevention of concentration quenching and the achievement of sufficient luminous efficiency.

The wavelength conversion layer 20 usually has a thickness of about 100 nm to about 100 μm and preferably 1 to 100 μm.

A thickness of the wavelength conversion layer 20 of less than 100 nm causes problems of a reduction in luminous efficiency and a deterioration in color purity due to the mixture of a necessary color with excitation light because light emitted from the organic EL section 15 is not sufficiently absorbed. To increase the absorption of light emitted from the organic EL section 15 and reduce the transmitted light component of excitation light to the extent that the color purity is not adversely affected, the wavelength conversion layer 20 preferably has a thickness of 1 μm or more. A thickness of the wavelength conversion layer 20 of more than 100 μm does not lead to an increase in luminous efficiency and just leads to the consumption of the materials because light emitted from the organic EL section 15 is already sufficiently absorbed, thereby resulting in an increase in material cost.

The wavelength conversion layer 20 may be formed by a known wet process, for example, a coating method, for example, a spin coating method, a dipping method, a doctor blade method, an ejection coating method, or a spray coating method, or a printing method, for example, an ink-jet method, a letterpress printing method, an intaglio printing method, a screen printing method, or a microgravure coating method, using coating solution to form the phosphor layer, the coating solution being prepared by dissolving or dispersing the foregoing phosphor material and a resin material in a solvent. Alternatively, the wavelength conversion layer 20 may be formed by, for example, a known dry process, such as a resistance heating evaporation method, an electron beam (EB) deposition method, a molecular beam epitaxy (MBE) method, a sputtering method, or an organic vapor phase deposition (OVPD) method with the foregoing materials. Furthermore, higher definition can be achieved by a photobleaching method or a transfer method (a laser transfer method or a thermal transfer method) at low cost.

In this embodiment, the wavelength conversion layer 20 configured to use light emitted from the organic EL section 15 as excitation light and emit light in the red wavelength region may be formed only in the red pixel portion 21 by the use of the photobleaching method as a patterning method. That is, a very simple method may be employed in which the wavelength conversion layer 26 in the blue pixel portion 17 and the wavelength conversion layer 27 in the green pixel portion 19 are exposed to a wavelength that is absorbed by the wavelength conversion layers 26 and 27 to reduce the fluorescence intensity and in which the red pixel portion 21 is not exposed to light with the foregoing wavelength. Thus, exposure may be performed once with a single mask, enabling patterning at low cost.

Furthermore, in the case where green and red wavelength conversion layers are required like a conventional method, the green pixel portion 19 is required to be exposed to light with a wavelength that reduces only the intensity of fluorescence from the wavelength conversion layer 20 in the red pixel portion 21. This method does not cause a problem in which the intensity of fluorescence from the wavelength conversion layer 27 in the green pixel portion 19 is also reduced by light with a wavelength that reduces only the intensity of fluorescence from the wavelength conversion layer 20 in the red pixel portion 21.

Furthermore, the photobleaching method eliminates the need for a reduction in the intensity of fluorescence from only a desired red wavelength conversion material and no change in the intensity of fluorescence from the green wavelength conversion material. It is thus possible to completely reduce the fluorescence intensity (to reduce the fluorescence intensity to zero). In the blue pixel portion 17 and the green pixel portion 19, it is also possible to eliminate a reduction in color purity due to light emitted from the wavelength conversion layer 20 in the wavelength conversion layer 20.

The photobleaching method in this embodiment is a method for reducing the intensity of fluorescence from the wavelength conversion layers 20, 26, and 27 (absorption intensity of excitation light) by irradiating the wavelength conversion materials contained in the wavelength conversion layers 20, 26, and 27 with high-energy light (electromagnetic waves), such as ultraviolet radiation, in a wavelength region absorbed by the wavelength conversion layers 20, 26, and 27 using a photomask to cause partial modification of the wavelength conversion layers 20, 26, and 27.

The modification of the wavelength conversion material includes the decomposition and the oxidation of a color conversion dye, and any other aspect in which the intensity of light emitted from the wavelength conversion material is reduced (a reduction in the transmittance of excitation light) (the formation of association). In particular, in this embodiment, the modification indicates that the fluorescence intensity is reduced by the excitation light from the organic EL section 15 and that the transmittance of the excitation light at the peak wavelength of emission from the organic EL section 15 is reduced.

As a light source used to modify the wavelength conversion material, a lamp, for example, a high-pressure UV lamp, an ultra-high-pressure UV lamp, a low-pressure UV lamp, a deep UV lamp, a metal halide lamp, an excimer lamp, a xenon lamp, or a halogen lamp, is commonly used.

The wavelength of the light source is not particularly limited as long as it may be equal to the absorption wavelength of the wavelength conversion material. It is preferred that the light source has a wavelength range in which the wavelength conversion material can be partially or completely modified.

The luminance of the light source is not particularly limited. Higher luminance is better in order to shorten the process time. When the color filter, the organic EL section, and so forth are disposed between the wavelength conversion layer and the substrate during exposure, not-so-high irradiation intensity is better in order to prevent the degradation of the color filter and the organic EL section. The irradiation intensity is preferably about 10 to about 100 mW/cm$^2$.

The case where the wavelength conversion layers 20, 26, and 27 are irradiated with high-energy light using the photomask to partially modify the color conversion dye has been described as a method for partially modifying the wavelength conversion layers 20, 26, and 27. In this embodiment, however, another method may be employed. Examples of a method for partially modifying the wavelength conversion layers 20, 26, and 27 include methods for irradiating the entire surfaces of the wavelength conversion layers 20, 26, and 27 with electromagnetic waves at different irradiation intensity levels (for example, a method in which exposure is performed with electromagnetic waves through a filter having portions with different transmittance levels like a black-and-white negative film, a method in which scanning is performed while the irradiation intensity of light emitted from a small light source is changed, and a method in which partial irradiation with electromagnetic waves is performed using masking). In the case where the wavelength conversion layers 20, 26, and 27 are partially exposed, for example, contact exposure with a photomask and projection exposure (for example, a method in which partial exposure is performed with light concentrated by a lens or light emitted from a small light source, or these methods in combination with photomasks) may be performed.

In this embodiment, the wavelength conversion layer 20 may be formed in at least the red pixel portion 21. It is thus possible to form the wavelength conversion layer 20 in one transfer. This overcomes the problems of high cost and low productivity due to patterning (transfer) of red, green, and blue in three steps, which are conventional problems upon forming a color filter and an organic EL.

The wavelength conversion layers 20, 26, and 27 may be patterned by a photolithography method with a photosensitive resin serving as the polymer resin.

Here, as the photosensitive resin, reactive vinyl group-containing photosensitive resins (photocurable resist materials), such as acrylic acid-based resins, methacrylic acid-based resins, polyvinyl cinnamate-based resins, and hard rubber-based resins, may be used separately or in combination as a mixture of a plurality of types thereof.

The phosphor material may also be directly patterned by a wet process, for example, an ink-jet method, a letterpress printing method, an intaglio printing method, or a screen printing method, a known dry process, for example, a resistance heating evaporation method with a shadow mask, an electron beam (EB) deposition method, a molecular beam epitaxy (MBE) method, a sputtering method, or an organic vapor phase deposition (OVPD) method, or by a laser transfer method.

The blue color filter 16 is disposed between the first substrate 11 and the wavelength conversion layer 26.

The green color filter 18 is disposed between the first substrate 11 and the wavelength conversion layer 27. The red color filter 28 is disposed between the first substrate 11 and the wavelength conversion layer 20.

As the blue color filter 16, the green color filter 18, and the red color filter 28, known color filters may be used. Here, the arrangement of the color filters increases the color purities of the red pixel portion 21, the green pixel portion 19, and the blue pixel portion 17, thus extending the color reproduction range of the organic EL display device 10.

The blue color filter 16 on the wavelength conversion layer (blue wavelength conversion layer) 26, the green color filter 18 on the wavelength conversion layer (green wavelength conversion layer) 27, the red color filter 28 on the wavelength conversion layer (red wavelength conversion layer) 20 absorb excitation light components of extraneous light which excite the respective wavelength conversion materials. This reduces or prevents the emission of light from the wavelength conversion layers 20, 26, and 27 due to extraneous light, thereby reducing or preventing a reduction in the contrast of display of the organic EL display device 10. Furthermore, the blue color filter 16, the green color filter 18, and the red color filter 28 prevent excitation light which is not absorbed by the wavelength conversion layers 20, 26, and 27 and which passes through the wavelength conversion layers 20, 26, and 27 from leaking to the outside. This prevents a reduction in the color purity of light due to the color mixture of light emitted from the wavelength conversion layers 20, 26, and 27 and the excitation light.

The light absorption layers (low reflection layers) 29 are disposed, on the first substrate 11 side, between the blue color filter 16 and the green color filter 18, between the green color filter 18 and the red color filter 28, and between the red color filter 28 and the blue color filter 16. The light absorption layers 29 prevent the color mixture of light beams emitted from the pixel portions, thereby improving the contrast of display of the organic EL display device 10.

The light absorption layers 29 usually has a thickness of about 100 nm to about 100 μm and preferably 100 nm to 10 μm. To allow light emitted toward side faces of the wavelength conversion layers 20, 26, and 27 to be output to the outside, the thickness of each of the light absorption layers 29 is preferably smaller than that of a corresponding one of the wavelength conversion layers 20, 26, and 27.

The low-refractive-index layer 30 is disposed between the blue color filter 16 and the wavelength conversion layer 26, between the green color filter 18 and the wavelength conversion layer 27, and between the red color filter 28 and the wavelength conversion layer 20. The low-refractive-index layer 30 has a lower refractive index than the first substrate 11.

This reduces a loss of light emission due to the fact that light emitted from the wavelength conversion layers 20, 26, and 27 propagates through the first substrate 11 to the side faces of the first substrate 11. That is, a difference in refractive index between the low-refractive-index layer 30 and the first substrate 11 is used. Light which is incident at a critical angle or greater and which is not output from the first substrate 11 to an air layer (outside) is reflected owing to a difference in refractive index between the low-refractive-index layer 30 and the wavelength conversion layers 20, 26, and 27 and then reflected again from the translucent electrode (second electrode 13) or the reflective electrode (first electrode 12) in the organic EL section 15. The reflected light is emitted toward the first substrate 11, thereby reducing a loss of light propagating through the first substrate 11, reducing the power consumption of the organic EL display device 10, and improving the luminance.

The low-refractive-index layer 30 having a lower refractive index than the first substrate 11 and the organic EL section 15 is preferably disposed between the first substrate 11 and the organic EL section 15 or between the organic EL section 15 and the blue color filter 16, the green color filter 18, and the red color filter 28.

This reduces a loss of light emission due to the fact that light emitted from the organic EL section 15 propagates through the first substrate 11 to the side faces of the first substrate 11. This reduces the power consumption of the organic EL display device 10 and improves the luminance.

A material that may be used for the low-refractive-index layer 30 is not particularly limited. The low-refractive-index layer 30 may be formed of a film composed of, for example, a fluorocarbon resin, such as poly(1,1,1,3,3,3-hexafluoroisopropyl acrylate) (n=1.375), poly(2,2,3,3,4,4,4-heptafluorobutyl methacrylate) (n=1.383), poly(2,2,3,3,3-pentafluoropropyl methacrylate) (n=1.395), or poly(2,2,2-trifluoroethyl methacrylate) (n=1.418), mesoporous silica (n=1.2), or aerogel (n=1.05). Alternatively, the low-refractive-index layer 30 may be formed of a gas, for example, dry air or nitrogen, in a gap between the first substrate 11 and the organic EL section 15 or a gas between the organic EL section 15 and the blue color filter 16, the green color filter 18, and the red color filter 28. Furthermore, the low-refractive-index layer 30 may be formed of the space that is in a reduced pressure state.

The first substrate 11 including the blue color filter 16, the green color filter 18, the red color filter 28, the wavelength conversion layers 20, 26, and 27, the organic EL section 15, and so forth may be bonded to the second substrate 23 by a known sealing method with a known sealing material.

Specifically, a resin is applied to the first substrate 11 including the blue color filter 16, the green color filter 18, the red color filter 28, the wavelength conversion layers 20, 26, and 27, the organic EL section 15, and so forth by, for example, a spin coating method, ODF, or a lamination method to form the sealing film 24 configured to seal the blue color filter 16, the green color filter 18, the red color filter 28, the wavelength conversion layers 20, 26, and 27, the organic EL section 15, and so forth. An adhesive is then applied to the entire surface of the first substrate 11 by, for example, a spin coating method, ODF, or a lamination method so as to cover the sealing film 24, thereby forming the adhesive layer 25. The first substrate 11 is bonded to the sealing film 24 with the adhesive layer 25.

The sealing film 24 may be formed as follow: An inorganic film composed of, for example, SiO, SiON, or SiN is formed by, for example, a plasma-enhanced CVD method, an ion plating method, an ion beam method, or a sputtering method so as to cover the blue color filter 16, the green color filter 18, the red color filter 28, the wavelength conversion layers 20, 26, and 27, the organic EL section 15, and so forth on the first substrate 11. Then a resin is applied by, for example, a spin coating method, ODF, or a lamination method so as to cover the inorganic film. Alternatively, a resin film is bonded so as to cover the inorganic film.

The sealing film 24 prevents the contamination of the organic EL section 15 with oxygen or water from the outside, thus leading to improvement in the lifetime of the organic EL display device 10.

Examples of an adhesive agent used for the adhesive layer 25 include ultraviolet curable resins and thermosetting resins.

An ultraviolet curable resin, a thermosetting resin, or the like may be applied to peripheries of the first substrate 11 and the second substrate 23. Then the first substrate 11 may be bonded to the second substrate 23. Subsequently, a gap between these substrates may be filled with an inert gas, for example, nitrogen gas or argon gas.

The polarizer 38 is preferably disposed on the substrate (first substrate 11) located on the light-output side.

A combination of a known linear polarizer and a λ/4 plate is preferably used as the polarizer 38.

The arrangement of the polarizer 38 improves the contrast of display of the organic EL display device 10.

(2) Second Embodiment

Figure 2:
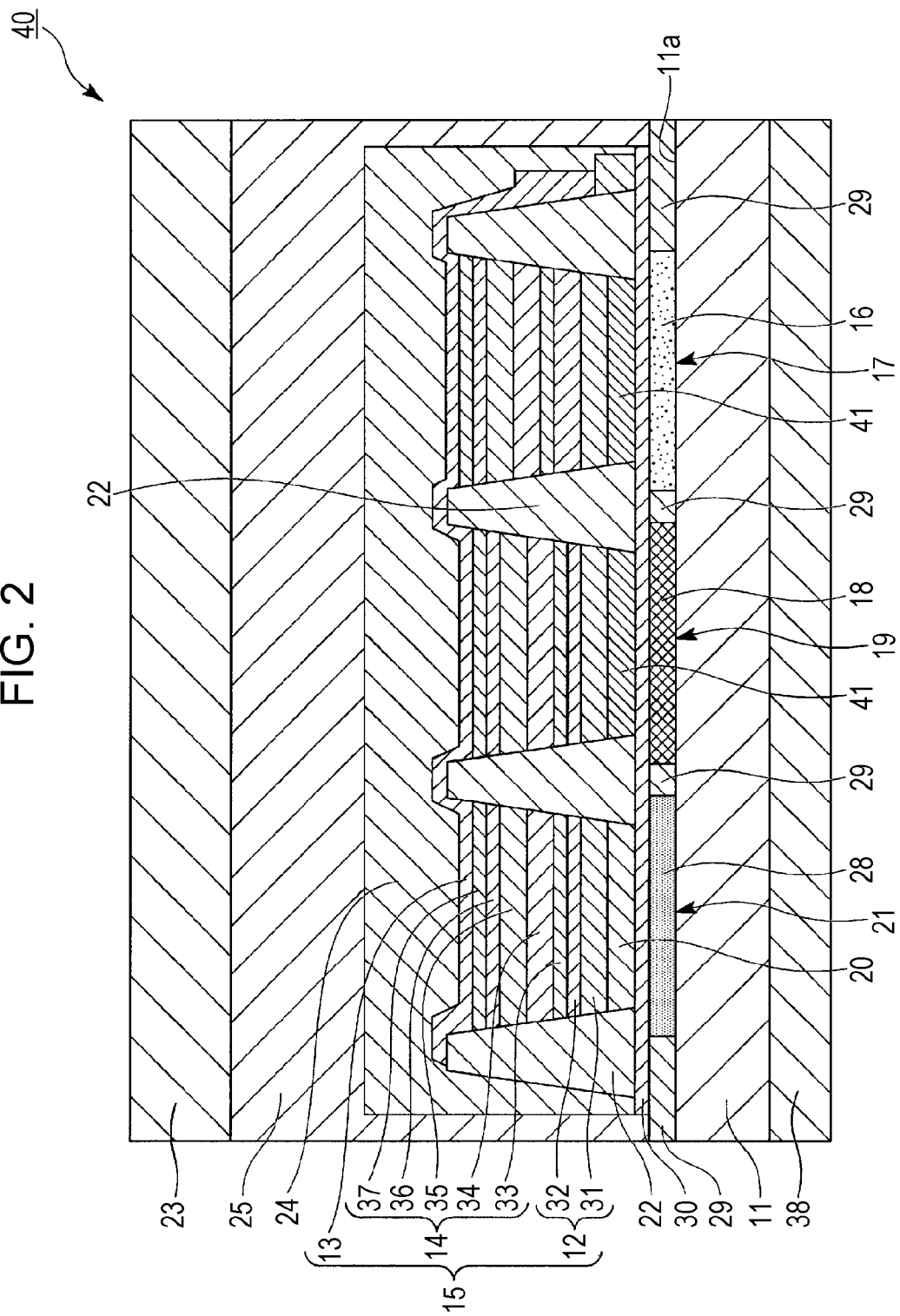
FIG. 2 is a schematic cross-sectional view of an organic EL display device according to a second embodiment.

FIG. 2 is a schematic cross-sectional view of an organic EL display device according to a second embodiment. In FIG. 2, the same elements as those in the organic EL display device 10 illustrated in FIG. 1 are designated using the same reference numerals, and descriptions are not redundantly repeated.

An organic EL display device 40 according to this embodiment differs from the organic EL display device 10 according to the first embodiment in that a light-scattering layer 41 is disposed in the blue pixel portion 17 in place of the wavelength conversion layer 26 and that another light-scattering layer 41 is disposed in the green pixel portion 19 in place of the wavelength conversion layer 27.

The organic EL display device 40 includes pixel portions having different light distributions: the blue pixel portion 17 and the green pixel portion 19 that directly use anisotropic light emitted from the organic EL section 15 having a microcavity structure; and the red pixel portion 21 that uses light emitted from the wavelength conversion layer 20. To match the distribution of light emitted from the organic EL section 15 with the distribution of light emitted from the wavelength conversion layer 20 and to reduce changes in luminance and color due to a difference in light distribution at different viewing angles, the light-scattering layers 41 are disposed in the blue pixel portion 17 and the green pixel portion 19.

As a material for the light-scattering layers 41, a material in which light-scattering particles are dispersed in a resin is preferably used. The light-scattering particles are composed of an organic material or an inorganic material and are preferably composed of an inorganic material.

Thus, directional light from the outside (for example, a light-emitting device) can be diffused or scattered more isotropically and effectively. By the use of the inorganic material, the light-scattering layers 41 stable to light and heat can be provided. The light-scattering particles preferably have high transparency. As the light-scattering particles, fine particles are preferably dispersed in a matrix with a low refractive index, the fine particles having a higher refractive index than the matrix.

To effectively scatter light in the blue wavelength region by the light-scattering layers 41, the light-scattering particles need to have a particle size in the Mie scattering region. Thus, the light-scattering particles preferably have a particle size of about 100 nm to about 500 nm.

In the case where the light-scattering particles are composed of an inorganic material, examples of the inorganic material include particles (fine particles) mainly composed of an oxide of at least one metal selected from the group consisting of silicon, titanium, zirconium, aluminum, indium, zinc, tin, and antimony.

In the case where particles composed of an inorganic material (fine inorganic particles) are used as the light-scattering particles, examples of the inorganic material include silica beads (refractive index: 1.44), alumina beads (refractive index: 1.63), titanium beads (refractive index, anatase: 2.50, rutile: 2.70), zirconium oxide beads (refractive index: 2.05), zinc oxide beads (refractive index: 2.00), and barium titanate ($BaTiO_3$) (refractive index: 2.4).

In the case where particles composed of an organic material (fine organic particles) are used as the light-scattering particles, examples of the light-scattering particles include polymethyl methacrylate beads (refractive index: 1.49), acrylic beads (refractive index: 1.50), acrylic-styrene copolymer beads (refractive index: 1.54), melamine beads (refractive index: 1.57), high-refractive index melamine beads (refractive index: 1.65), polycarbonate beads (refractive index: 1.57), styrene beads (refractive index: 1.60), cross-linked polystyrene beads (refractive index: 1.61), polyvinyl chloride beads (refractive index: 1.60), benzoguanamine-melamine formaldehyde beads (refractive index: 1.68), and silicone beads (refractive index: 1.50).

As a resin material used as a mixture with the light-scattering particles, a transparent resin material is preferred. Examples of the resin material include an acrylic resin (refractive index: 1.49), a melamine resin (refractive index: 1.57), nylon (refractive index: 1.53), polystyrene (refractive index: 1.60), melamine beads (refractive index: 1.57), polycarbonate (refractive index: 1.57), polyvinyl chloride (refractive index: 1.60), polyvinylidene chloride (refractive index: 1.61), polyvinyl acetate (refractive index: 1.46), polyethylene (refractive index: 1.53), polymethyl methacrylate (refractive index: 1.49), polyMBS (refractive index: 1.54), medium-density polyethylene (refractive index: 1.53), high-density polyethylene (refractive index: 1.54), tetrafluoroethylene (refractive index: 1.35), poly(trifluorochloroethylene) (refractive index: 1.42), and polytetrafluoroethylene (refractive index: 1.35).

(3) Third Embodiment

Figure 3:
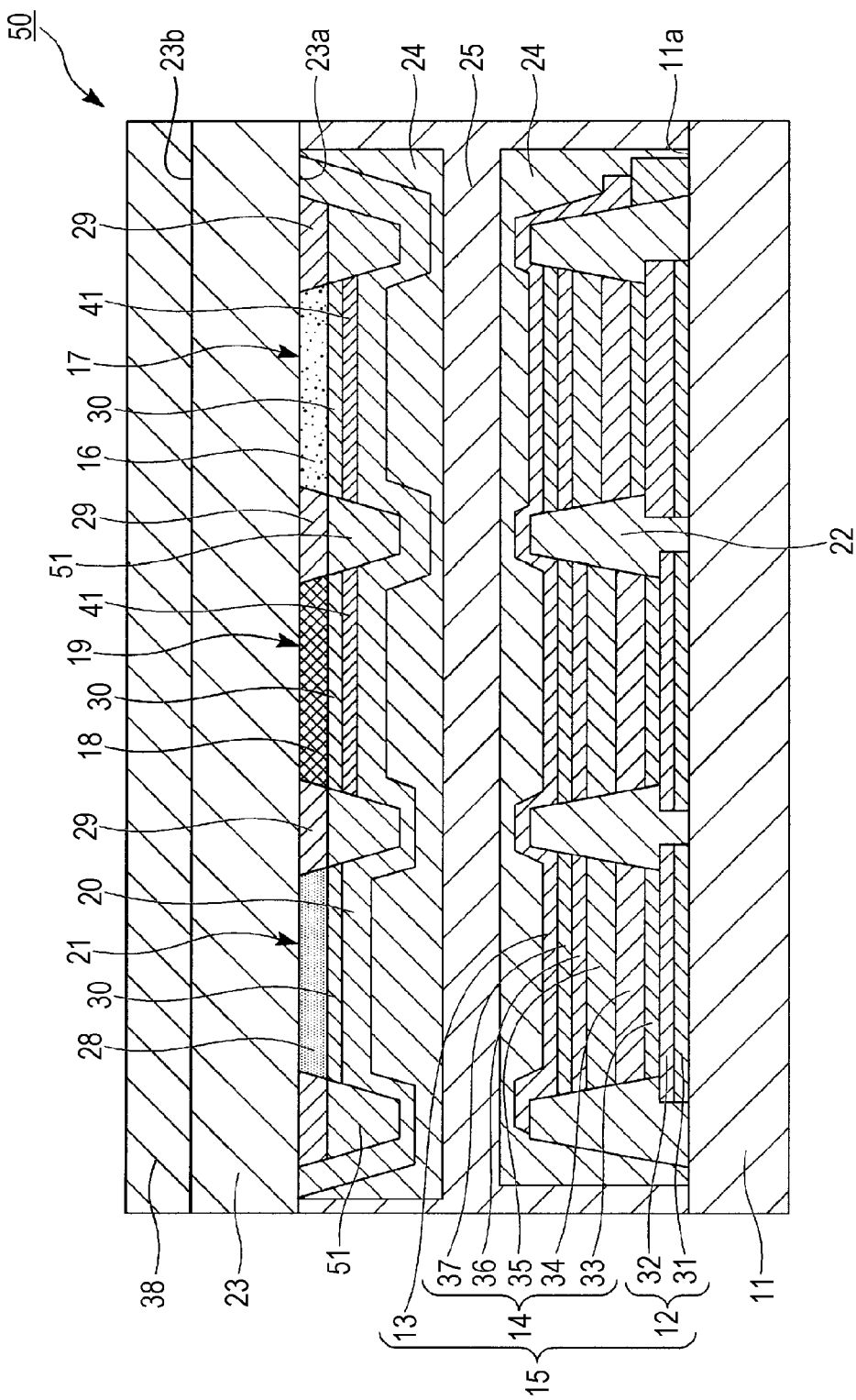
FIG. 3 is a schematic cross-sectional view of an organic EL display device according to a third embodiment.

FIG. 3 is a schematic cross-sectional view of an organic EL display device according to a third embodiment. In FIG. 3, the same elements as those in the organic EL display device 10 illustrated in FIG. 1 and the organic EL display device 40 illustrated in FIG. 2 are designated using the same reference numerals, and descriptions are not redundantly repeated.

An organic EL display device 50 includes the first substrate 11; the organic EL section 15 disposed on the first surface 11a of the first substrate 11, the organic EL section 15 including the organic layer 14 held between the first electrode 12 and the second electrode 13; the second substrate 23 disposed opposite the first substrate 11 with the adhesive layer 25; the blue pixel portion 17 including the blue color filter 16, the green pixel portion 19 including the green color filter 18, and the red pixel portion 21 including the wavelength conversion layer 20 that contains a wavelength conversion material, which are disposed on a first surface 23a of the second substrate 23; the edge cover 22 disposed on the first surface 11a of the first substrate 11, the edge cover 22 being configured to surround side faces of portions of the organic EL section 15 to define pixels; and a bank 51 disposed on the first surface 23a of the second substrate 23, the bank 51 being configured to surround side faces of each of the blue color filter 16, the green color filter 18, and the red color filter 28 to separate the pixels.

The sealing film 24 is disposed to seal the organic EL section 15 on the first surface 11a of the first substrate 11.

To seal the blue color filter 16, the green color filter 18, and the red color filter 28 on the first surface 23a of the second substrate 23, the sealing film 24 is disposed so as to cover the wavelength conversion layer 20.

The sealing film 24 disposed on the first substrate 11 side is located opposite the sealing film 24 disposed on the second substrate 23 side. The first substrate 11 is bonded to the second substrate 23 with the adhesive layer 25 that covers the sealing film 24.

The wavelength conversion layer 20 which is formed of a continuous film and which extends across the display region of the organic EL display device 50 is disposed adjacent to the first surface 23a of the second substrate 23 so as to cover the blue color filter 16, the green color filter 18, and the red color filter 28.

The light absorption layers (low reflection layers) 29 are disposed between the blue color filter 16 and the green color filter 18, between the green color filter 18 and the red color filter 28, and between the red color filter 28 and the blue color filter 16.

The low-refractive-index layers 30 having a lower refractive index than the second substrate 23 are disposed between the blue color filter 16 and the wavelength conversion layer 20, between the green color filter 18 and the wavelength conversion layer 20, and between the red color filter 28 and the wavelength conversion layer 20.

The polarizer 38 is stacked on a second surface 23b of the second substrate 23.

The light-scattering layers 41 are disposed between the wavelength conversion layer 20 and the low-refractive-index layer 30 on the blue color filter 16 in the blue pixel portion 17 and between the wavelength conversion layer 20 and the low-refractive-index layer 30 on the green color filter 18 in the green pixel portion 19.

The bank 51 configured to surround the side faces of the blue color filter 16, the green color filter 18, and the red color filter 28 to separate the pixels is disposed on the first surface 23a of the second substrate 23. This prevents a light component in isotropic light emitted from the wavelength conversion layer 20 from propagating in the direction of a side face of the wavelength conversion layer 20 (a propagation component through the wavelength conversion layer 20) and prevents a reduction in color purity due to leakage of light to a pixel other than a desired pixel. Light emitted from the wavelength conversion layer 20 is reflected from the bank 51 to return to the inside the pixel. That is, the light emitted from the wavelength conversion layer 20 can be effectively used, thus reducing the power consumption of the organic EL display device 10.

A material for the bank 51 is not particularly limited. The same material as that for the edge cover 22 may be used. Unlike the edge cover 22, the bank 51 does not need to be insulated. Thus, a reflective film composed of a metal or the like may also be used.

The sealing film 24 adjacent to the first surface 23a of the second substrate 23 is disposed to cover the wavelength conversion layer 20. A surface of the wavelength conversion layer 20 opposite to the first substrate 11 is preferably planarized with the sealing film 24. This improves adhesion and adhesive strength between the first substrate 11 including the organic EL section 15 and the second substrate 23 including the wavelength conversion layer 20.

(4) Fourth Embodiment

Figure 4:
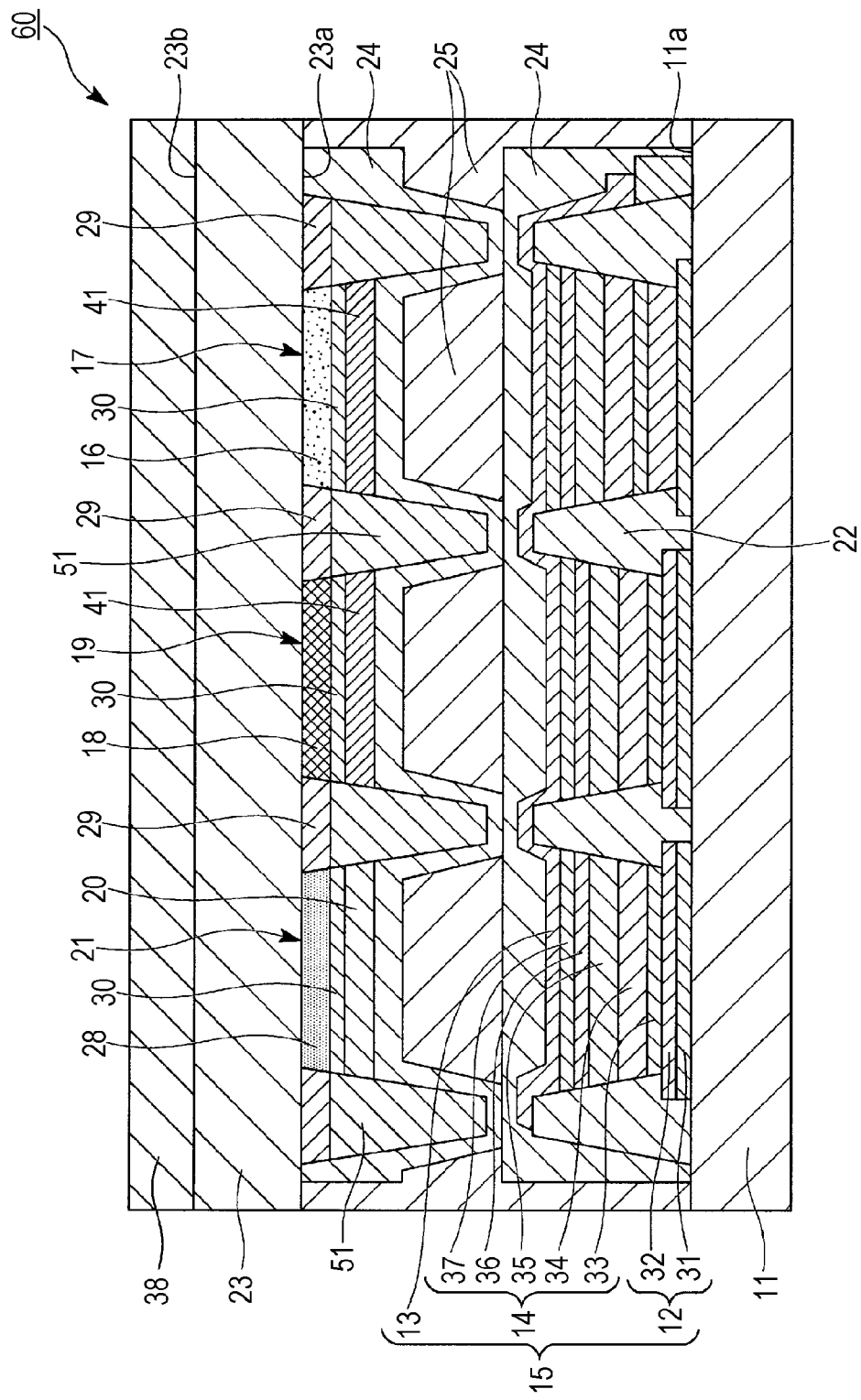
FIG. 4 is a schematic cross-sectional view of an organic EL display device according to a fourth embodiment.

FIG. 4 is a schematic cross-sectional view of an organic EL display device according to a fourth embodiment. In FIG. 4, the same elements as those in the organic EL display device 50 illustrated in FIG. 3 are designated using the same reference numerals, and descriptions are not redundantly repeated.

An organic EL display device 60 differs from the organic EL display device 50 according to the third embodiment in the following respects: the wavelength conversion layer 20 is disposed in the red pixel portion 21, the light-scattering layer 41 is disposed in the blue pixel portion 17 in place of the wavelength conversion layer 20, another light-scattering layer 41 is disposed in the green pixel portion 19 in place of the wavelength conversion layer 20, in which this structure is similar to the organic EL display device 40 according to the second embodiment, and the first substrate 11 is bonded to the second substrate 23 with the adhesive layer 25 in such a manner that portions of the sealing film 24 which is configured to seal the blue color filter 16, the green color filter 18, and the red color filter 28 on the first surface 23*a* of the second substrate 23 and which covers the bank 51 are in contact with the sealing film 24 configured to seal the organic EL section 15 on the first surface 11*a* of the first substrate 11.

(5) Fifth Embodiment

Figure 5:
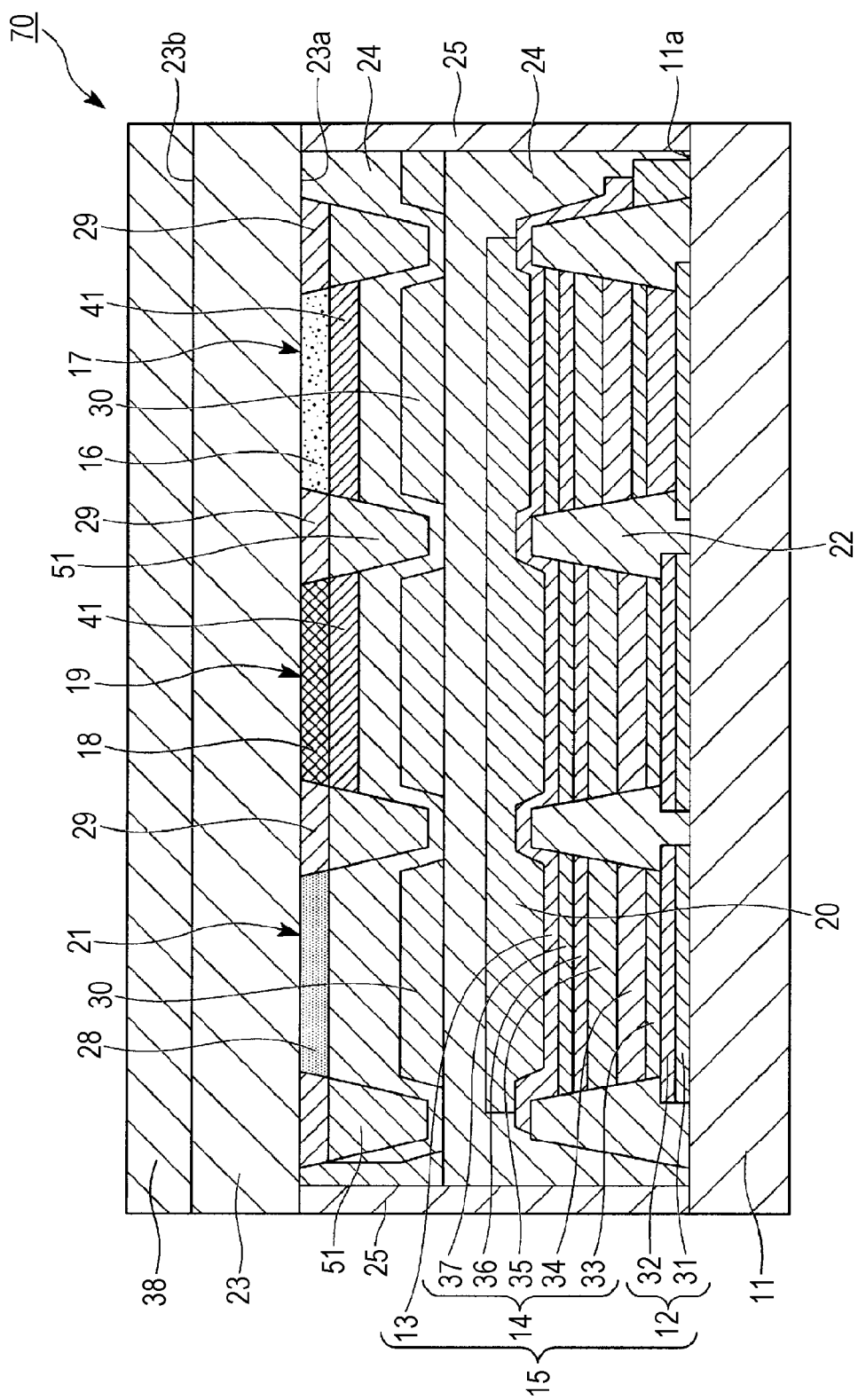
FIG. 5 is a schematic cross-sectional view of an organic EL display device according to a fifth embodiment.

FIG. 5 is a schematic cross-sectional view of an organic EL display device according to a fifth embodiment. In FIG. 5, the same elements as those in the organic EL display device 50 illustrated in FIG. 3 are designated using the same reference numerals, and descriptions are not redundantly repeated.

An organic EL display device 70 according to this embodiment differs from the organic EL display device 50 according to the third embodiment in the following respects: the wavelength conversion layer 20 is disposed on the second electrode 13 in the organic EL section 15 provided on the first surface 11*a* of the first substrate 11 and is located opposite the blue color filter 16, the green color filter 18, and the red color filter 28 on the first surface 23*a* of the second substrate 23, the light-scattering layers 41 are disposed on the blue color filter 16 and the green color filter 18, the low-refractive-index layers 30 are disposed on the first surface 23*a* of the second substrate 23 and located at positions opposite to the blue color filter 16, the green color filter 18, and the red color filter 28, and the first substrate 11 is bonded to the second substrate 23 with the adhesive layer 25 in such a manner that portions of the sealing film 24 which is disposed on the first surface 23*a* of the second substrate 23 and which covers the bank 51 are in contact with the sealing film 24 configured to seal the organic EL section 15.

(6) Sixth Embodiment

Figure 6:
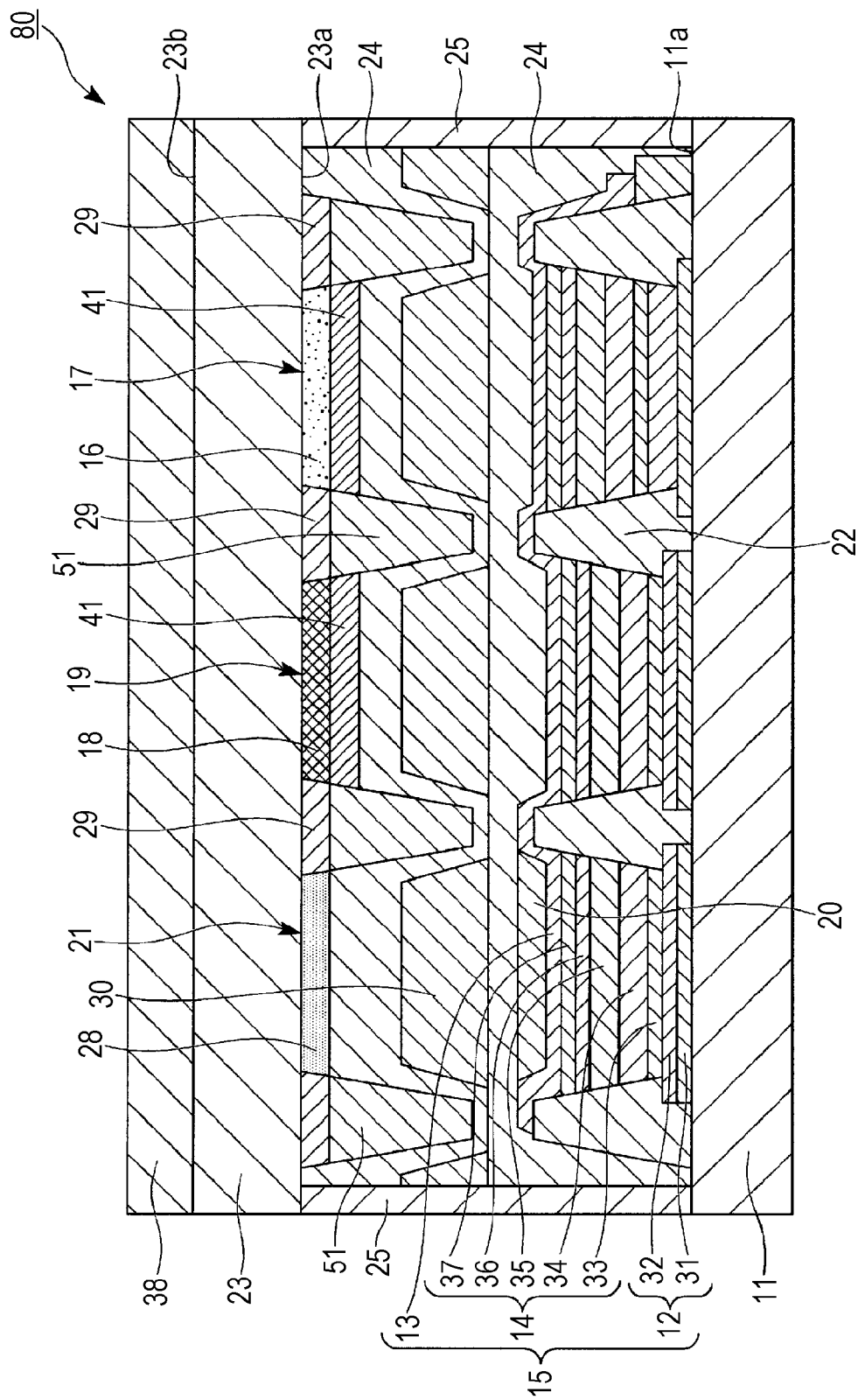
FIG. 6 is a schematic cross-sectional view of an organic EL display device according to a sixth embodiment.

FIG. 6 is a schematic cross-sectional view of an organic EL display device according to a sixth embodiment. In FIG. 6, the same elements as those in the organic EL display device 50 illustrated in FIG. 3 are designated using the same reference numerals, and descriptions are not redundantly repeated.

An organic EL display device 80 according to this embodiment differs from the organic EL display device 50 according to the third embodiment in the following respects: the wavelength conversion layer 20 is disposed on the second electrode 13 in the organic EL section 15 disposed on the first surface 11*a* of the first substrate 11 and is located at only a position opposite to the red color filter 28 on the first surface 23*a* of the second substrate 23, the light-scattering layers 41 are disposed on the organic EL section 15 and the green color filter 18, the low-refractive-index layers 30 are disposed on the sealing film 24 disposed on the first surface 23*a* of the second substrate 23 and located at positions opposite to the blue color filter 16, the green color filter 18, and the red color filter 28, and the first substrate 11 is bonded to the second substrate 23 with the adhesive layer 25 in such a manner that portions of the sealing film 24 which is disposed on the first surface 23*a* of the second substrate 23 and which covers the bank 51 are in contact with the sealing film 24 configured to seal the organic EL section 15.

(7) Seventh Embodiment

Figure 7:
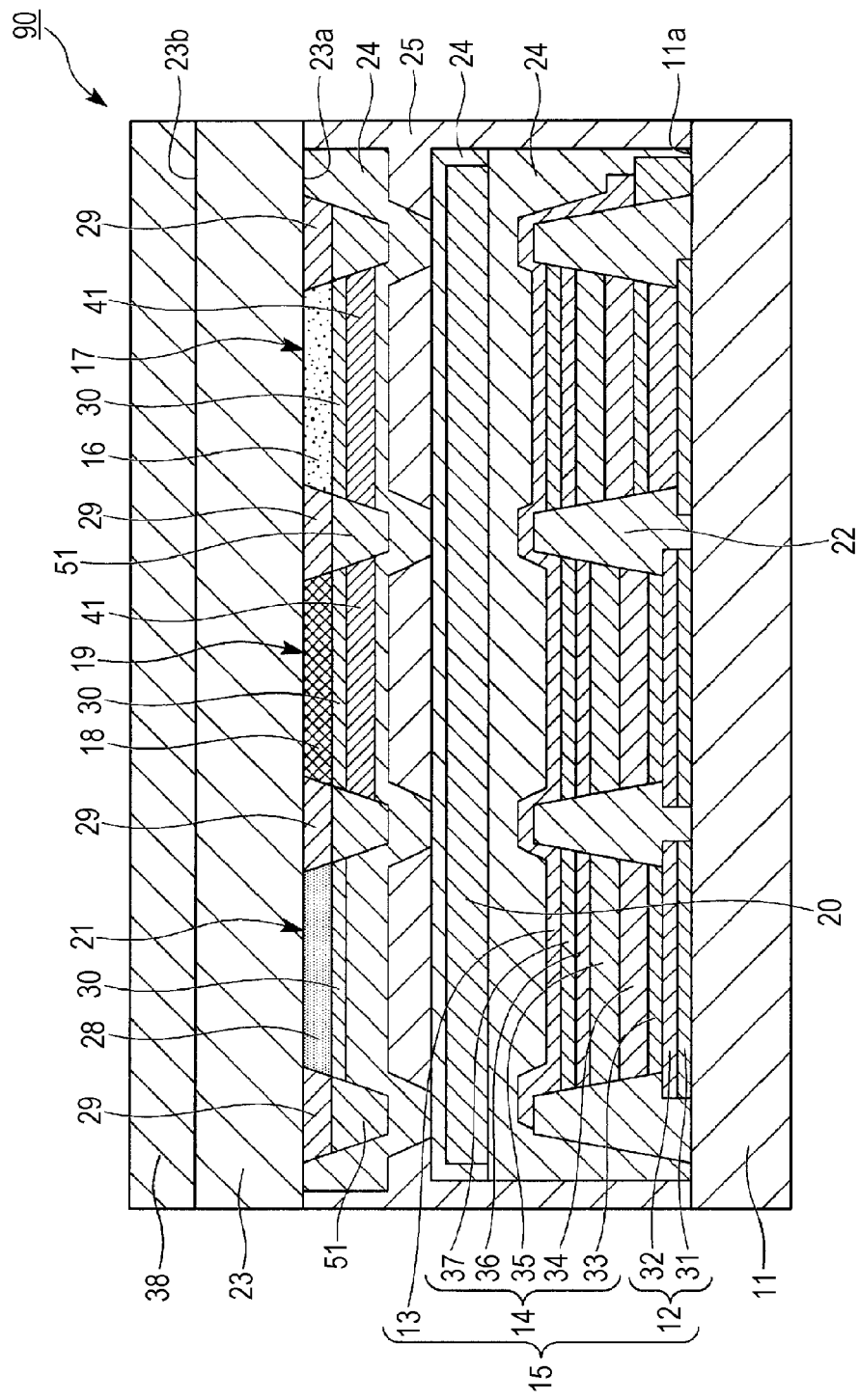
FIG. 7 is a schematic cross-sectional view of an organic EL display device according to a seventh embodiment.

FIG. 7 is a schematic cross-sectional view of an organic EL display device according to a seventh embodiment. In FIG. 7, the same elements as those in the organic EL display device 50 illustrated in FIG. 3 are designated using the same reference numerals, and descriptions are not redundantly repeated.

An organic EL display device 90 according to this embodiment differs from the organic EL display device 50 according to the third embodiment in the following respects: the wavelength conversion layer 20 is disposed on the sealing film 24 configured to seal the organic EL section 15 on the first surface 11*a* of the first substrate 11 and is located opposite the blue color filter 16, the green color filter 18, and the red color filter 28 on the first surface 23*a* of the second substrate 23, another sealing film 24 is disposed so as to cover the wavelength conversion layer 20, the light-scattering layers 41 are disposed on the blue color filter 16 and the green color filter 18, and the first substrate 11 is bonded to the second substrate 23 with the adhesive layer 25 in such a manner that portions of the sealing film 24 which is disposed on the first surface 23*a* of the second substrate 23 and which covers the bank 51 are in contact with the sealing film 24 configured to seal the wavelength conversion layer 20.

(8) Eighth Embodiment

Figure 8:
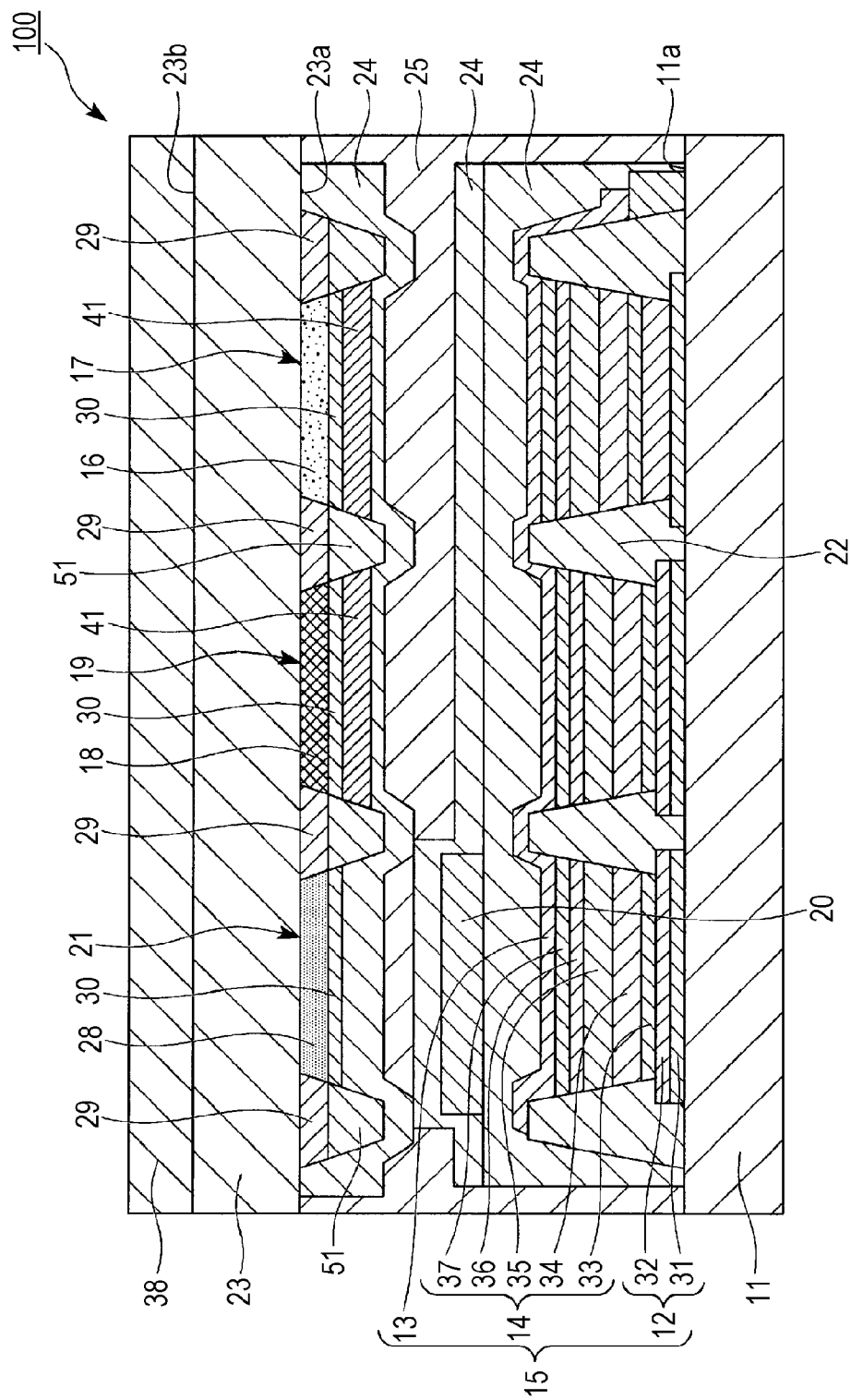
FIG. 8 is a schematic cross-sectional view of an organic EL display device according to an eighth embodiment.

FIG. 8 is a schematic cross-sectional view of an organic EL display device according to an eighth embodiment. In FIG. 8, the same elements as those in the organic EL display device 50 illustrated in FIG. 3 are designated using the same reference numerals, and descriptions are not redundantly repeated.

An organic EL display device 100 according to this embodiment differs from the organic EL display device 50 according to the third embodiment in the following respects: the wavelength conversion layer 20 is disposed on the sealing film 24 configured to seal the organic EL section 15 on the first surface 11*a* of the first substrate 11 and is located at only a position opposite to the red color filter 28 on the first surface 23*a* of the second substrate 23, another sealing film 24 is disposed so as to cover the wavelength conversion layer 20, the light-scattering layers 41 are disposed on the blue color filter 16 and the green color filter 18, and the first substrate 11 is bonded to the second substrate 23 with the adhesive layer 25 in such a manner that portions of the sealing film 24 which is disposed on the first surface 23*a* of the second substrate 23 and which covers the bank 51 are in contact with the sealing film 24 configured to seal the wavelength conversion layer 20.

(9) Ninth Embodiment

Figure 9:
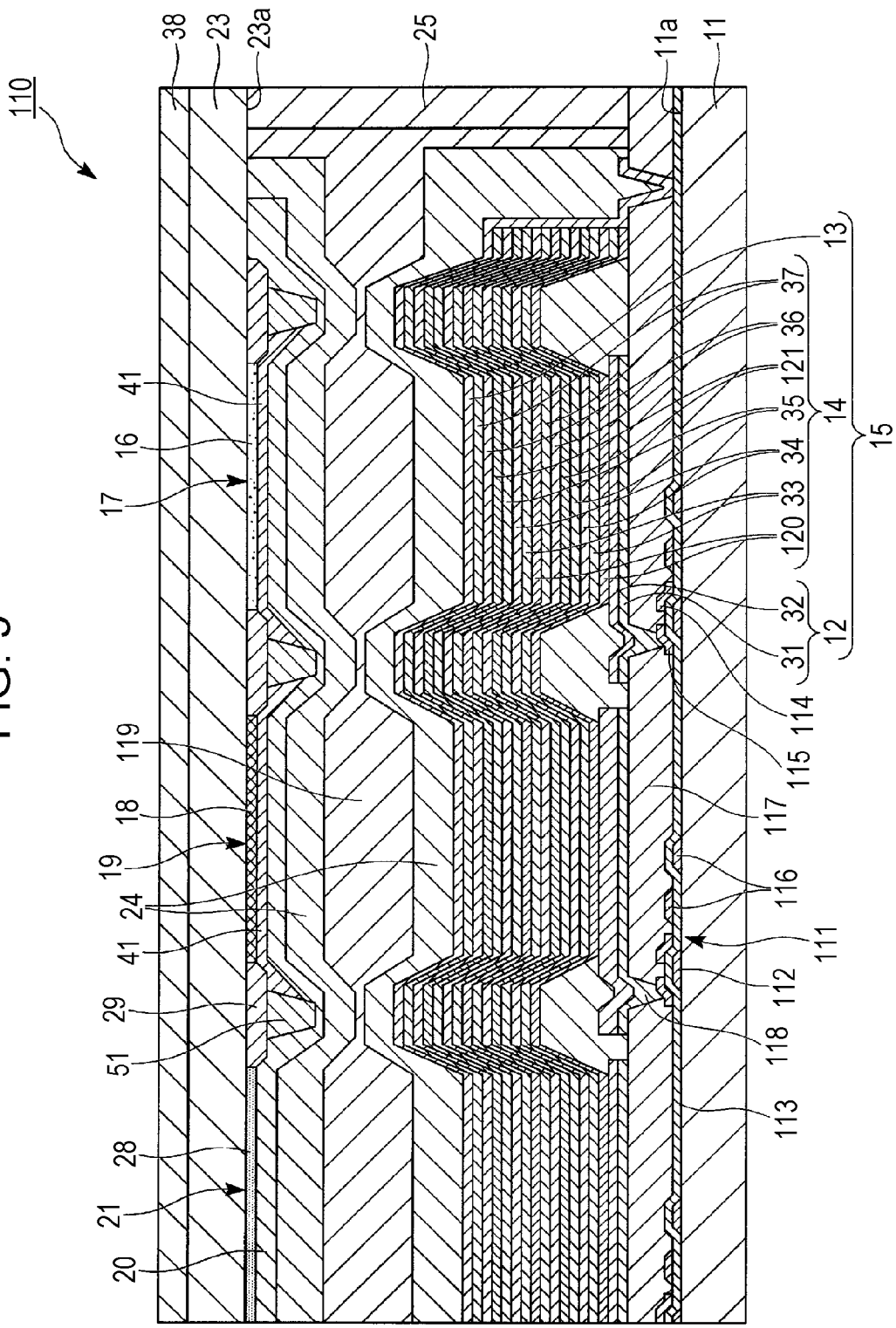
FIG. 9 is a schematic cross-sectional view of an organic EL display device according to a ninth embodiment.

FIG. 9 is a schematic cross-sectional view of an organic EL display device according to a ninth embodiment. In FIG. 9, the same elements as those in the organic EL display device 50 illustrated in FIG. 3 are designated using the same reference numerals, and descriptions are not redundantly repeated.

An organic EL display device 110 according to this embodiment differs from the organic EL display device 50 according to the third embodiment in that TFTs (active elements) 111 are provided on the first surface 11a of the first substrate 11. Specifically, gate electrodes 112 are provided on the first surface 11a of the first substrate 11. A gate insulting film 113 is provided on the first surface 11a of the first substrate 11 so as to cover the gate electrodes 112. Active layers (not illustrated) are provided on the gate insulting film 113. Source electrodes 114, drain electrodes 115, and lines 116 are provided on the active layers. A planarizing film 117 is provided so as to cover the source electrodes 114, the drain electrodes 115, and the lines 116. The planarizing film 117 may not have a single-layer structure and may have the structure of a combination of another interlayer insulating film and a planarizing film. Contact holes 118 are provided through the planarizing film or the interlayer insulating film to communicate with the drain electrodes 115. The first electrode 12 in the organic EL section 15 is provided on the planarizing film 117 and electrically connected to the drain electrodes 115 through the contact holes 118.

Furthermore, the organic EL display device 110 according to this embodiment differs from the organic EL display device 50 according to the third embodiment in the following respects: the low-refractive-index layer is not disposed between the blue color filter 16 and the wavelength conversion layer 20 or between the green color filter 18 and the wavelength conversion layer 20, a gap between the sealing film 24 provided on the first substrate 11 side and the sealing film 24 provided on the second substrate 23 side is filled with a filler 119, and the first substrate 11 is bonded to the second substrate 23 with the adhesive layer 25 via the filler 119.

In addition, the organic EL display device 110 according to this embodiment differs from the organic EL display device 50 according to the third embodiment in that the organic layer 14 in the organic EL section 15 includes an insulating layer 120, the hole injection layer 33, the hole transport layer 34, the organic light-emitting layer 35, a hole blocking layer 121, the electron transport layer 36, the electron injection layer 37, the insulating layer 120, the hole injection layer 33, the hole transport layer 34, the organic light-emitting layer 35, the hole blocking layer 121, the electron transport layer 36, and the electron injection layer 37 arranged, in that order, from the first substrate 11 side.

(10) Tenth Embodiment

Figure 10:
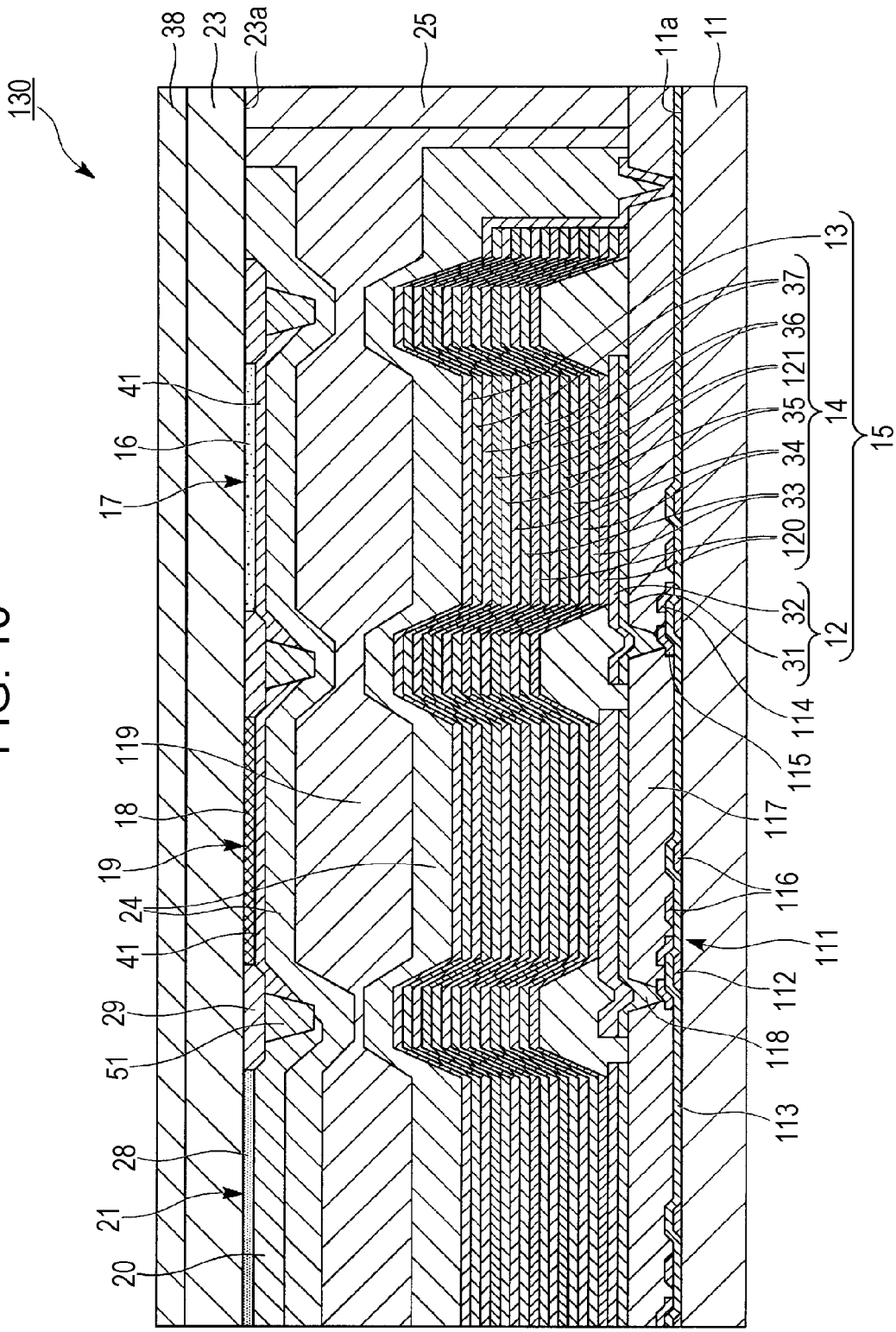
FIG. 10 is a schematic cross-sectional view of an organic EL display device according to a tenth embodiment.

FIG. 10 is a schematic cross-sectional view of an organic EL display device according to a tenth embodiment. In FIG. 10, the same elements as those in the organic EL display device 50 illustrated in FIG. 3 and the organic EL display device 110 illustrated in FIG. 9 are designated using the same reference numerals, and descriptions are not redundantly repeated.

An organic EL display device 130 according to this embodiment differs from the organic EL display device 110 according to the ninth embodiment in that the wavelength conversion layer 20 is disposed at only a position opposite to the red color filter 28 on the first surface 23a of the second substrate 23.

(11) Eleventh Embodiment

Figure 11:
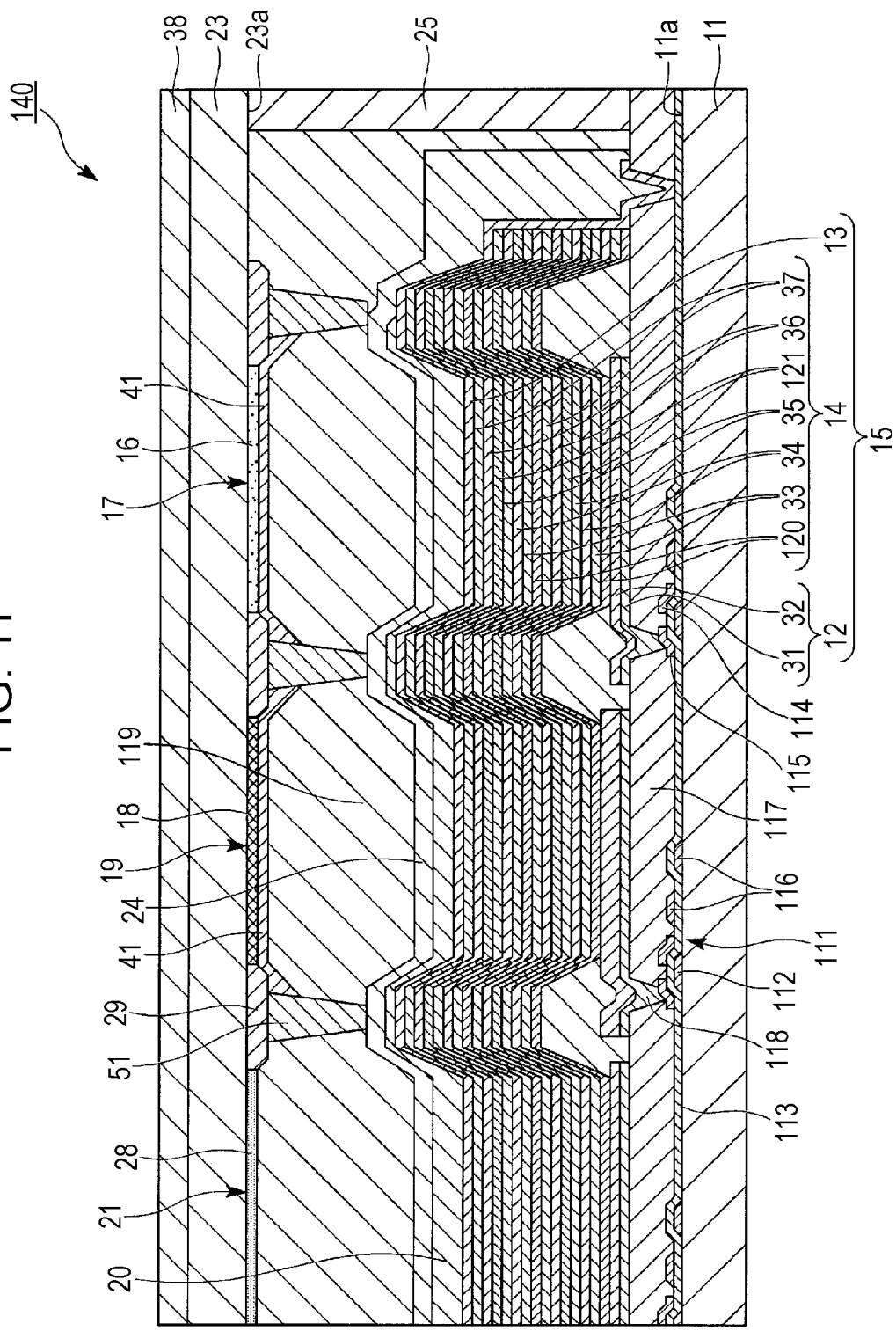
FIG. 11 is a schematic cross-sectional view of an organic EL display device according to an eleventh embodiment.

FIG. 11 is a schematic cross-sectional view of an organic EL display device according to an eleventh embodiment. In FIG. 11, the same elements as those in the organic EL display device 50 illustrated in FIG. 3 and the organic EL display device 110 illustrated in FIG. 9 are designated using the same reference numerals, and descriptions are not redundantly repeated.

An organic EL display device 140 according to this embodiment differs from the organic EL display device 110 according to the ninth embodiment in the following respects: the wavelength conversion layer 20 is disposed at positions opposite to the red color filter 28, the green color filter 18, and the blue color filter 16 on the first surface 23a of the second substrate 23 so as to cover the organic EL section 15 on the first surface 11a of the first substrate 11, and the low-refractive-index layer 30 is disposed on the first surface 23a of the second substrate 23 so as to cover the red color filter 28, the green color filter 18, and the blue color filter 16.

(12) Twelfth Embodiment

Figure 12:
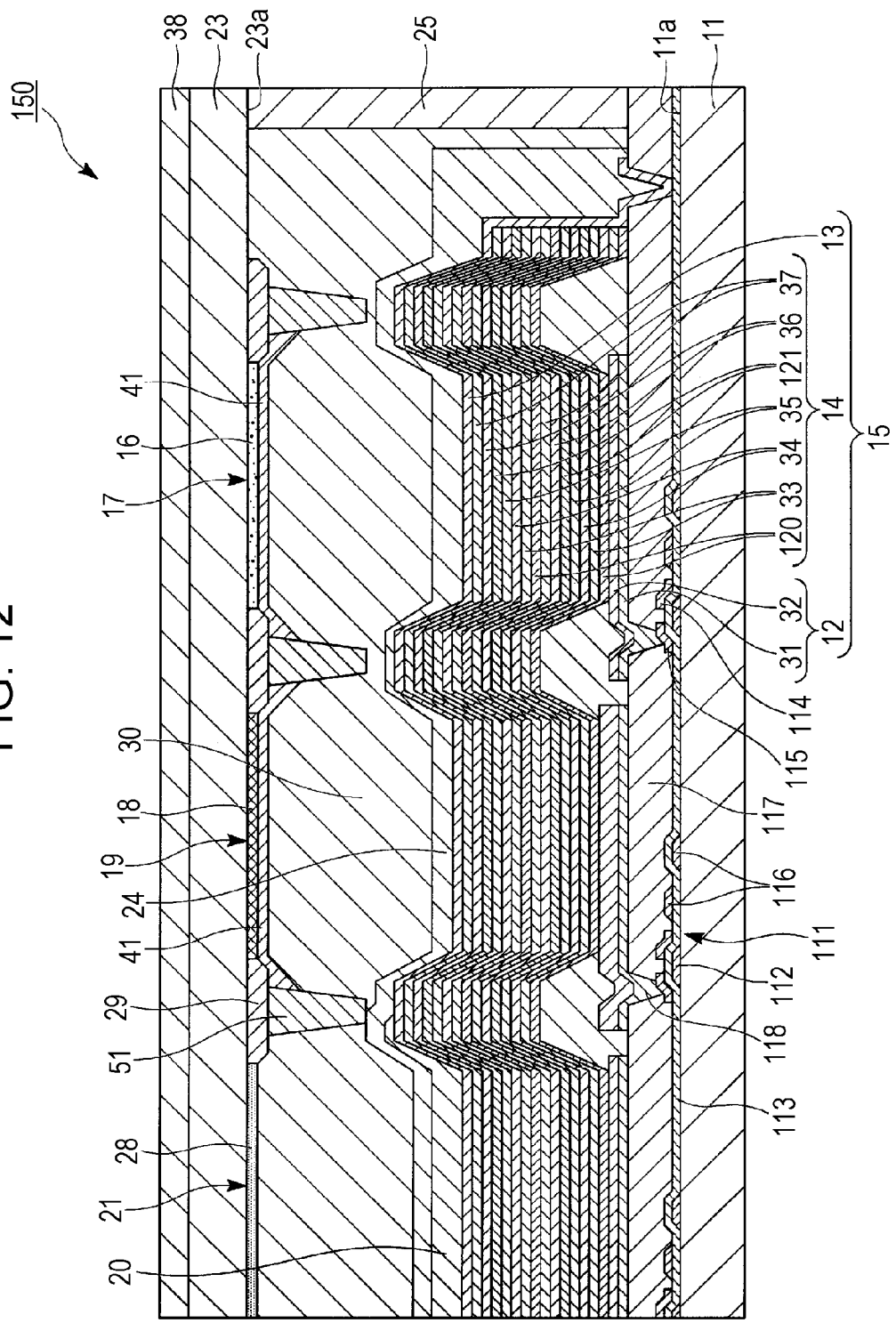
FIG. 12 is a schematic cross-sectional view of an organic EL display device according to a twelfth embodiment.

FIG. 12 is a schematic cross-sectional view of an organic EL display device according to a twelfth embodiment. In FIG. 12, the same elements as those in the organic EL display device 50 illustrated in FIG. 3 and the organic EL display device 110 illustrated in FIG. 9 are designated using the same reference numerals, and descriptions are not redundantly repeated.

An organic EL display device 150 according to this embodiment differs from the organic EL display device 110 according to the ninth embodiment in the following respects: the wavelength conversion layer 20 is disposed at only a position opposite to the red color filter 28 on the first surface 23a of the second substrate 23 so as to cover the organic EL section 15 on the first surface 11a of the first substrate 11, and the low-refractive-index layer 30 is disposed on the first surface 23a of the second substrate 23 so as to cover the red color filter 28, the green color filter 18, and the blue color filter 16.

"Circuit Configuration of Organic EL Display Device"

Figure 13:
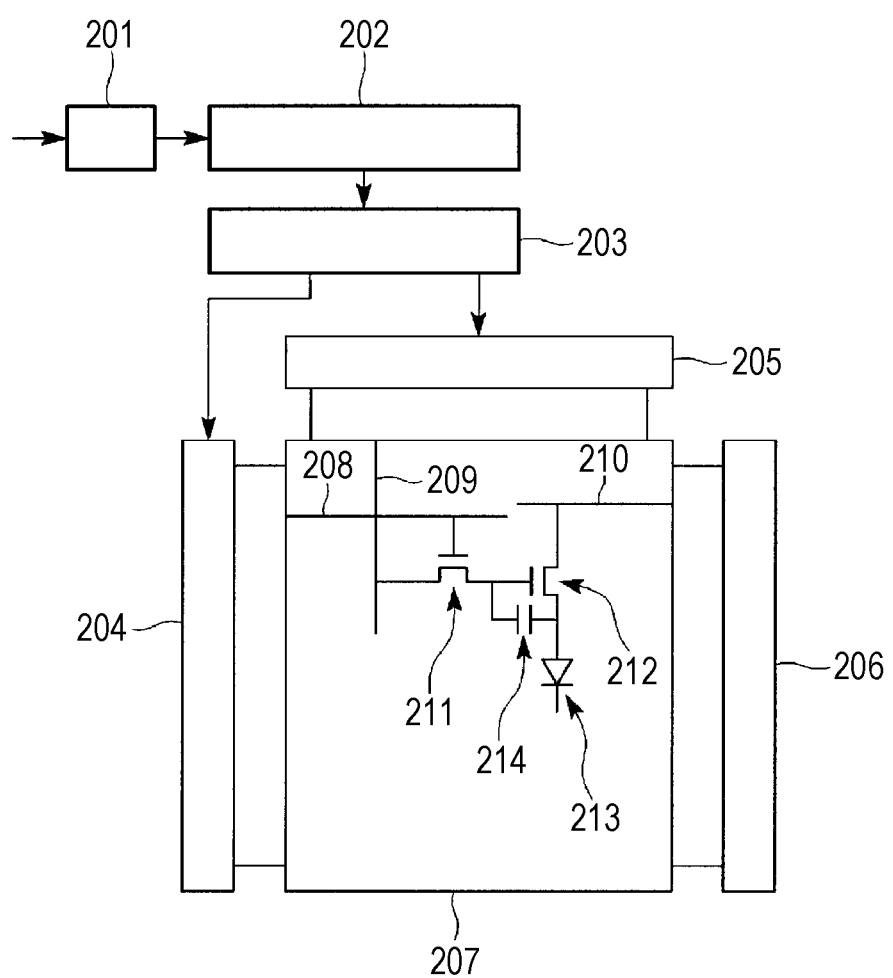
FIG. 13 is a block diagram illustrating the circuit configuration of the organic EL display device according to each of the first to the twelfth embodiments.

FIG. 13 is a block diagram illustrating the circuit configuration of the organic EL display device according to each of the first to the twelfth embodiments.

As illustrated in FIG. 13, each of the organic EL display devices according to the first to twelfth embodiments includes, as a circuit configuration, an AD converter circuit 201, an image processing circuit 202, a control circuit 203, a scanning line driving circuit 204, a signal line driving circuit 205, and a power supply circuit 206.

A pixel portion 207 of an organic EL cell includes a plurality of scanning lines 208, a plurality of signal lines 209, and a plurality of power lines 210.

Each pixel corresponding to each scanning line 208, each signal line 209, and each power line 210 includes a switching transistor 211, a driving transistor 212, an organic EL element 213, and a capacitor 214.

The power supply circuit 206 configured to drive the organic EL elements 213 sequentially selects the scanning line 208 in the pixel portion 207 with the scanning line driving circuit 204 and writes pixel data to each pixel arranged along the selected scanning line 208 with the signal line driving circuit 205. In other words, the scanning line driving circuit 204 sequentially drives the scanning line 208. The signal line driving circuit 205 supplies pixel data to the signal line 209. Thereby, a pixel located at the intersection of the driven scanning line 208 and the signal line 209 through which the data is supplied.

Furthermore, the power supply circuit 206 configured to drive a backlight unit supplies constant voltage and constant current in order to achieve a constant luminance level of the backlight unit during the display of an image. Furthermore, the control of the luminance of the backlight unit in synchronization with an image achieves lower power consumption.

"Light Fixture"

Figure 14:
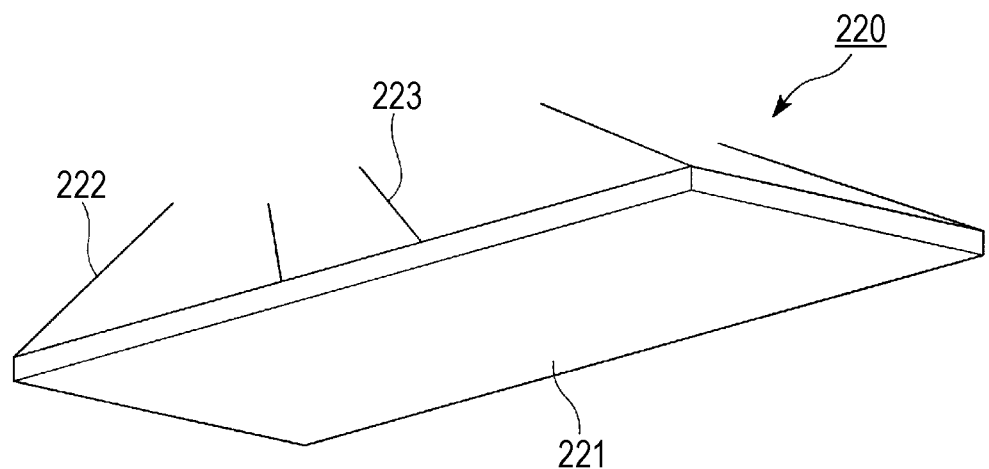
FIG. 14 is an outside drawing of a ceiling light as an application example of the organic EL display devices according to the first to twelfth embodiments.

Each of the organic EL display devices according to the first to twelfth embodiments may be used for, for example, a ceiling light (light fixture) 220 illustrated in FIG. 14.

The ceiling light 220 illustrated in FIG. 14 includes a light-emitting member 221, hangers 222, and a power code 223.

In the ceiling light 220, the light-emitting member 221 is formed of any of the organic EL display devices according to the first to twelfth embodiments.

The ceiling light 220 according to this embodiment includes the light-emitting member 221 formed of any of the organic EL display devices according to the first to twelfth embodiments and thus serves as a light fixture with excellent luminous efficiency.

Figure 15:
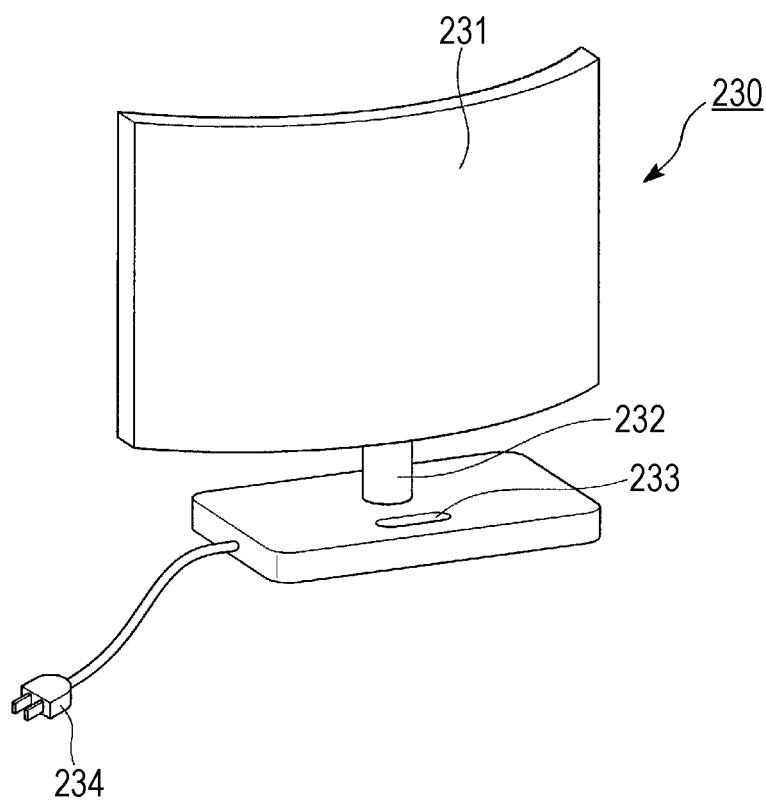
FIG. 15 is an outside drawing of an illumination stand as an application example of the organic EL display devices according to the first to twelfth embodiments.

Each of the organic EL display devices according to the first to twelfth embodiments may be used for, for example, an illumination stand (light fixture) 230 illustrated in FIG. 15.

The illumination stand 230 illustrated in FIG. 15 includes a light-emitting member 231, a stand 232, a main switch 233, and a power code 234.

In the illumination stand 230, the light-emitting member 231 is formed of any of the organic EL display devices according to the first to twelfth embodiments.

The illumination stand 230 according to this embodiment includes the light-emitting member 231 formed of any of the organic EL display devices according to the first to twelfth embodiments and thus serves as a light fixture with excellent luminous efficiency.

"Electronic Apparatus"

Each of the organic EL display devices according to the first to twelfth embodiments may be used for a variety of electronic apparatuses.

Electronic apparatuses each including any of the organic EL display devices according to the first to twelfth embodiments will be described below with reference to FIGS. 16 to 19.

Figure 16:
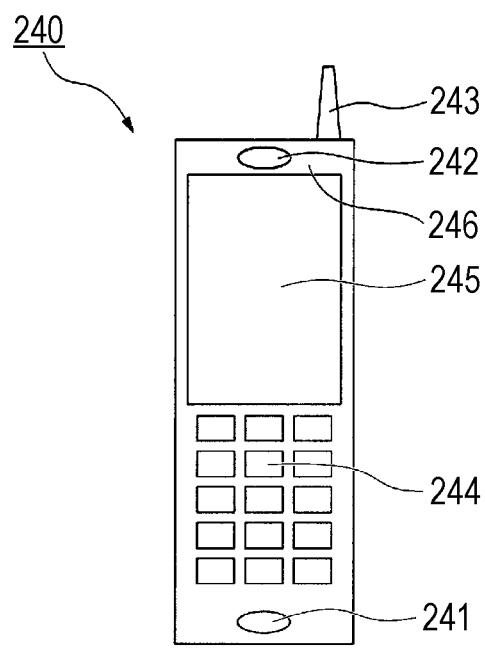
FIG. 16 is an outside drawing of a cellular phone as an application example of the organic EL display devices according to the first to twelfth embodiments.

Each of the organic EL display devices according to the first to twelfth embodiments may be used for, for example, a cellular phone illustrated in FIG. 16.

A cellular phone 240 illustrated in FIG. 16 includes a voice input member 241, a voice output member 242, an antenna 243, operating switches 244, a display member 245, a housing 246, and so forth.

Any of the organic EL display devices according to the first to twelfth embodiments is preferably used as the display member 245. The use of any of the organic EL display devices according to the first to twelfth embodiments as the display member 245 of the cellular phone 240 enables the display of an image with satisfactory luminous efficiency.

Figure 17:
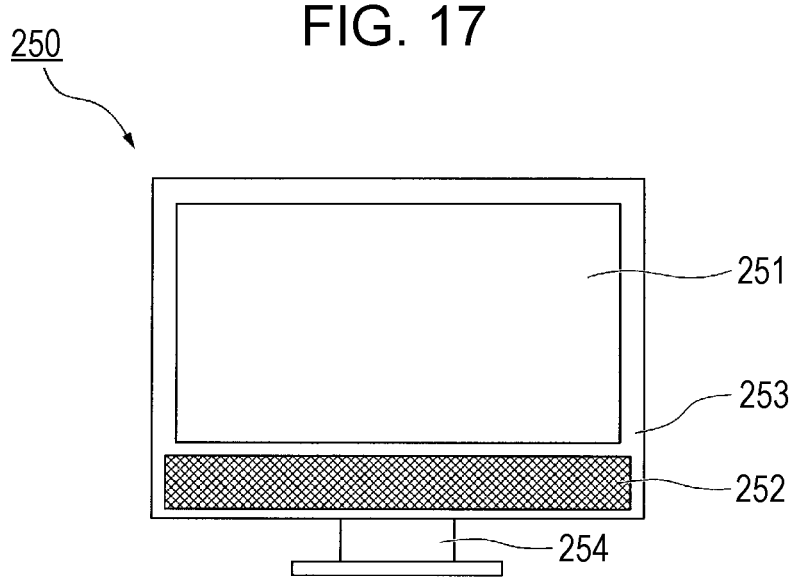
FIG. 17 is an outside drawing of a flat-panel television set as an application example of the organic EL display devices according to the first to twelfth embodiments.

Each of the organic EL display devices according to the first to twelfth embodiments may be used for, for example, a flat-screen television set illustrated in FIG. 17.

A flat-screen television set 250 illustrated in FIG. 17 includes a display member 251, a speaker 252, a cabinet 253, a stand 254, and so forth.

Each of the organic EL display devices according to the first to twelfth embodiments is preferably used as the display member 251. The use of any of the organic EL display devices according to the first to twelfth embodiments as the display member 251 of the flat-screen television set 250 enables the display of an image with satisfactory luminous efficiency.

Figure 18:
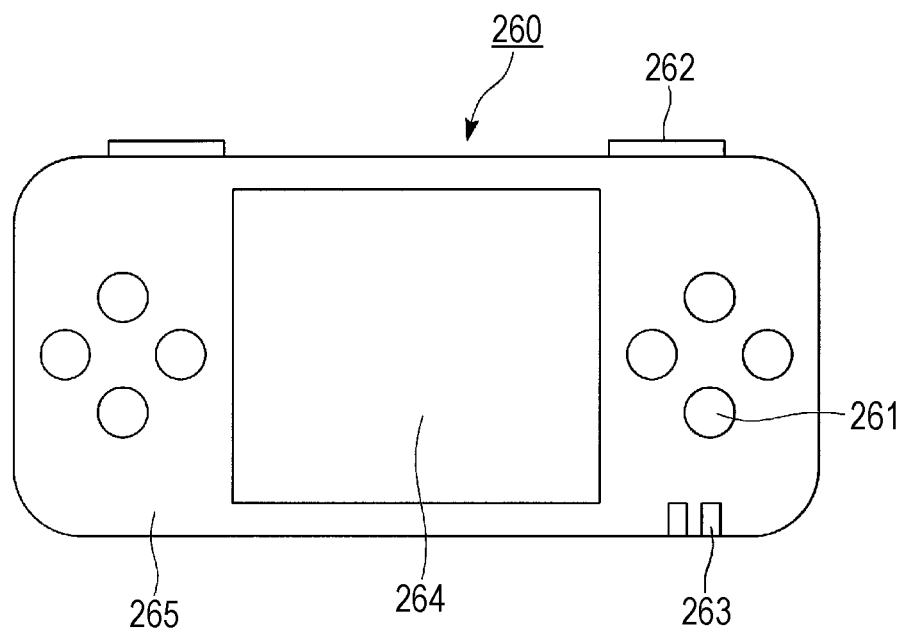
FIG. 18 is an outside drawing of a handheld gaming machine as an application example of the organic EL display devices according to the first to twelfth embodiments.

Each of the organic EL display devices according to the first to twelfth embodiments may be used for, for example, a handheld gaming machine illustrated in FIG. 18.

A handheld gaming machine 260 illustrated in FIG. 18 includes operating buttons 261 and 262, an external connection terminal 263, a display member 264, a housing 265, and so forth.

Each of the organic EL display devices according to the first to twelfth embodiments is preferably used as the display member 264. The use of any of the organic EL display devices according to the first to twelfth embodiments as the display member 264 of the handheld gaming machine 260 enables the display of an image with satisfactory luminous efficiency.

Figure 19:
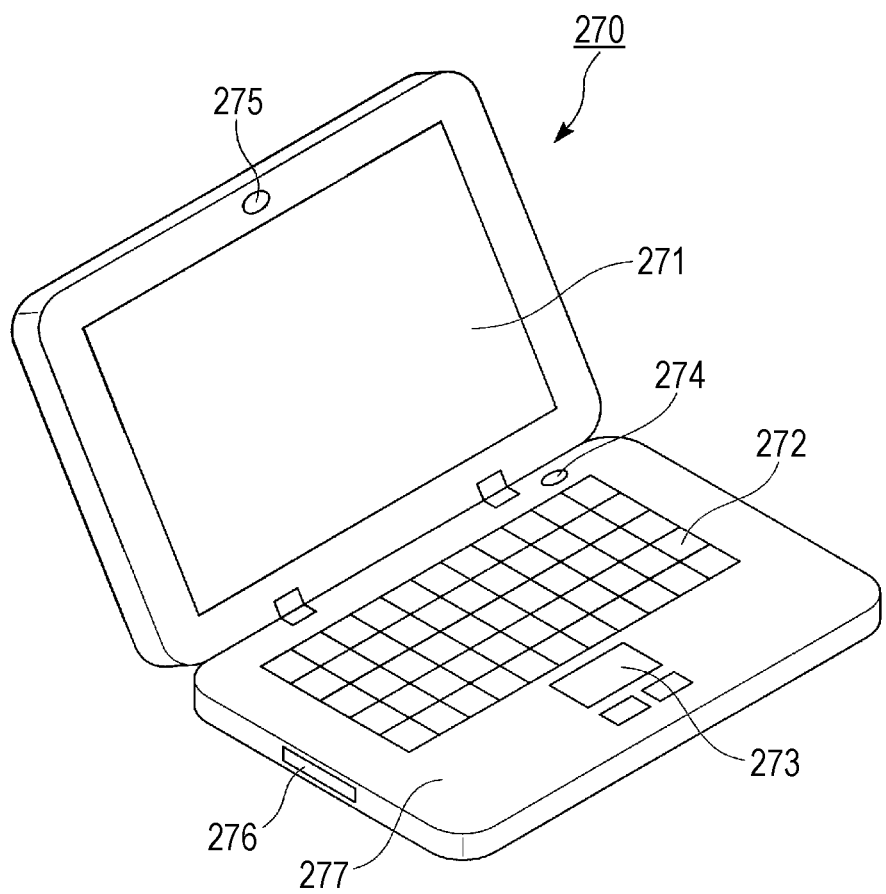
FIG. 19 is an outside drawing of a notebook personal computer as an application example of the organic EL display devices according to the first to twelfth embodiments.

Each of the organic EL display devices according to the first to twelfth embodiments may be used for, for example, a notebook personal computer illustrated in FIG. 19.

A notebook personal computer 270 illustrated in FIG. 19 includes a display member 271, a keyboard 272, a touch pad 273, a main switch 274, a camera 275, a recording medium slot 276, a housing 277, and so forth.

Each of the organic EL display devices according to the first to twelfth embodiments is preferably used as the display member 271. The use of any of the organic EL display devices according to the first to twelfth embodiments as the display member 271 of the notebook personal computer 270 enables the display of an image with satisfactory luminous efficiency.

Figure 20:
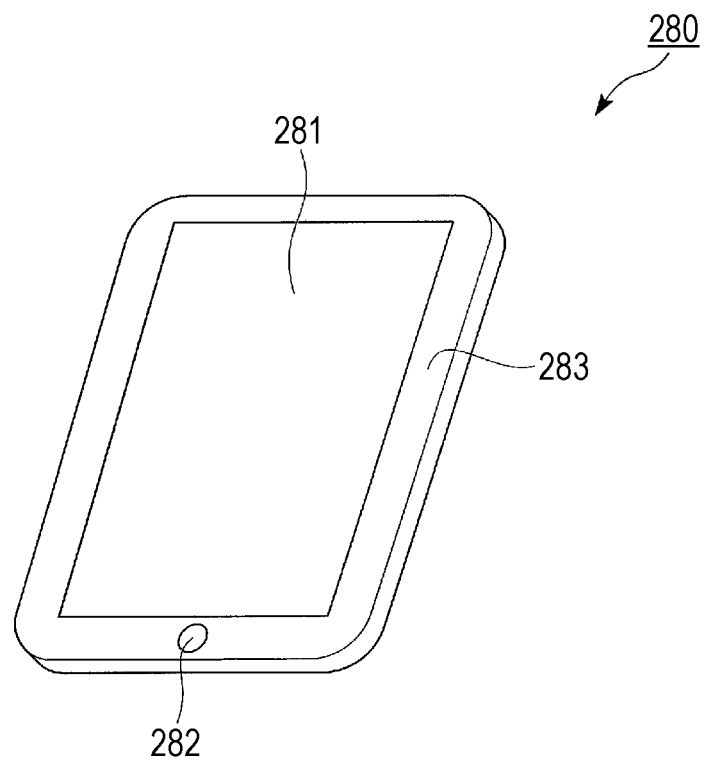
FIG. 20 is an outside drawing of a tablet terminal as an application example of the organic EL display devices according to the first to twelfth embodiments.

Each of the organic EL display devices according to the first to twelfth embodiments may be used for, for example, a tablet terminal illustrated in FIG. 20.

A tablet terminal 280 illustrated in FIG. 20 includes a display member (touch panel) 281, a camera 282, a housing 283, and so forth.

Each of the organic EL display devices according to the first to twelfth embodiments is preferably used as the display member 281. The use of any of the organic EL display devices according to the first to twelfth embodiments as the display member 281 of the tablet terminal 280 enables the display of an image with satisfactory luminous efficiency.

While preferred embodiments of the present invention have been described above with reference to the drawings, it is needless to say that the present invention is not limited to the foregoing embodiments. The shapes, combinations, and so forth described in the foregoing embodiments are merely illustrative. Various changes can be made on the basis of design requirements without departing from the scope of the present invention.

In addition, specific descriptions of the shape, the number, the arrangement, the material, the formation method, and so forth of each of the components of the display devices and the light fixtures may be appropriately changed without being limited to the foregoing embodiments.

EXAMPLES

While the present invention will be more specifically described below by examples, the present invention is not limited to these examples.

Example 1

A 0.7-mm-thick square glass substrate with a size of 100× 100 mm was used as a substrate. The substrate was subjected to rinse with water, ultrasonic cleaning with deionized water for 10 minutes, ultrasonic cleaning with acetone for 10 minutes, and steam cleaning with isopropyl alcohol for 5 minutes, followed by drying at 100° C. for 1 hour.

A black partition material (BK resist, manufactured by Tokyo Ohka Kogyo Co., Ltd.) was applied to a surface of the glass substrate by a spin coating method.

The glass substrate to which the black partition material had been applied was pre-baked at 70° C. for 15 minutes to form a coating film with a thickness of 1 μm.

The coating film was covered with a mask (pixel pitch: 200 μm, line width: 20 μm) configured to form a desired image pattern and irradiated with the i-line (100 mJ/cm$^2$) to perform exposure.

The coating film was developed with an aqueous solution of sodium carbonate, serving as a developer, and subjected to rinse treatment with deionized water to form a light absorption layer (low reflection layer).

A white photosensitive composition containing an epoxy-based resin (refractive index: 1.59), an acrylic-based resin (refractive index: 1.49), rutile-type titanium oxide (refractive index: 2.71, particle size: 250 nm), a photoinitiator, and an aromatic solvent was mixed by stirring to prepare a positive-type resist serving as a bank material.

The positive-type resist was applied to the surface of the glass substrate by the spin coating method. A pattern of the positive-type resist was formed, the pattern having a pixel pitch of 200 μm and a line width of 20 μm. Thereby, a light-reflecting bank having a thickness of 5 μm was formed on the light absorption layer.

A pattern of a red color filter, a green color filter, and a blue color filter was formed in regions defined by the bank.

A blue-light-scattering layer was formed in a blue pixel. A green-light-scattering layer was formed in a green pixel. To form a light scattering layer, first, 30 g of polyvinyl alcohol dissolved in a water/dimethyl sulfoxide (1/1) mixture solution (300 g) was added to 20 g of silica particles having an average particle size of 1.5 μm (refractive index: 1.65). The mixture was stirred with a disperser to prepare a coating liquid for the formation of a light-scattering layer.

The coating liquid for the formation of a light-scattering layer was applied by a screen printing method to regions where the low reflection layer was not formed on the glass substrate. Subsequently, the coating liquid was dried by heating for 4 hours with a vacuum oven at 200° C. and 10 mmHg to form a light-scattering layer.

A polystyrene resin (10 g), 9-(1H-benzimidazol-2-yl)-1,1,6,6-tetramethyl-2,3,5,6-tetrahydro-1H,4H-11-oxa-aza-benzanthracene-10-one (1 g), and Lumogen Red (0.1 g) were dissolved in toluene to prepare a coating liquid for the formation of a wavelength conversion layer.

The coating liquid for the formation of a wavelength conversion layer was applied by a spin coating method on the color filters provided on the glass substrate to form a wavelength conversion layer having a thickness of 2 μm.

The wavelength conversion layer was irradiated with light using an ultra-high-pressure UV lamp from a side opposite to the glass substrate with a photomask designed in such a manner that portions of the photomask corresponding to the blue pixel and the green pixel transmitted light and that a portion of the photomask corresponding to a red pixel did not transmit light. Thereby, in the blue pixel and the green pixel, absorption by the wavelength conversion layer was reduced. Furthermore, the red wavelength conversion function was degraded, so that red light was not emitted. Thus, it was possible to efficiently transmit light emitted from the organic EL section and prevent a reduction in color purity due to color mixture of a red light component.

The foregoing process was performed in dry air.

The substrate on which the wavelength conversion layer had been formed was transported to a glove box (water concentration: 1 ppm or less, oxygen concentration: 1 ppm or less) and heated at 80° C. for 1 hour, thereby removing water and oxygen in the wavelength conversion layer.

A 2-μm-thick gas barrier layer composed of a SiON film was formed by a sputtering method on the wavelength conversion layer.

A 0.7-mm-thick square glass substrate with a size of 100× 100 mm was used as a substrate. An amorphous silicon semiconductor film was formed by a PECVD method on the glass substrate.

The amorphous silicon semiconductor film was subjected to crystallization treatment to form a polycrystalline silicon semiconductor film.

The polycrystalline silicon semiconductor film was patterned into a plurality of islands by a photolithography method. A gate insulating film and a gate electrode layer were formed in that order on the patterned polycrystalline silicon semiconductor film and then patterned by a photolithography method.

The patterned polycrystalline silicon semiconductor film was doped with an impurity element, such as phosphorus, to form source and drain regions, thereby producing TFT elements.

Then a planarizing film was formed. A silicon nitride film formed by a PECVD method and an acrylic-based resin layer formed by a spin coating method were stacked in that order, thereby forming the planarizing film.

After the formation of the silicon nitride film, the silicon nitride film and the gate insulating film were etched in one operation to form contact holes communicating with the source or drain region. Subsequently, source lines were formed. Then the acrylic-based resin layer was formed. Contact holes communicating with the drain regions were formed at the same positions as those of the contact holes formed in the gate insulting film and the silicon nitride film, thereby providing an active matrix substrate.

A function as the planarizing film was achieved by the acrylic-based resin layer.

A capacitor configured to allow the gate potential of each of the TFT elements to be a constant potential was formed by the formation of an insulating film between the drain of a switching TFT element and the source of a driving TFT element.

Contact holes passing through the planarizing film and each being used to electrically connect each of the driving TFT elements and a corresponding one of first electrodes were formed on the active matrix substrate.

The first electrodes (anodes) in the pixels were formed by a sputtering method in the contact holes passing through the planarizing film so as to establish electrical connection with the TFT elements configured to drive the pixels.

The first electrodes were formed as follows: A 150-nm-thick reflective aluminum (Al) electrode and a 90-nm-thick transparent indium oxide-zinc oxide (IZO) electrode were stacked by a sputtering method and patterned by a conventional photolithography method into shapes corresponding to the blue pixel and the red pixel.

Furthermore, a 150-nm-thick reflective aluminum (Al) electrode and a 180-nm-thick transparent indium oxide-zinc oxide (IZO) electrode were stacked by a sputtering method and patterned by a conventional photolithography method into a shape corresponding to the green pixel.

As a result, the thickness of the transparent electrode in the blue pixel is different from that in the green pixel, thus enabling the enhancement of the color purity by an interference (microcavity) effect between the reflective electrode and the translucent electrode.

Here, the area of each of the first electrodes was 180 μm×540 μm. A sealing area having a width of 2 mm was formed at the periphery of a display portion in which the pixels were formed. A terminal leading portion 2 mm in length was formed outside the sealing area on a short side. A terminal leading portion 2 mm in length was formed at a portion on a long side at which bending was to be performed.

As with the bank material, a 200-nm-thick photosensitive resin layer containing rutile-type titanium oxide was formed by a spin coating method on the first electrodes and patterned by a conventional photolithography method so as to cover edge portions of each of the first electrodes. Here, an edge cover was formed so as to have a structure in which regions each extending from the edge of each of four sides of each first electrode to a position 10 μm distant from the edge are covered.

The active substrate was cleaned. As the cleaning of the active substrate, for example, ultrasonic cleaning was performed with acetone, isopropyl alcohol (IPA), or the like for 10 minutes, and subsequently, UV-ozone cleaning was performed for 30 minutes.

The substrate was fixed to a substrate holder in an in-line resistance heating evaporation apparatus. Layers constituting the organic layer were formed under a reduced pressure of $1 \times 10^{-4}$ Pa or less.

A 20-nm-thick hole injection layer was formed on the first electrodes by a resistance heating evaporation method with 1,1-bis-di-4-tolylamino-phenyl-cyclohexane (TAPC) serving as a hole injection material.

A 20-nm-thick hole transport layer was formed on the hole injection layer by a resistance heating evaporation method with N,N'-di-1-naphthyl-N,N'-diphenyl-1,1'-biphenyl-1,1'-biphenyl-4,4'-diamine (NPD) serving as a hole transport material.

A 20-nm-thick organic blue luminescent layer was formed on the hole transport layer. Here, 1,4-bis-triphenylsilyl-benzene (UGH-2) (host material) and iridium(III) bis[(4,6-difluorophenyl)-pyridinato-N,C2']picolinate (FIrpic) (blue phosphorescent dopant) were co-deposited by a vacuum evaporation method at deposition rates of 1.5 Å/sec and 0.2 Å/sec, respectively, to form the blue luminescent layer.

A 10-nm-thick hole blocking layer was formed with 2,9-dimethyl-4,7-diphenyl-1,10-phenanthroline (BCP) on the organic blue luminescent layer.

A 10-nm-thick electron transport layer was formed with tris(8-hydroxyquinoline)aluminum ($Alq_3$) and lithium (Li) on the hole blocking layer. Here, tris(8-hydroxyquinoline)aluminum ($Alq_3$) and lithium (Li) were co-deposited by a vacuum evaporation method at deposition rates of 1.5 Å/sec and 0.2 Å/sec, respectively, to form the electron transport layer.

A 0.5-nm-thick electron injection layer was formed with lithium fluoride (LiF) on the electron transport layer.

A second electrode was formed on the electron injection layer. Here, magnesium and silver were co-deposited by a vacuum evaporation method at deposition rates of 0.1 Å/sec and 0.9 Å/sec, respectively, to form the second electrode.

For the purposes of enhancing the interference effect and preventing a reduction in voltage due to the wiring resistance of the second electrode, silver was deposited by a vacuum evaporation method on the second electrode at a deposition rate of 1 Å/sec to form a desired pattern. Here, a 19-nm-thick thin silver film was formed. Thereby, the second electrode was produced.

Here, in the organic EL section, the microcavity effect (interference effect) was provided between the reflective electrodes (first electrodes) and the translucent electrode (second electrode). This enables an increase in front luminance and the efficient propagation of the luminescence energy from the organic EL section to the wavelength conversion layer and the light-scattering layer. Furthermore, the color purity (0.14, 0.29) of light emitted from the organic light-emitting layer was adjusted to the color purity (0.14, 0.08) for the blue pixel and the red pixel and to the color purity (0.27, 0.64) for the green pixel by the use of the microcavity effect.

A 3-μm-thickness inorganic protective layer composed of $SiO_2$ was formed by a plasma-enhanced CVD method. The inorganic protective layer extending from the end of the display portion to the sealing area with a width of 2 mm was then patterned with a shadow mask.

Thereby, an active matrix organic EL substrate was produced.

The active matrix organic EL substrate and a wavelength conversion substrate were transported to a glove box (water concentration: 1 ppm or less, oxygen concentration: 1 ppm or less) for bonding.

An ultraviolet curable adhesive containing spacers 20 μm in size dispersed therein (trade name: 30Y-437, manufactured by ThreeBond Holdings Co., Ltd.) was applied to the periphery of the wavelength conversion substrate with a dispenser to form a peripheral sealing material. A transparent silicone resin (trade name: TSE3051, manufactured by Toshiba Silicone Co., Ltd.) serving as a filler was applied to a region surrounded by the peripheral sealing material, with a dispenser.

The active matrix organic EL substrate and the wavelength conversion substrate were transported to a vacuum chamber. The pressure in the vacuum chamber was reduced to 1 Pa. The active matrix organic EL substrate and the wavelength conversion substrate were temporarily bonded and fixed together while primary alignment was performed with alignment marks.

The temporarily bonded active matrix organic EL substrate and the wavelength conversion substrate were transported to a glove box. Secondary alignment was then performed with a CCD.

The peripheral sealing material was irradiated with ultraviolet radiation using an UV lamp to cure the peripheral sealing material, thereby forming a peripheral sealing layer.

Heating was performed at 80° C. for 1 hour to allow the transparent silicone resin to gel.

A polarizer was bonded to the substrate on the light-output side to provide an active matrix organic EL display device.

Finally, the terminal adjacent to the short side was connected to the power supply circuit via the source driver. The terminal adjacent to the long side was connected to an external power supply via the gate driver. Thereby, the active matrix organic EL display device having a square display portion with a size of 80×80 mm was provided.

Here, a desired current was applied from the external power supply to each pixel to evaluate the emission characteristics of the active matrix organic EL display device.

In the red pixel, the blue-green phosphorescent organic EL section was used as excitation light source capable of being freely switched. In the red wavelength conversion layer, blue light emitted from the blue-green phosphorescent organic EL section was converted from blue light to red light by the use of the microcavity effect. Furthermore, the red light was allowed to pass through the red color filter, thereby improving the color purity.

In the green pixel, blue light emitted from the blue-green phosphorescent organic EL section was converted from blue light to green light by the use of the microcavity effect.

Furthermore, the green light was allowed to pass through the green color filter, thereby improving the color purity.

In the blue pixel, blue light emitted from the blue-green phosphorescent organic EL section and blue light provided by the use of the microcavity effect were allowed to pass through the blue color filter, thereby improving the color purity.

In the green pixel and the blue pixel, the light-scattering layers allowed directional light provided by the use of the microcavity effect to be converted into isotropic light, thereby displaying a full-color image and providing a wide color reproduction range (NTSC ratio: 90%) and satisfactory viewing angle characteristics.

Example 2

An active matrix organic EL display device was produced as in EXAMPLE 1, except that a wavelength conversion layer was formed in the red pixel by a transfer method.

To form the wavelength conversion layer, first, a 200-nm-thick heat conversion layer composed of chromium was formed on a glass substrate by a sputtering method, thereby providing a transfer substrate.

The coating liquid for the formation of a wavelength conversion layer used in EXAMPLE 1 was applied to the transfer substrate by a spin coating method to form a wavelength conversion layer having a thickness of 5 µm, thereby providing the transfer substrate for the formation of a wavelength conversion layer.

The transfer substrate for the formation of a wavelength conversion layer was arranged on the substrate on which the color filters had been formed. The red wavelength conversion layer was formed on a predetermined red pixel by transfer with a diode laser.

The resulting organic EL display device was capable of achieving full-color display and had a wide color reproduction range (NTSC ratio: 90%) and satisfactory viewing angle characteristics.

Comparative Example 1

An active matrix organic EL display device was produced as in EXAMPLE 1, except that the electron transport layer and the second electrode were formed as described below.

A 10-nm-thick electron transport layer was formed with tris(8-hydroxyquinoline)aluminum ($Alq_3$) and lithium (Li) on the hole blocking layer. Here, tris(8-hydroxyquinoline)aluminum ($Alq_3$) and lithium (Li) were co-deposited by a vacuum evaporation method at deposition rates of 1.5 Å/sec and 0.2 Å/sec, respectively, to form the electron transport layer.

Then the second electrode was formed on the electron transport layer.

The glass substrate on which the foregoing components had been formed was fixed in a deposition chamber of an ion beam sputtering apparatus.

The second electrode (transparent electrode) was formed with an IZO sintered compact serving as a target under deposition conditions (plasma beam power: 4.0 kW, beam cross-sectional area SB2: 12.56 $cm^2$, beam energy density: 319 $W/cm^2$, deposition thickness: 200 nm, deposition gas introduced: Ar: 20 sccm, $O_2$: 10 sccm, source material: IZO ($ZnO_2$ content: 10% by mass) sintered compact, and source density: 99% or more (relative density), where this material has a true density of 7.156 $g/cm^3$ because $In_2O_3$ has a true density of 7.18 $g/cm^3$ and $SnO_2$ has a true density of 6.95 $g/cm^3$).

In the resulting organic EL display device, the color reproduction range was 50% (NTSC ratio).

Example 3

A 0.7-mm-thick square glass substrate with a size of 100× 100 mm was used as a substrate. The substrate was subjected to rinse with water, ultrasonic cleaning with deionized water for 10 minutes, ultrasonic cleaning with acetone for 10 minutes, and steam cleaning with isopropyl alcohol for 5 minutes, followed by drying at 100° C. for 1 hour.

A black partition material (BK resist, manufactured by Tokyo Ohka Kogyo Co., Ltd.) was applied to a surface of the glass substrate by a spin coating method.

The glass substrate to which the black partition material had been applied was pre-baked at 70° C. for 15 minutes to form a coating film with a thickness of 1 µm.

The coating film was covered with a mask (pixel pitch: 200 µm, line width: 20 µm) configured to form a desired image pattern and irradiated with the i-line (100 $mJ/cm^2$) to perform exposure.

The coating film was developed with an aqueous solution of sodium carbonate, serving as a developer, and subjected to rinse treatment with deionized water to form a light absorption layer (low reflection layer).

A white photosensitive composition containing an epoxy-based resin (refractive index: 1.59), an acrylic-based resin (refractive index: 1.49), rutile-type titanium oxide (refractive index: 2.71, particle size: 250 nm), a photoinitiator, and an aromatic solvent was mixed by stirring to prepare a positive-type resist serving as a bank material.

The positive-type resist was applied to the surface of the glass substrate by the spin coating method. A pattern having a pixel pitch of 200 µm and a line width of 20 µm was formed. Thereby, a light-reflecting bank having a thickness of 5 µm was formed on the light absorption layer.

A pattern of a red color filter, a green color filter, and a blue color filter was formed in regions defined by the bank.

The substrate on which the color filters had been formed was transported to a glove box (water concentration: 1 ppm or less, oxygen concentration: 1 ppm or less) and heated at 80° C. for 1 hour, thereby removing water and oxygen in the color filters.

A 2-µm-thick gas barrier layer composed of a SiON film was formed by a sputtering method on the color filters.

A 0.7-mm-thick square glass substrate with a size of 100× 100 mm was used as a substrate. An amorphous silicon semiconductor film was formed by a PECVD method on the glass substrate.

The amorphous silicon semiconductor film was subjected to crystallization treatment to form a polycrystalline silicon semiconductor film.

The polycrystalline silicon semiconductor film was patterned into a plurality of islands by a photolithography method. A gate insulating film and a gate electrode layer were formed in that order on the patterned polycrystalline silicon semiconductor film and then patterned by a photolithography method.

The patterned polycrystalline silicon semiconductor film was doped with an impurity element, such as phosphorus, to form source and drain regions, thereby producing TFT elements.

Then a planarizing film was formed. A silicon nitride film formed by a PECVD method and an acrylic-based resin layer formed by a spin coating method were stacked in that order, thereby forming the planarizing film.

After the formation of the silicon nitride film, the silicon nitride film and the gate insulating film were etched in one operation to form contact holes communicating with the source or drain region. Subsequently, source lines were formed. Then the acrylic-based resin layer was formed. Contact holes communicating with the drain regions were formed at the same positions as those of the contact holes formed in the gate insulting film and the silicon nitride film, thereby providing an active matrix substrate.

A function as the planarizing film was achieved by the acrylic-based resin layer.

A capacitor configured to allow the gate potential of each of the TFT elements to be a constant potential was formed by the formation of an insulating film between the drain of a switching TFT element and the source of a driving TFT element.

Contact holes passing through the planarizing film and each being used to electrically connect each of the driving TFT elements and a corresponding one of first electrodes were formed on the active matrix substrate.

The first electrodes (anodes) in the pixels were formed by a sputtering method in the contact holes passing through the planarizing film so as to establish electrical connection with the TFT elements configured to drive the pixels.

The first electrodes were formed as follows: A 150-nm-thick reflective aluminum (Al) electrode and a 90-nm-thick transparent indium oxide-zinc oxide (IZO) electrode were stacked by a sputtering method and patterned by a conventional photolithography method into shapes corresponding to the blue pixel and the red pixel.

Furthermore, a 150-nm-thick reflective aluminum (Al) electrode and a 180-nm-thick transparent indium oxide-zinc oxide (IZO) electrode were stacked by a sputtering method and patterned by a conventional photolithography method into a shape corresponding to the green pixel.

As a result, the thickness of the transparent electrode in the blue pixel is different from that in the green pixel, thus enabling the enhancement of the color purity by an interference (microcavity) effect between the reflective electrode and the translucent electrode.

Here, the area of each of the first electrodes was 180 µm×540 µm. A sealing area having a width of 2 mm was formed at the periphery of a display portion in which the pixels were formed. A terminal leading portion 2 mm in length was formed outside the sealing area on a short side. A terminal leading portion 2 mm in length was formed at a portion on a long side at which bending was to be performed.

As with the bank material, a 200-nm-thick photosensitive resin layer containing rutile-type titanium oxide was formed by a spin coating method on the first electrodes and patterned by a conventional photolithography method so as to cover edge portions of each of the first electrodes. Here, an edge cover was formed so as to have a structure in which regions each extending from the edge of each of four sides of each first electrode to a position 10 µm distant from the edge are covered.

The active substrate was cleaned. As the cleaning of the active substrate, for example, ultrasonic cleaning was performed with acetone, isopropyl alcohol (IPA), or the like for 10 minutes, and subsequently, UV-ozone cleaning was performed for 30 minutes.

The substrate was fixed to a substrate holder in an in-line resistance heating evaporation apparatus. Layers constituting the organic layer were formed under a reduced pressure of $1 \times 10^{-4}$ Pa or less.

A 20-nm-thick hole injection layer was formed on the first electrodes by a resistance heating evaporation method with 1,1-bis-di-4-tolylamino-phenyl-cyclohexane (TAPC) serving as a hole injection material.

A 20-nm-thick hole transport layer was formed on the hole injection layer by a resistance heating evaporation method with N,N'-di-1-naphthyl-N,N'-diphenyl-1,1'-biphenyl-1,1'-biphenyl-4,4'-diamine (NPD) serving as a hole transport material.

A 20-nm-thick organic blue luminescent layer was formed on the hole transport layer. Here, 1,4-bis-triphenylsilyl-benzene (UGH-2) (host material) and iridium(III) bis[(4,6-difluorophenyl)-pyridinato-N,C2']picolinate (FIrpic) (blue phosphorescent dopant) were co-deposited by a vacuum evaporation method at deposition rates of 1.5 Å/sec and 0.2 Å/sec, respectively, to form the blue luminescent layer.

A 10-nm-thick hole blocking layer was formed with 2,9-dimethyl-4,7-diphenyl-1,10-phenanthroline (BCP) on the organic blue luminescent layer. A 10-nm-thick electron transport layer was formed with tris(8-hydroxyquinoline)aluminum ($Alq_3$).

A 0.5-nm-thick electron injection layer was formed with lithium fluoride (LiF) on the electron transport layer.

A second electrode was formed on the electron injection layer. Here, the substrate on which the organic layer had been formed was fixed in a metal evaporation chamber. Magnesium and silver were co-deposited by a vacuum evaporation method at deposition rates of 0.1 Å/sec and 0.9 Å/sec, respectively, to form the second electrode.

For the purposes of enhancing the interference effect and preventing a reduction in voltage due to the wiring resistance of the second electrode, silver was deposited by a vacuum evaporation method on the second electrode at a deposition rate of 1 Å/sec to form a desired pattern. Here, a 19-nm-thick thin silver film was formed. Thereby, the second electrode was produced.

Here, in the organic EL section, the microcavity effect (interference effect) was provided between the reflective electrodes (first electrodes) and the translucent electrode (second electrode). This enables an increase in front luminance and the efficient propagation of the luminescence energy from the organic EL section to the wavelength conversion layer and the light-scattering layer. Furthermore, the color purity (0.14, 0.29) of light emitted from the organic light-emitting layer was adjusted to the color purity (0.14, 0.08) for the blue pixel and the red pixel and to the color purity (0.27, 0.64) for the green pixel by the use of the microcavity effect.

A 3-µm-thickness inorganic protective layer composed of $SiO_2$ was formed by a plasma-enhanced CVD method. The inorganic protective layer extending from the end of the display portion to the sealing area with a width of 2 mm was then patterned with a shadow mask.

Coumarin 6 and 4-(dicyanomethylene)-2-tert-butyl-6-(1,1,7,7,-tetramethyljulolidine (DCJTB) were co-deposited on the entire display portion by a resistance heating evaporation method at deposition rates of 10 nm/sec and 0.5 nm/sec, respectively, to form a 400-nm-thick wavelength conversion layer.

The wavelength conversion layer was irradiated with light using an ultra-high-pressure UV lamp from a side opposite to the glass substrate with a photomask designed in such a manner that portions of the photomask corresponding to the blue pixel and the green pixel transmitted light and that a portion of the photomask corresponding to a red pixel did not transmit light. Thereby, in the blue pixel and the green pixel, absorption by the wavelength conversion layer was reduced. Furthermore, the red wavelength conversion function was degraded, so that red light was not emitted. Thus, it was possible to efficiently transmit light emitted from the organic EL section and prevent a reduction in color purity due to color mixture of a red light component.

Thereby, an active matrix organic EL substrate was produced.

The active matrix organic EL substrate and a wavelength conversion substrate were transported to a glove box (water concentration: 1 ppm or less, oxygen concentration: 1 ppm or less) for bonding.

The active matrix organic EL substrate and the wavelength conversion substrate were aligned with alignment marks formed outside the display portion.

A thermosetting resin was applied to the periphery of the active matrix organic EL substrate in advance. Both the substrates were brought into close contact with each other and heated at 90° C. for 2 hours to cure the thermosetting resin. To prevent the degradation of the organic layer due to water, the bonding step was performed in a dry air environment (amount of water: −60° C.).

A polarizer was bonded to the substrate on the light-output side to provide an active matrix organic EL display device.

Finally, the terminal adjacent to the short side was connected to the power supply circuit via the source driver. The terminal adjacent to the long side was connected to an external power supply via the gate driver. Thereby, the active matrix organic EL display device having a square display portion with a size of 80×80 mm was provided.

Here, a desired current was applied from the external power supply to each pixel to evaluate the emission characteristics of the active matrix organic EL display device.

In the red pixel, the blue-green phosphorescent organic EL section was used as excitation light source capable of being freely switched. In the red wavelength conversion layer, green light emitted from the blue-green phosphorescent organic EL section was converted from green light to red light by the use of the microcavity effect. Furthermore, the red light was allowed to pass through the red color filter, thereby improving the color purity.

In the green pixel, green light emitted from the blue-green phosphorescent organic EL section and green light provided by the use of the microcavity effect were allowed to pass through the green color filter, thereby improving the color purity.

In the blue pixel, blue light emitted from the blue-green phosphorescent organic EL section and blue light provided by the use of the microcavity effect were allowed to pass through the blue color filter, thereby improving the color purity.

In the green pixel and the blue pixel, the light-scattering layers allowed directional light provided by the use of the microcavity effect to be converted into isotropic light, thereby displaying a full-color image and providing a wide color reproduction range (NTSC ratio: 92%) and satisfactory viewing angle characteristics.

Example 4

An active matrix organic EL display device was produced as in EXAMPLE 3, except that the wavelength conversion layer was formed in the red pixel by a transfer method.

To form the wavelength conversion layer, first, a 200-nm-thick heat conversion layer composed of chromium was formed on a glass substrate by a sputtering method, thereby providing a transfer substrate.

Coumarin 6 and 4-(dicyanomethylene)-2-tert-butyl-6-(1,1,7,7,-tetramethyljulolidine (DCJTB) were co-deposited on a transfer substrate by a resistance heating evaporation method at deposition rates of 10 nm/sec and 0.5 nm/sec, respectively, to form a 400-nm-thick wavelength conversion layer, thereby producing the transfer substrate for the formation of a wavelength conversion layer.

The transfer substrate for the formation of a wavelength conversion layer was arranged on the substrate on which the color filters had been formed. The red wavelength conversion layer was formed on a predetermined red pixel by transfer with a diode laser.

The resulting organic EL display device was capable of achieving full-color display and had a wide color reproduction range (NTSC ratio: 92%) and satisfactory viewing angle characteristics.

Comparative Example 2

An active matrix organic EL display device was produced as in EXAMPLE 3, except that the electron transport layer and the second electrode were formed as described below.

A 10-nm-thick electron transport layer was formed with tris(8-hydroxyquinoline)aluminum ($Alq_3$) and bis(8-hydroxyquinoline)lithium ($Liq_2$). Here, tris(8-hydroxyquinoline)aluminum ($Alq_3$) and bis(8-hydroxyquinoline)lithium ($Liq_2$) were co-deposited by a vacuum evaporation method at deposition rates of 1.5 Å/sec and 0.2 Å/sec, respectively, to form the electron transport layer.

Then the second electrode was formed on the electron transport layer.

The glass substrate on which the foregoing components had been formed was fixed in a deposition chamber of an ion beam sputtering apparatus.

The second electrode (transparent electrode) was formed with an IZO sintered compact serving as a target under deposition conditions (plasma beam power: 4.0 kW, beam cross-sectional area SB2: 12.56 cm$^2$, beam energy density: 319 W/cm$^2$, deposition thickness: 200 nm, deposition gas introduced: Ar: 20 sccm, $O_2$: 10 sccm, source material: IZO ($ZnO_2$ content: 10% by mass) sintered compact, and source density: 99% or more (relative density), where this material has a true density of 7.156 g/cm$^3$ because $In_2O_3$ has a true density of 7.18 g/cm$^3$ and $SnO_2$ has a true density of 6.95 g/cm$^3$).

In the resulting organic EL display device, the color reproduction range was 52% (NTSC ratio).

INDUSTRIAL APPLICABILITY

The present invention may be applied to an organic EL display device.

REFERENCE SIGNS LIST 10 organic EL display device
11 first substrate
12 first electrode
13 second electrode
14 organic layer
15 organic electroluminescent section (organic EL section)
16 blue color filter
17 blue pixel portion
18 green color filter
19 green pixel portion
20 wavelength conversion layer
21 red pixel portion
22 edge cover (partition)
23 second substrate
24 sealing film
25 adhesive layer
26 wavelength conversion layer 27 wavelength conversion layer
28 red color filter
29 light absorption layer (low reflection layer)
30 low-refractive-index layer
31 reflective electrode
32 transparent electrode
33 hole injection layer
34 hole transport layer
35 organic light-emitting layer
36 electron transport layer
37 electron injection layer
38 polarizer
40 organic EL display device
41 light-scattering layer
50 organic EL display device
51 bank
60 organic EL display device
70 organic EL display device
80 organic EL display device
90 organic EL display device
100 organic EL display device
110 organic EL display device
111 TFT (driving element)
112 gate electrode
113 gate insulting film
114 source electrode
115 drain electrode
116 line
117 planarizing film
118 contact hole
119 filler
120 insulating layer
121 hole blocking layer
130 organic EL display device
140 organic EL display device
201 AD converter circuit
202 image processing circuit
203 control circuit
204 scanning line driving circuit
205 signal line driving circuit
206 power supply circuit
207 pixel portion
208 scanning line
209 signal line
210 power line
211 switching transistor
212 driving transistor
213 organic EL element
214 capacitor
220 ceiling light (light fixture)
221 light-emitting member
222 hanger
223 power code
230 illumination stand (light fixture)
231 light-emitting member
232 stand
233 main switch
234 power code
240 cellular phone
241 voice input member
242 voice output member
243 antenna
244 operating switch
245 display member
246 housing
250 flat-screen television set
251 display member
252 speaker
253 cabinet
254 stand
260 handheld gaming machine
261, 262 operating button
263 external connection terminal
264 display member
265 housing
270 notebook personal computer
271 display member
272 keyboard
273 touch pad
274 main switch
275 camera
276 recording medium slot
277 housing
280 tablet terminal
281 display member (touch panel)
282 camera
283 housing

The invention claimed is:

1. An organic electroluminescent display device comprising:

an organic electroluminescent section including an organic layer held between a first electrode and a second electrode, the organic layer including at least an organic light-emitting layer, and one of the first electrode and the second electrode serving as a translucent electrode;

a blue pixel portion including a blue color filter configured to transmit a light component in a blue wavelength region of light emitted from the organic electroluminescent section;

a green pixel portion including a green color filter configured to transmit a light component in a green wavelength region of the light emitted from the organic electroluminescent section; and a red pixel portion including a wavelength conversion layer configured to absorb at least one of the light component in the blue wavelength region and the light component in the green wavelength region of the light emitted from the organic electroluminescent section and emit light in a red wavelength region, wherein the wavelength conversion layer is formed of a continuous film extending across a display region, at least one of the blue pixel portion and the green pixel portion includes a light-distribution conversion layer, and a partition configured to reflect or scatter at least one of light emitted from the organic electroluminescent section and scattered light obtained by scattering the light emitted from the organic electroluminescent section is provided between pixel portions including the light-distribution conversion layer disposed in at least one of the blue pixel portion and the green pixel portion.

2. The organic electroluminescent display device according to claim 1, further comprising a first substrate, wherein the blue pixel portion, the green pixel portion, and the red pixel portion are provided between the first substrate and the organic electroluminescent section.

3. The organic electroluminescent display device according to claim 1, further comprising a first substrate and a second substrate.

4. The organic electroluminescent display device according to claim 1, wherein one of the first electrode and the second electrode serves as a reflective electrode, and the other serves as a translucent electrode.

5. The organic electroluminescent display device according to claim 1, further comprising:
a first substrate; and
a second substrate,
wherein the blue pixel portion, the green pixel portion, and the red pixel portion are provided between the first substrate and the organic electroluminescent section and between the second substrate and the organic electroluminescent section.

6. The organic electroluminescent display device according to claim 1, wherein the organic light-emitting layer is a blue-green phosphorescent layer having an emission spectrum at least including the emission of light in the blue wavelength and the emission of light in the green wavelength.

7. The organic electroluminescent display device according to claim 1, wherein the red pixel portion further includes a red color filter configured to transmit light in the red wavelength region.

8. The organic electroluminescent display device according to claim 1, wherein a partition configured to reflect or scatter at least light emitted from the organic electroluminescent section is provided at a portion of the organic electroluminescent section corresponding to a position between pixel portions.

9. The organic electroluminescent display device according to claim 1, wherein a partition configured to reflect or scatter at least one of light emitted from the wavelength conversion layer and light emitted from the organic electroluminescent section is provided at least at the periphery of the red pixel portion.

10. The organic electroluminescent display device according to claim 1, wherein a low-refractive-index layer is disposed at least between a substrate disposed on a light-output side and the wavelength conversion layer, the low-refractive-index layer having a lower refractive index than the substrate disposed on the light-output side.

11. The organic electroluminescent display device according to claim 1, wherein a low-refractive-index layer is disposed between a substrate disposed on a light-output side and the organic electroluminescent section, the low-refractive-index layer having a lower refractive index than the substrate disposed on the light-output side.

12. The organic electroluminescent display device according to claim 1, further comprising an active element configured to drive the organic electroluminescent section.

13. An electronic apparatus comprising the organic electroluminescent display device according to claim 1.

14. The organic electroluminescent display device according to claim 1, an absorptance and a fluorescence intensity of the wavelength conversion layer are partially adjusted by a light irradiation.

* * * * *